United States Patent
Abe

(10) Patent No.: US 7,662,522 B2
(45) Date of Patent: Feb. 16, 2010

(54) METHOD FOR MANUFACTURING SEMICONDUCTOR DEVICES, AND METHOD FOR FORMING A PATTERN ONTO AN EXPOSURE MASK

(75) Inventor: Takayuki Abe, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 12/035,212

(22) Filed: Feb. 21, 2008

(65) Prior Publication Data

US 2008/0206654 A1 Aug. 28, 2008

(30) Foreign Application Priority Data

Feb. 23, 2007 (JP) .............................. 2007-043198
Mar. 30, 2007 (JP) .............................. 2007-091150

(51) Int. Cl.
*G03F 9/00* (2006.01)
*G03C 5/00* (2006.01)

(52) U.S. Cl. .............................. 430/5; 430/30; 430/313; 430/314; 430/315; 430/316

(58) Field of Classification Search ...................... 430/5, 430/30, 313, 314, 315, 316
See application file for complete search history.

(56) References Cited

U.S. PATENT DOCUMENTS

| 5,863,682 | A | 1/1999 | Abe et al. |
| 2002/0051916 | A1* | 5/2002 | Ki ................................ 430/30 |
| 2007/0192757 | A1 | 8/2007 | Emi et al. |

FOREIGN PATENT DOCUMENTS

| JP | 2003-43661 | 2/2003 |
| JP | 3469422 | 9/2003 |
| JP | 2004-048018 | 2/2004 |
| JP | 2005-195787 | 7/2005 |
| JP | 2007-150243 | 6/2007 |
| JP | 2007-249167 | 9/2007 |
| KR | 1998-071574 | 10/1998 |

OTHER PUBLICATIONS

Takayuki Abe, et al., "Global Critical Dimension Correction: II", Japanese Journal of Applied Physics, vol. 46, No. 6A, 2007, pp. 3368-3376.
Emile Sahouria, et al., "Pattern based mask process correction - impact on data quality and mask writing time," Proceedings of SPIE, vol. 5853, 2005, pp. 564-573.
Jens Schneider, et al., "Compensation of long-range process effects on photomasks by design data correction," Proceedings of SPIE, vol. 4889, 2002, pp. 59-66.

* cited by examiner

*Primary Examiner*—Christopher G Young
(74) *Attorney, Agent, or Firm*—Oblon, Spivak, McClelland, Maier & Neustadt, L.L.P.

(57) ABSTRACT

A method for manufacturing a semiconductor device includes calculating a correction amount for correcting a dimension error generated in a pattern, by using an area and a total length of sides of a perimeter of the pattern included in each grid region of a plurality of mesh-like grid regions made by virtually dividing a pattern creation region of an exposure mask, exposing the pattern whose dimension has been corrected by the correction amount onto a substrate on which a resist film is coated, developing the resist film after the exposing, and processing the substrate by using a resist pattern after the developing.

12 Claims, 34 Drawing Sheets

FIG. 2A 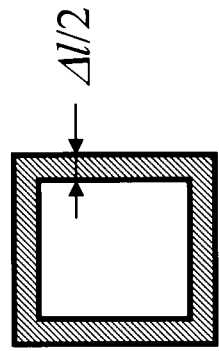 = 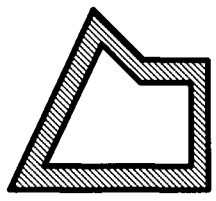 + 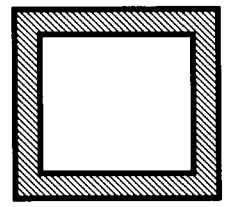
FIG. 2B 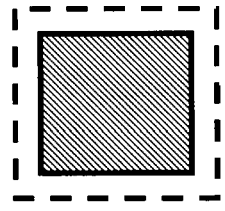 = 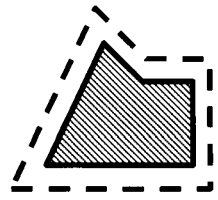 +
FIG. 2C 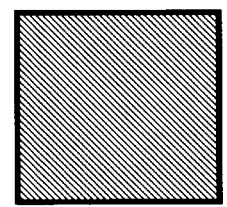 = 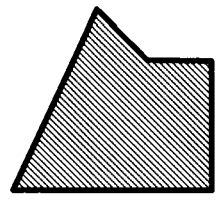 + 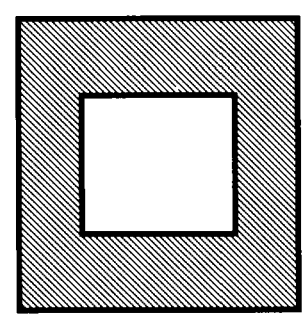
42 : Original Figure : B    44 : Figure After Correcting : A    46 : Difference Figure : C

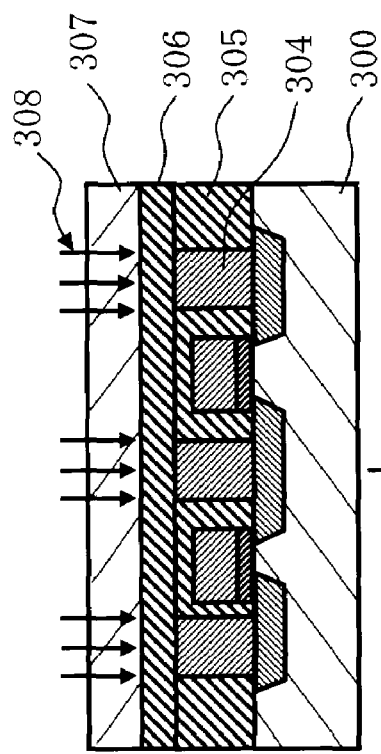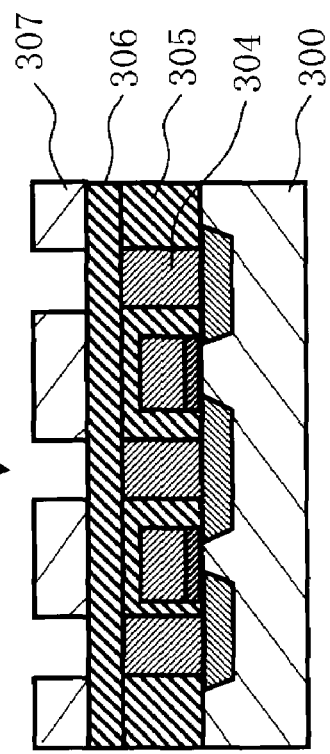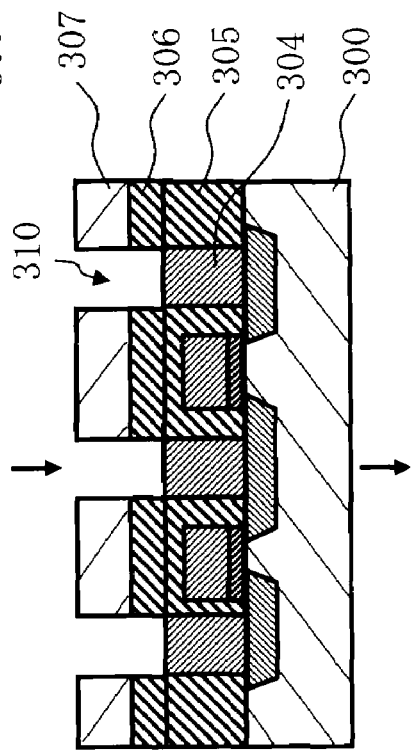

METHOD FOR MANUFACTURING SEMICONDUCTOR DEVICES, AND METHOD FOR FORMING A PATTERN ONTO AN EXPOSURE MASK

CROSS-REFERENCE TO RELATED APPLICATION

This application is based upon and claims the benefit of priority from the prior Japanese Patent Application No. 2007-043198 filed on Feb. 23, 2007 in Japan, and the prior Japanese Patent Application No. 2007-091150 filed on Mar. 30, 2007 in Japan the entire contents of which are incorporated herein by reference.

BACKGROUND OF THE INVENTION

1. Field of the Invention

The present invention relates to a method for manufacturing semiconductor devices, and a method for forming a pattern onto an exposure mask. For example, the present invention relates to a method of correcting a dimension error generated in transferring and printing a pattern of a mask to a wafer or in a subsequent wafer process, by adjusting dimensions of the pattern on the mask at each position when forming the pattern for manufacturing a semiconductor device. Particularly, the dimension error herein is based on an assumption that an error occurs when a certain figure or a figure group affects the dimension of a figure at a distant position.

2. Description of the Related Art

First, in manufacturing an LSI, an exposure mask is produced using a mask writing apparatus, etc. Next, a pattern on the exposure mask is exposed onto the resist on a silicon wafer (Si wafer) by using an optical scanner or a stepper. Then, through various steps, such as resist development and etching, a pattern of one layer is formed. An LSI is manufactured by repeating such a pattern manufacturing step some tens of times. These days an electron beam exposure apparatus is mainly used for writing or "drawing" a mask, but there are cases of using light beams. As to an apparatus for exposing a pattern of a mask, a light beam, whose wavelength is approximately 193 nm, is currently used as mentioned above. Moreover, a technique of utilizing an extreme ultraviolet light (EUV), an electron beam, or and an X-ray, whose wavelength is approximately 10 nm, has also been studied.

Regarding forming a pattern for one layer of the LSI, it goes through various steps as stated above. One of the problems of the LSI pattern formed through such various steps is that although each pattern is approximately uniform at the time of completion when seen from a local point (that is, locally, the difference with respect to the design dimension is almost uniform), the pattern dimension changes gradually when seen from the point of the whole of reticle or the whole of the inner side of a chip formed on a wafer (that is, the difference with respect to the design dimension changes gradually in the chip).

FIG. 34 shows an example of a state of a pattern dimension variation when seen from the point of the whole of the chip inside. An error shown in FIG. 34 will be called a global CD (critical dimension) error. Some examples are described below.

As the first example, there is a phenomenon called a flare generated when transferring and printing a pattern of a mask onto an Si wafer by using an optical stepper. This phenomenon is a pattern dimension variation generated by diffused reflection due to surface coarseness of a mask and/or a lens, and if there is a position where the pattern density is high, dimensions of other figures existing within several mm from the position concerned are changed by several nm to several tens of nm approximately. The phenomenon is generated not only in an optical transfer apparatus or a scanner, which is currently mainly used and utilizing an ArF (argon fluoride) excimer laser (wavelength of 193 nm) but also in an exposure apparatus (EUV stepper), which is expected to be used in the future and utilizing a wavelength of the EUV (Extreme Ultra Violet) region.

As the second example, there is a phenomenon called a loading effect generated at the time of dry etching performed for the Si wafer in the semiconductor manufacturing process. The dry etching is a step of, after forming a resist pattern by exposing and developing a resist film, etching a film in the underlying layer of the resist pattern serving as a mask, by using plasma. In this manufacturing step, the amount of a by-product created by the etching changes depending on the area of an exposed underlying layer (namely, pattern density). That is, an etching speed varies depending upon the amount of the by-product, thereby changing an etched dimension, which is the phenomenon of the loading effect. Consequently, the change of dimension depends upon the density of the pattern. For this reason, under the influence of a position where pattern density is high, dimensions of figures existing in a region within several cm from the position are changed by several nm to several tens of nm.

In addition to the above stated cause, the loading effect also occurs due to a CMP (Chemical Mechanical Polishing) step or development of the resist, thereby changing dimensions of a pattern depending upon the density thereof.

As mentioned above, there are many phenomena by which dimensions of figures existing in a region within several mm to several cm from a position where the pattern density is high are changed by several nm to several tens of nm by under the influence of the density. For increasing the integration degree of a semiconductor integrated circuit, it is necessary to further enhance the formation accuracy in addition not only to miniaturize the figure. However, the phenomenon above mentioned hinders to raise the accuracy, which is an obstacle in advancing the high integration. The method of correcting the dimension change resulting from such a flare or a loading effect will be called global CD correction or GCD correction. The following can be cited as examples of the method of correcting the global CD. There is a method of correcting a figure dimension at each position to correct a dimension change produced in a semiconductor manufacturing step (refer to, e.g., Japanese Unexamined Patent Publication No. 2003-43661 (JP-A-2003-43661)). In this reference document (JP-A-2003-43661), a method is proposed that when calculating a correction amount, the LSI pattern is virtually divided into a plurality of mesh-like grids to use the density of a pattern inside the grid.

However, since this method is only an approximated correction as described below, it becomes difficult to further improve the high precision. This will be hereinafter described. First, formulation of a global CD error is explained. Then, the conventional method and its problem will be explained.

Now, with reference to the reference document (JP-A-2003-43661), the formulation of a global CD error will be described. An LSI pattern is divided into regions (mesh) each of which is sufficiently smaller than the distance of the influence range of a global CD error. The size of each mesh is defined to be $\Delta_L \times \Delta_L$. When the center coordinate of the i-th mesh is defined to be $x_i = (x_i, y_i)$, an amount $\delta l(x_i)$, which is a dimension amount of a figure existing in the i-th mesh increased by a global CD error, can be expressed by the following equation (1). In this specification, it will be hereafter described as the coordinates $x_i=(x_i, y_i)$ or as the coordinates $x=(x, y)$.

$$\delta l(x_i) = \gamma_d \sum_j g(x_i - x'_j)\rho_0(x'_j)\Delta_L^2 + \gamma_p f(x_i) \quad (1)$$

Alternatively, regarding the size of the mesh to be sufficiently small, if expressed by an integral expression, it can be the following equation (2).

$$\delta l(x) = \gamma_d \int_A g(x - x')\rho_0(x')dx' + \gamma_p f(x_i) \quad (2)$$

In the equations (1) and (2), the first term expresses a dimension change depending on the density of a pattern. In the loading effect generated in etching a wafer, this term corresponds to a dimension change depending on the density. The second term expresses a dimension change depending on only a position. In etching a wafer, this term corresponds to a dimension change generated due to unevenness of plasma used for the etching. In the equations (1) and (2), a pattern area density of the i-th mesh in the design is defined to be $\rho_0(x_i)=\rho_0(x_i, y_i)$. Influence of density of a certain position on other position is expressed as $g(x)=g(x, y)$, and represented by standardized functions as shown in the following equations (3) and (4).

$$\sum_j \sum g(x_i - x_j, y_i - y_j) = 1 \quad (3)$$

$$\int_A g(x)dx = \int_{-\infty}^{\infty}\int_{-\infty}^{\infty} g(x, y)dxdy = 1 \quad (4)$$

The global CD error depending upon the density can be expressed by a coefficient $\gamma_d$. Since $g(x)$ is standardized as mentioned above, $\gamma$ indicates a difference between dimensions in the cases of the pattern density being 1 and 0. The value of $\gamma$ varies depending upon a process concerned. For example, in the loading effect generated in dry etching, the value of $\gamma$ varies from 5 to 20 nm. That is, depending upon a pattern density, the dimension changes from 5 up to 20 nm at the maximum.

A distribution function $g(x)=g(x, y)$ of the loading effect can be expressed by the following equation (5-1) or equation (5-2), for example. Alternatively, other suitable functions can be utilized by the apparatus used for etching etc.

$$g(x)=(1/\pi\sigma_L^2)\exp[-(x-x')^2/\sigma_L^2] \quad (5\text{-}1)$$

$$g(x)=(\gamma_1/\pi\sigma_{L1}^2)\exp[-(x-x')^2/\sigma_{L1}^2]+(\gamma_2/\pi\sigma_{L2}^2)\exp[-(x-x')^2/\sigma_{L2}^2] \quad (5\text{-}2)$$

where $\gamma_1+\gamma_2=1$. Alternatively, to be more general, the following equations (6-1) and (6-2) are used.

$$g(x) = \sum_k (\gamma_k/\pi\sigma_{Lk}^2)\exp[-(x-x')^2/\sigma_{Lk}^2] \quad (6\text{-}1)$$

$$1 = \sum_k \gamma_k \quad (6\text{-}2)$$

$\sigma_L, \sigma_{L1}, \sigma_{L2}, \ldots$ herein are the indications (influence range) of the distance of the range of the global CD error, and they are approximately from several 100 μm to several cm, for example. It is supposed that the size of a mesh is sufficiently smaller than the distance of the influence range of a global CD error as mentioned above, and it may be $\sigma_L/10$, for example. In the cases of $\sigma_L$ being 1 mm and 1 cm, the sizes of meshes may be set to be 0.1 mm and 1 mm respectively.

Moreover, in the equations (1) and (2), a CD error depending on the position within a mask surface is defined to be $\gamma_p \times f(x, y)$. $f(x, y)$ is defined to be a standardized function, whose maximum value is 1. By performing such definition, $\gamma_p$ is equivalent to a maximum error of the global CD error depending on only a position. Moreover, $\Sigma$ is calculated by summing in each small region.

Next, the conventional method will be explained. According to the conventional one, for example the method described in the Patent Document 1, a dimension of a figure at a position $(x_i, y_i)$ is reduced by $L_0(x_i, y_i)$ in the following equation (7).

$$L_0(x_i) = \gamma_d \sum_j g(x_i - x'_j)\rho_0(x'_j)\Delta_L^2 + \gamma_p f(x_i) \quad (7)$$

where $\rho_0(x_i)=\rho_0(x_i, y_i)$ is a density of the original pattern. In the conventional method, it is very simple because the dimension increased by the global CD error, that is $L_0(x_i, y_i)$ obtained from the equation (7), is subtracted from the dimension of the original figure. Therefore, it is not so accurate because of the following reason. That is, when calculating a dimension correction amount from the density of the original pattern and changing the dimension of the pattern by the calculated amount, since the dimension changes after being corrected, the density of the pattern corrected differs from the original pattern density. On the other hand, if it is supposed that the original pattern density is not changed and is kept, since the dimension is changed by $L_0(x_i, y_i)$ by using a process apparatus or a lithography apparatus for the pattern, it becomes as designed. However, as mentioned above, since the pattern density after correcting differs from that of the original pattern, the dimension after correcting cannot be the one as designed. That is, the exact dimension correction amount cannot be obtained by the above equation (7) for correcting, thereby becoming difficult to achieve an accurate global CD correction.

In addition, although it is not for correcting a global CD error, some documents are disclosed in which a solution is calculated for an equation for correcting the proximity effect generated by irradiation of an electron beam (refer to, e.g., Japanese Patent No. 3469422 and the U.S. Pat. No. 5,863, 682).

BRIEF SUMMARY OF THE INVENTION

It is one of objects of the present invention to provide a method for more accurately correcting a dimension change generated in a semiconductor manufacturing step, and a method for more accurately forming a pattern to manufacture a semiconductor device of higher and more minute precision.

In accordance with one aspect of the present invention, a method for manufacturing a semiconductor device includes calculating a correction amount for correcting a dimension error generated in a pattern, by using an area and a total length of sides of a perimeter of the pattern included in each grid region of a plurality of mesh-like grid regions made by virtually dividing a pattern creation region of an exposure mask, exposing the pattern whose dimension has been corrected by the correction amount onto a substrate on which a resist film is coated, developing the resist film after the exposing, and processing the substrate by using a resist pattern after the developing.

In accordance with another aspect of the present invention, a method for forming a pattern onto an exposure mask includes virtually arranging patterns of the same type as a pattern to be formed on the exposure mask, on a periphery of the pattern to be formed on the exposure mask, virtually dividing the pattern and the patterns into a plurality of mesh-like grid regions, for each grid region virtually divided, calculating a correction amount for correcting a pattern dimension error generated in a manufacturing step of processing the pattern on a semiconductor substrate, including grid regions on the periphery into an influence range, and forming the pattern, whose dimension has been corrected by the correction amount, on the exposure mask.

In accordance with another aspect of the present invention, a method for forming a pattern onto an exposure mask includes calculating a correction amount for correcting a dimension error of a pattern generated in a plurality of manufacturing steps, which include an exposing step, for forming a circuit of one layer of a semiconductor device, from a latter step to a former step in order, based on a dimension which has been corrected in order by the correction amount for correcting the dimension error generated in a posterior manufacturing step when the posterior manufacturing step exists, and based on a design dimension when the posterior manufacturing step does not exist, and forming the pattern, whose dimension has been corrected by the correction amount up to the exposing step, on the exposure mask.

In accordance with another aspect of the present invention, a method for manufacturing a semiconductor device includes calculating a correction amount for correcting a dimension error of a pattern generated in a plurality of manufacturing steps, which include an exposing step, for forming a circuit of one layer of a semiconductor device, from a latter step to a former step in order, based on a dimension which has been corrected in order by the correction amount for correcting the dimension error generated in a posterior manufacturing step when the posterior manufacturing step exists, and based on a design dimension when the posterior manufacturing step does not exist, exposing a substrate where a resist film is coated, by using an exposure mask on which the pattern, whose dimension has been corrected by the correction amount up to the exposing step, is formed, developing the resist film after the exposing, and processing the substrate by using a resist pattern after the developing.

BRIEF DESCRIPTION OF THE DRAWINGS

FIGS. 2A-2C show examples of patterns to be formed according to Embodiment 1;

FIGS. 17A-17C show examples of cross sectional views of steps based on a flow for manufacturing a semiconductor in FIG. 1;

DETAILED DESCRIPTION OF THE INVENTION

Embodiment 1

Figure 1:
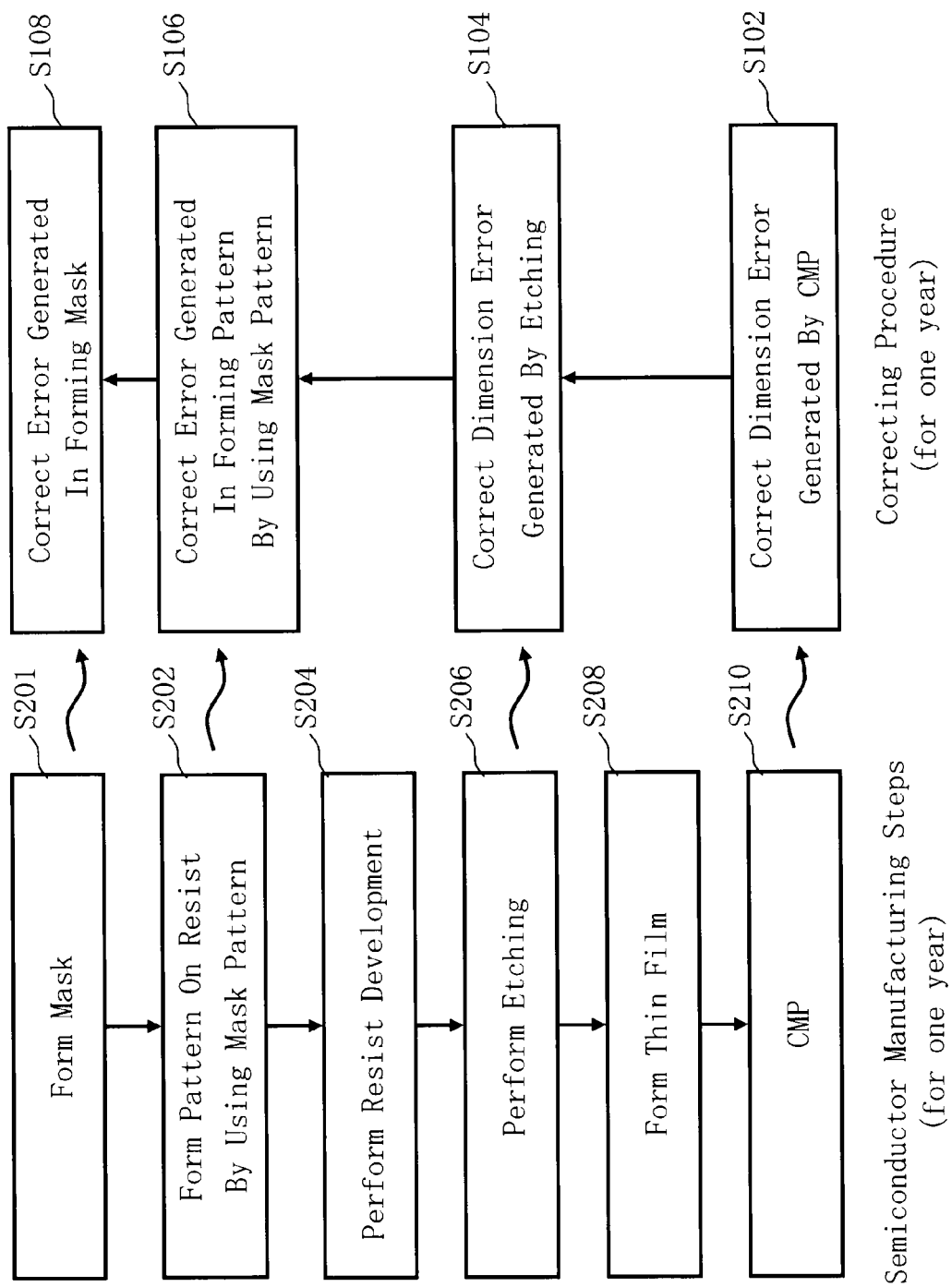
FIG. 1 shows main steps for manufacturing a mask and LSI according to Embodiment 1.

First, manufacturing steps of a mask and an LSI are depicted in the figure. FIG. 1 shows main steps for a manufacturing a mask and an LSI according to Embodiment 1.

Although manufacturing semiconductor devices, such as an LSI, is performed by forming patterns of from ten layers to several tens of layers on a silicon wafer, the example herein shows forming one layer. The case of forming a metal wire, such as copper (Cu), by the damascene method after forming a contact for wiring will be described as an example. The procedure of the forming is largely divided into six steps to be executed as a series: a step of writing a pattern to be exposed for forming a mask (S201), a step of exposing or "transferring and printing" the pattern on the mask onto a resist film on a wafer by using a light beam (S202), a step of developing the resist film after exposing (S204), a step of forming an opening by dry-etching an insulated film being an underlying layer of the resist pattern serving as a mask (S206), a step of forming a thin film by depositing a metal film in the opening and on the wafer surface (S208) and a step of polishing the surface to remove a surplus metal portion by CMP (chemical mechanical polishing) after depositing the metal film (S210).

For precisely forming the dimension of the semiconductor device which is manufactured through the steps above stated, a global CD error is corrected from the latter step to the former step in order according to Embodiment 1. That is, it is necessary to form a mask whose global CD errors in all the steps needed for one layer are corrected. As the correction method, a series of the following steps will be executed: a step of correcting a global CD error generated by CMP (S102), a step of correcting a global CD error generated by etching (S104), a step of correcting a global CD error generated by exposure (S106), and a step of correcting a global CD error generated by forming a mask (S108).

As mentioned above, it is impossible to calculate an exact dimension correction amount by the conventional method. The reason for this is that although a dimension correction amount is calculated and obtained from the pattern density of the original pattern, density of the pattern whose dimension has been corrected is different from that of the original pattern. It will be explained as the first point of Embodiment 1 that this problem can be solved by taking the following into consideration in addition to considering the pattern density: (1) taking the total length of the sides of a figure into consideration, or (2) taking the total length of the sides of a figure and the contribution depending on an angle at the apex of the figure into consideration.

First, an equation to be used as the base for calculating a correction amount will be explained. In order to generalize the explanation, it will be considered the case in which dimensions of all the figures existing in the i-th mesh are enlarged to be larger than the design dimension by $\delta l(x_i)=\delta l(x_i, y_i)$ which is a certain desired amount. When executing as designed, what is necessary is to define $\delta l(x_i)=0$. As long as there is no special note, the condition of $\delta l(x_i)=0$ is not to be added hereinafter.

It is supposed that, in order to enlarge the dimension by $\delta l(x_i)=\delta l(x_i, y_i)$ being a certain desired amount, it may be sufficient to reduce the size of all the figures inside the i-th mesh to be smaller than the designed dimension by $\Delta l(x_i)=\Delta l(x_i, y_i)$. That is, what is necessary is to contract from $CD_0$. This amount $\Delta l(x_i)$ is an unknown function being the correction amount to be calculated. At this time, $\delta l(x_i)$ can be expressed by $\Delta l(x_i)$ as shown in the following equation (8).

$$\delta l(x_i) = -\Delta l(x_i) + \gamma_d \sum_j g(x_i - x'_j)\rho(x'_j)\Delta_L^2 + \gamma_p f(x_i) \tag{8}$$

where i denotes a consecutive number assigned to the mesh, and $x_i=(x_i, y_i)$ are coordinates of the representative point (for example, the center) of the i-th mesh. The sum is calculated with respect to meshes in the range having an effect on the i-th mesh. That is, the sum is calculated with respect to i-th mesh and the surrounding meshes of the i-th mesh. For the distribution function $g(x)=g(x, y)$ of the loading effect, a Gaussian equation (5-1) or (5-2) is used. Alternatively, other suitable functions are used by the apparatus for etching etc. Moreover, when actually performing numerical computation, in the case of the function $g(x, y)$ being a Gaussian equation, the sum may be calculated with respect to all the meshes (including the i-th mesh itself) that exist within $3\sigma_L$ or $4\sigma_L$ from the i-th mesh. Moreover, $\rho(x_j, y_j)$ is the pattern density of the reduced pattern in the j-th mesh. The first term of the right-hand side of the equation (8) indicates that the dimension of the pattern is reduced from the design dimension by $\Delta l(x_i)$. Moreover, the second term and the third term indicate a dimension change produced by a global CD error generated by the reduced pattern. Specifically, the second term indicates a dimension change depending upon a density, and the third term indicates a dimension change depending upon a position. This equation (8) is a fundamental equation for calculating $\Delta l(x_i)$. Supposing that the size of the mesh is sufficiently small, the sum can be expressed by an integral expression and represented as the following equation (9).

$$\Delta l(x) = +\gamma_d \int \rho(x')g(x-x')dx' + \gamma_p f(x) - \Delta(x_i) \tag{9}$$

It is supposed in the following explanation that, the size of a mesh is sufficiently small, an expression by the integral and an expression by the sum are substantially the same, and expressions by the integral and expressions by the sum are intermingled. Now, a point to be noticed will be explained. If $\delta l(x_i)$ is regarded to be zero and transformed, the equation (9) is expressed as the following equation (10).

$$\Delta(x_i) = +\gamma_d \int \rho(x')g(x-x')dx' + \gamma_p f(x) \tag{10}$$

At a glance, the conventional correction equation (2) and this equation (10) look the same, but the contents differ as follows. That is, in the conventional correction equation (2), the pattern density $\rho_0(x_j, y_j)$ is the one of the original pattern. However, in the equation (10), the pattern density $\rho_0(x_j, y_j)$ is the one of the pattern whose dimension has been corrected. In other words, the conventional correction equation (2) disregards that the pattern density is changed by correcting the dimension. This makes a correction error occur in the conventional method.

Next, another point to be noticed will be explained. Since the pattern density of the equation (10) is the one of the pattern whose dimension has been corrected, in this density, an unknown dimension correction amount $\Delta l(x_i)$ is included by implication. Therefore, it is difficult to calculate the solution of the equation (10) in this situation. Then, in the following explanation, the equation (10) is transformed to make the unknown dimension correction amount $\Delta l(x_i)$ be clear in order to easily calculate the solution.

FIGS. 2A to 2C show examples of patterns to be formed according to Embodiment 1. In FIGS. 2A to 2C, an original figure 42 (pattern B) is a design pattern, a figure 44 (pattern A) is after corrected by reducing by $\Delta l(x)/2$ at one side, namely reducing by $\Delta l(x)$ at both the sides, by the global CD correction, and a figure 46 (pattern C) is a difference generated by reducing the above amount. The relation among the pattern density $\rho(x_j)$ of the figure 44 which has been corrected, the pattern density $\rho_0(x_j)$ of the original figure 42, and the pattern density $\rho^*(x_j)$ of the difference figure 46 can be expressed by the following equation (11).

$$\rho(x_j') = \rho_0(x_j') - \rho^*(x_j') \tag{11}$$

Figure 3:
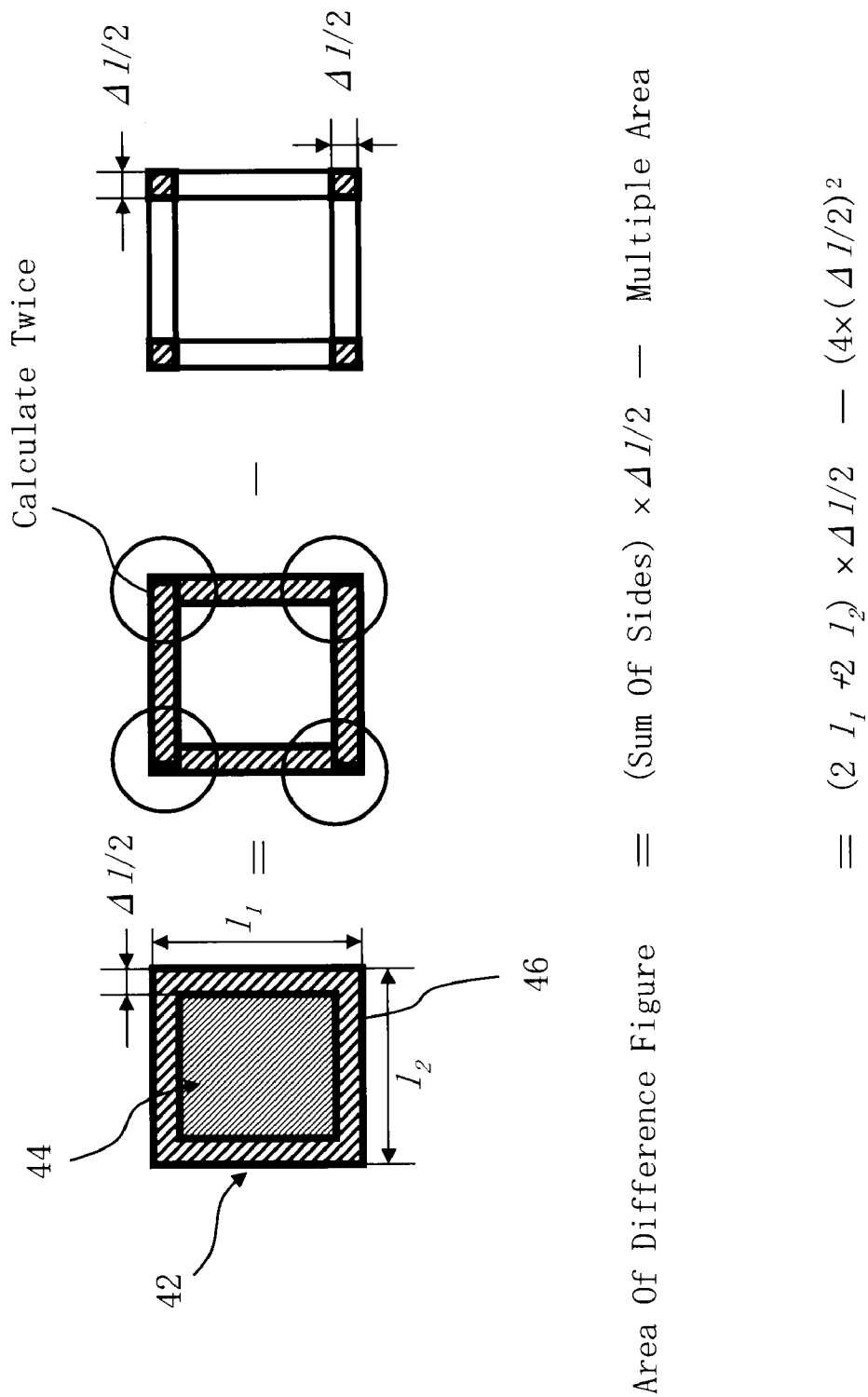
FIG. 3 shows an example of an original figure, a figure which has been corrected, and a difference figure according to Embodiment 1.

FIG. 3 shows an example of an original figure, a figure which has been corrected, and a difference figure according to Embodiment 1. It can be known from the example of FIG. 3 that the area of the difference figure 46 can be expressed by the following equation (12) using the original figure 42.

$$\Delta S = \lambda_{SUM}(x_j) \cdot \frac{\Delta \lambda(x_j')}{2} - Q_c \cdot \Delta \lambda(x_j')^2 \tag{12}$$

where $l_{sum}(x_j)$ indicates the total length of the sides of the original figure 42, and $Q_c$ indicates a coefficient of the apex. The second term of the right-hand side of the equation (12) indicates the contribution of the apex of the figure. As shown in FIG. 3, if only the side is taken into consideration (corresponding to only the first term of the equation (12)), the area is superfluously calculated at the convex apex, and the area is insufficiently calculated at the concave apex. The second term of the equation (12) is a term which adjusts the excess and deficiency. Qc is a coefficient for reflecting the contribution of these apexes, and is specified based on the angle of the contribution of each apex of the figure.

Figure 4:
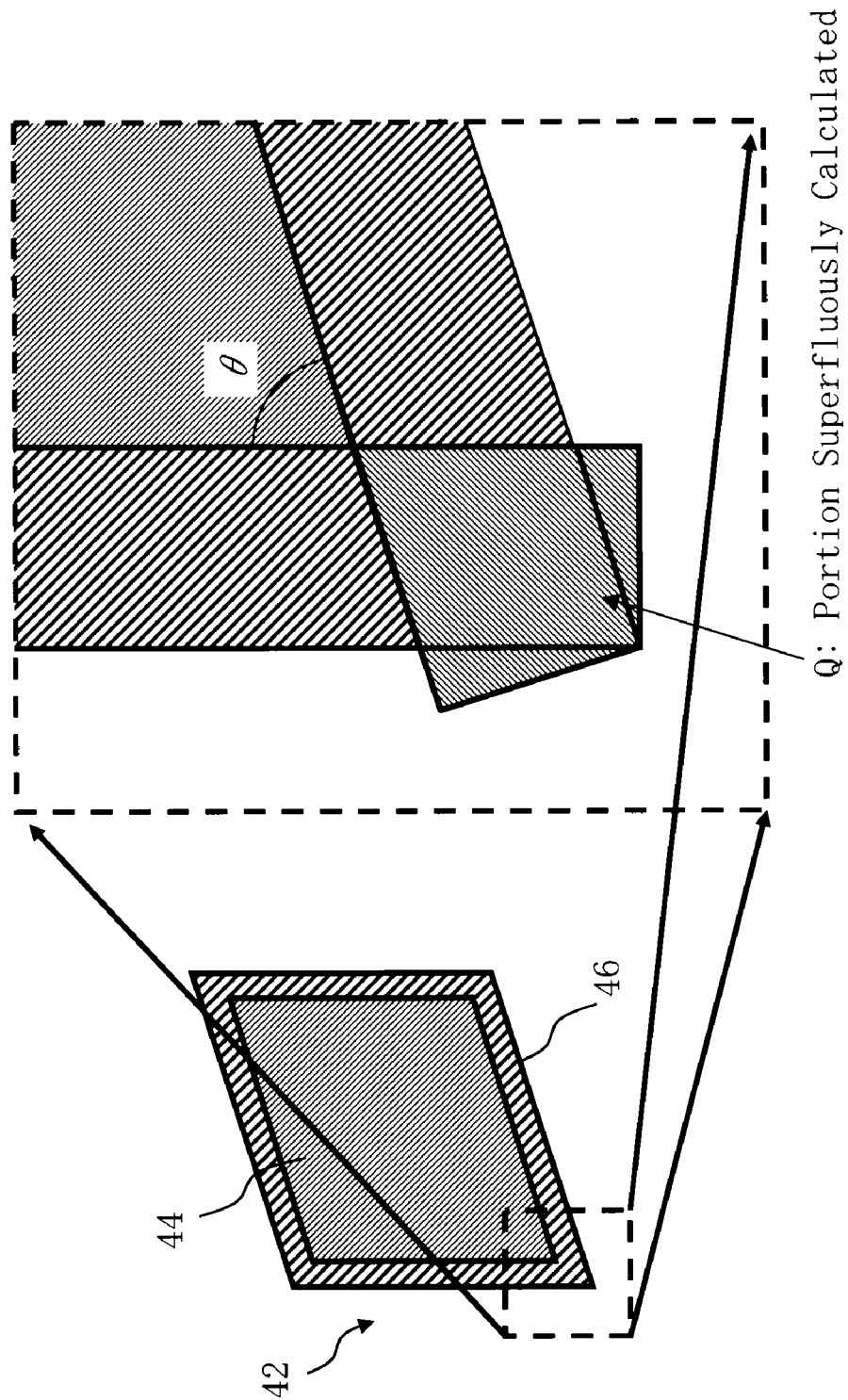
FIG. 4 is for explaining an area error generated at an apex of a pattern.

FIG. 4 is for explaining an area error generated at the apex of a pattern. When the angle of the apex is $\theta$, an area error (area superfluously calculated) generated when taking only the first term of the equation (12) into consideration becomes Q as shown in FIG. 4. Then, when calculated, it can be expressed by the following equation (13).

$$[\cos(\theta/2)/\sin(\theta/2)] \cdot \Delta l^2/4 \tag{13}$$

Therefore, Qc of one figure is expressed as the following equation (14).

$$Q_c = \Sigma[\cos(\theta_i/2)/\{4 \cdot \sin(\theta_i/2)\}] \tag{14}$$

In the equation (14), i denotes a number assigned to each apex of the figure, and $\theta_i$ denotes the angle at the apex i. The sum is calculated with respect to all the apexes of the figure. Utilizing the Qc obtained by the above, the area of the difference figure 46 can be expressed by the equation (12). Since the area is calculable in this way with respect to each figure, the pattern density $\rho^*(x_j)$ of the difference figure 46 in the inside of each mesh can be expressed by the following equation (15).

$$\rho^*(x_j) = \sum_{dif.fig.inMesh} \Delta S / \Delta_L^2 \tag{15}$$
$$= [FEC(x_j)/\Delta_L^2]\Delta l(x_l) - [CAT(x_j)/\Delta_L^2]\Delta l(x_j)^2$$

where FEC $(x_i)$ indicates a half of the total length of the sides of the original figure 42 included in the i-th mesh, and CAT $(x_i)$ is defined by the following equation (16).

$$CAT(x_i) = \sum_k [\cos(\theta_k/2)/\{4 \cdot \sin(\theta_k/2)\}] \tag{16}$$

where k denotes a number (ID) assigned to each of all the apexes of all the figures included in the i-th mesh, and the sum is calculated with respect to all the ks. Moreover, when the figure extends over the border of the mesh, it is necessary to add the sum of the length of the side included in each mesh to FEC (of the mesh including the side), and add $\cos(\theta_k/2)/\{4 \sin(\theta_k/2)\}$, which should be taken into consideration for the contribution amount of the apex included in each mesh, to CAT (of the mesh including the apex). However, if the figure extending over the border is sufficiently smaller than the size of the mesh (1/10 or less, for example), it is also acceptable to add the contribution amount of the total length of the sides and the apex of the figure to FEC and CAT of one mesh.

When the equation (15) is substituted into the equation (11), the pattern density $\rho(x_j)$ of the figure 44 which has been corrected can be expressed by the following equation (17).

$$\rho(x_j') = \rho_0(x_j') - [FEC(x_j')/\Delta_L^2]\Delta l(x_j') + [CAT(x_j')/\Delta_L^2]\Delta l(x_j')^2 \tag{17}$$

The equation (17) is substituted into the equation (8) to obtain the following equation (18)

$$\Delta l(x_i) = \gamma_d \sum_{small} g(x_i - x_j')\rho_0(x_j')\Delta_L^2 - \tag{18}$$
$$\gamma_d \sum_{small} [FEC(x_j')/\Delta_L^2]\Delta l(x_j')g(x_i - x_j')\Delta_L^2 +$$
$$\gamma_d \sum_{small} [CAT(x_j')/\Delta_L^2]\Delta l(x_j')^2 g(x_i - x_j')\Delta_L^2 + \gamma_p f(x_i) - \delta l(x_i)$$

If the equation (18) is expressed by an integral, it becomes as the following equation (19).

$$\Delta l(x) = \tag{19}$$
$$\gamma_d \int_A g(x - x')\rho_0(x_{k,l}')dx' - \gamma_d \int_A [FEC(x')/\Delta_l^2]\Delta l(x')g(x - x')dx' +$$
$$\gamma_d \int_A [CAT(x')/\Delta_l^2]\Delta l(x')^2 g(x - x')dx' + \gamma_p f(x) - \delta l(x)$$

In the equation (10), the dimension correction amount $\Delta l(x_i)$ is implicitly included in the pattern density $\rho(x_j)$ of the figure 44 which has been corrected. On the other hand, in the equation (19), all information on the figure is an amount which can be calculated from the original figure 42, and the dimension correction amount $\Delta l(x_i)$ is not hidden and appears apparently in the equation (19). For this reason, the equation (19) serves as a clear and useful equation for calculating the correction amount $\Delta l(x_i)$. The solution of this equation is to be calculated in some cases below.

(Case 1): When the contribution of the apex can be disregarded. The equation (19) becomes a linear equation (20) as shown below.

$$\Delta l(x) + \gamma_d \int_A \Delta l(x') g(x-x') \{FEC(x')/\Delta_L^2\} dx' = \tag{20}$$
$$\gamma_d \int_A g(x-x') \rho_0(x'_{k,l}) dx + \gamma_p f(x) - \delta l(x)$$

The dimension correction amount $\Delta l(x)$ is calculated as follows. First, $\Delta l(x)$ can be defined as the following equations (21-1) and (21-2).

$$\Delta l(x) = \lim_{n \to \infty} l_n(x) \tag{21-1}$$

$$l_n(x) = l_{n-1}(x) + d_n(x) \tag{21-2}$$

At this time, $l_1(x, y)$ can be expressed as the following equation (22).

$$l_1(x) = \frac{\left\{ \gamma_d \int_A g(x-x') \rho_0(x'_{k,l}) dx + \gamma_p f(x) - \delta l(x_i) \right\}}{[1 + \gamma_d \int_A \{FEC(x')/\Delta_L^2\} g(x-x') dx']} \tag{22}$$

In this equation (22) and the following equations, it is supposed that $\Delta_L$ is sufficiently small and is expressed by an integral. Moreover, the integral is to be performed for all the regions and represented by A. $d_n(x)$ can be expressed by the following equation (23).

$$d_n(x) = -\varepsilon_n(x) \Big/ \left[ 1 + \gamma_d \int_A \{FEC(x')/\Delta_L^2\} g(x-x') dx' \right] \tag{23}$$

where, $\varepsilon_n(x)$ is defined to be the following equation (24).

$$\varepsilon_n(x) = l_{n-1}(x) + \gamma_d \int_A \{FEC(x')/\Delta_L^2\} l_{n-1}(x') g(x-x') dx' - \tag{24}$$
$$\gamma_d \int_A g(x-x') \rho_0(x'_{k,l}) dx - \gamma_p f(x) + \delta l(x_l)$$

The dimension correction amount $\Delta l(x)$ converges as mentioned above. As a result, a highly precise value can be obtained. Moreover, a different expression of this solution becomes as follows: First, $\Delta l(x)$ can be defined as the following equation (25).

$$\Delta l(x) = \sum_{n=1}^{\infty} l_n(x) \tag{25}$$

At this time, $l_1(x)$ can be expressed by the following equation (26).

$$l_1(x) = \frac{\left\{ \gamma_d \int_A g(x-x') \rho_0(x'_{k,l}) dx + \gamma_p f(x) - \delta l(x_i) \right\}}{[1 + \gamma_d \int_A \{FEC(x')/\Delta_L^2\} g(x-x') dx']} \tag{26}$$

Moreover, $l_n(x)$ (n>1) can be expressed by the following equation (27).

$$l_n(x) = -\varepsilon_n^*(x) \Big/ \left\{ 1 + \gamma_d \int_A \{FEC(x')/\Delta_L^2\} g(x-x') dx' \right\} \tag{27}$$

Moreover, $\varepsilon_n^*(x)$ can be expressed by the following equation (28).

$$\varepsilon_n^*(x) = \left\{ \gamma_d \int_A \{l_{n-1}(x) - l_{n-1}(x')\} \{FEC(x')/\Delta_L^2\} g(x-x') dx' \tag{28}$$

The sum is defined to be infinite in the equations (21-1) and (25). However, in an actual calculation, it is not necessary to calculate the terms infinitely, and what is necessary is to use only the first term, the first several terms, or the first ten terms to several tens of terms according to required precision. The concrete precision acquired will be mentioned later.

(Case 2): When the effect of the side and the apex is taken into consideration.

The solution of the integral equation (29) relating to $D(x)$ which is obtained by generalizing the equation (19) will be first explained below. In the equation (29), $\rho_1(x)$, $\rho_2(x)$, and $f(x)$ are known functions, and $D(x)$ is an unknown function to be solved. Then, using this solution, the dimension correction amount $\Delta l(x)$ can be solved.

$$D(x) + \eta_1 \int_A \rho_1(x') D(x') g(x-x') dx' + \tag{29}$$
$$\eta_2 \int_A \rho_2(x') D(x')^2 g(x-x') dx' = f(x)$$

Defining as the following equation (30), the solution is calculated.

$$D(x) = \lim_{n \to \infty} D_n(x) \tag{30}$$

where $D_n(x)$ is defined as the equation (31).

$$D_n(x) = D_{n-1}(x) + d_n(x) \tag{31}$$

where $D_{n-1}(x)$ is a known function and an approximate solution. The error $\xi_{n-1}(x)$ of this approximate solution is expressed by the following equation (32).

$$\xi_{n-1}(x) = D_{n-1}(x) + \eta_1 \int_A \rho_1(x')D_{n-1}(x')g(x-x')dx'\} + \quad (32)$$

$$\eta_2 \int_A \rho_2(x')D_{n-1}(x')^2 g(x-x')dx' - f(x)$$

Substituting the equation (31) into the equation (32), the following equation (33) can be obtained.

$$D_{n-1}(x) + \eta_1 \int_A \rho_1(x')D_{n-1}(x')g(x-x')dx'\} + \quad (33)$$

$$\eta_2 \int_A \rho_2(x')D_{n-1}(x')^2 g(x-x')dx' +$$

$$d_n(x) + \eta_1 \int_A \rho_1(x')d_n(x')g(x-x')dx'\} +$$

$$\eta_2 \int_A \rho_2(x')d_n(x')^2 g(x-x')dx' +$$

$$\eta_2 \int_A \rho_2(x')2D_{n-1}(x')d_n(x')g(x-x')dx' = f(x)$$

Substituting the equation (30), the following equation (34) can be obtained.

$$\xi_{n-1}(x) + d_n(x) + \eta_1 \int_A \rho_1(x')d_n(x')g(x-x')dx'\} + \quad (34)$$

$$\eta_2 \int_A \rho_2(x')d_n(x')^2 g(x-x')dx' +$$

$$\eta_2 \int_A \rho_2(x')2D_{n-1}(x')d_n(x')g(x-x')dx' = 0$$

Now, the three amounts below are defined by the following equations (35-1), (35-2), and (35-3).

$$o_1(x) = \int_A \rho_1(x')d_n(x')g(x-x')dx'\} - \quad (35-1)$$

$$\int_A \rho_1(x')d_n(x')g(x-x')dx'\}$$

$$o_2(x) = \quad (35-2)$$

$$\int_A \rho_2(x')d_n(x')^2 g(x-x')dx' - \int_A \rho_2(x')D_{n-1}(x')^2 g(x-x')dx'$$

$$o_3(x) = \int_A \rho_2(x')d_n(x')D_{n-1}(x')g(x-x')dx' - \quad (35-3)$$

$$d_n(x') \int_A \rho_2(x')D_{n-1}(x')^2 g(x-x')dx'$$

These amounts become 0 in the case of the pattern density being uniform. Therefore, regarding these amounts to be minute enough to be 0, the equation (34) becomes as the following equation (36).

$$d_n(x) + \eta_1 d_n(x') \int_A \rho_1(x')g(x-x')dx'\} + \quad (36)$$

$$\eta_2 d_n(x') \int_A \rho_2(x')2D_{n-1}(x')g(x-x')dx' +$$

-continued $$\eta_2 d_n(x')^2 \int_A \rho_2(x')g(x-x')dx' + \xi_{n-1}(x) = 0$$

Since this is a quadratic equation with respect to d(x), it can be solved. $a_n(x)$, $b_n(x)$, and $c_n(x)$ are defined as the following equations (37-1), (37-2), and (37-3).

$$a_n(x) = \eta_2 \int_A \rho_2(x')g(x-x')dx' \quad (37\text{-}1)$$

$$b_n(x) = 1 + \eta_1 \int_A \rho_1(x')g(x-x')dx'\} + \quad (37\text{-}2)$$

$$\eta_2 \int_A \rho_2(x')2D_{n-1}(x')g(x-x')dx'$$

$$c_n(x) = \xi_{n-1}(x) \quad (37\text{-}3)$$

Since it is the quadratic equation, there are two solutions. Then, one of the solutions, which does not diverge when $a_n(x)$ approaches zero, that is, which has a physical meaning, will be selected. The solution is expressed as follows by using $a_n(x)$, $b_n(x)$, and $c_n(x)$.

In the case of $b_n(x) \geq 0$, it can be expressed by the following equation (38).

$$d_n(x) = \left(-b_n(x) + \sqrt{b_n(x)^2 - 4a_n(x)c_n(x)}\right) / 2a_n(x) \quad (38)$$

In the case of $b_n(x) < 0$, it can be expressed by the following equation (39).

$$d_n(x) = \left(-b_n(x) - \sqrt{b_n(x)^2 - 4a_n(x)c_n(x)}\right) / 2a_n(x) \quad (39)$$

In the case of $a_n(x)$ being zero, it can be expressed by the following equation (40).

$$d_n(x) = -c_n(x)/b_n(x) \quad (40)$$

The first approximate solution $D_1(x)$ can be calculated as follows. The following two amounts $o_4(x)$ and $o_5(x)$ are defined by the equations (41-1) and (41-2).

$$o_4(x') = \int_A \rho_1(x')D(x')g(x-x')dx' - D(x)\int_A \rho_1(x')g(x-x')dx' \quad (41\text{-}1)$$

$$o_5(x') = \int_A \rho_2(x')D(x')^2 g(x-x')dx' - D(x')^2 \int_A \rho_2(x')g(x-x')dx' \quad (41\text{-}2)$$

When the pattern is uniform, these amounts also correspond to zero. Therefore, if regarding the amount to be minute enough to be approximated to zero, the equation (29) is transformed to the following equation (42).

$$D_1(x)^2 \eta_2 \int_A \rho_2(x')g(x-x')dx' + \quad (42)$$

$$D_1(x)\left\{1 + \eta_1 \int_A \rho_1(x')g(x-x')dx'\right\} - f(x) = 0$$

Since this is a quadratic equation with respect to D(x), it can be solved. $a_1(x)$, $b_1(x)$, and $c_1(x)$ are defined as the following equations (43-1), (43-2), and (43-3).

$$a_1(x) = \eta_2 \int_A \rho_2(x')g(x-x')dx' \qquad (43\text{-}1)$$

$$b_1(x) = \left\{1 + \eta_1 \int_A \rho_1(x')g(x-x')dx'\right\} \qquad (43\text{-}2)$$

$$c_1(x) = -f(x) \qquad (43\text{-}3)$$

Using these, the solution is expressed as follows. First, in the case of $b_1(x) \geq 0$, it can be expressed by the following equation (44).

$$D_1(x) = \left\{-b_1(x) + \sqrt{b_1(x)^2 - 4a_1(x)c_1(x)}\right\} \Big/ 2a_1(x) \qquad (44)$$

In the case of $b_1(x)<0$, it can be expressed by the following equation (45).

$$D_1(x) = \left\{-b_1(x) - \sqrt{b_1(x)^2 - 4a_1(x)c_1(x)}\right\} \Big/ 2a_1(x) \qquad (45)$$

The one which becomes finite when $a_1(x)$ approaches zero is selected. When $a_1(x)$ is zero, it can be expressed by the following equation (46).

$$d_1(x) = -c_1(x)/b_1(x) \qquad (46)$$

When summarizing the above, D(x) can be expressed by the equation (30). Then, $D_n(x)$ can be expressed by the equation (31). Moreover, $a_1(x)$ can be expressed by the equation (43-1). $b_1(x)$ can be expressed by the equation (43-2). $c_1(x)$ can be expressed by the equation (43-3). $a_n(x)$ can be expressed by the equation (37-1). $b_n(x)$ can be expressed by the equation (37-2). $c_n(x)$ can be expressed by the equation (37-3). $\xi_{n-1}(x)$ can be expressed by the equation (32).

In the case of $b_1(x) \geq 0$, $D_1(x)$ can be expressed by the equation (44). Moreover, in the case of $b_1(x)<0$, $D_1(x)$ can be expressed by the equation (45). Furthermore, in the case of $a_1(x)$ being zero, $d_1(x)$ can be expressed by the equation (46).

In the case of $b_n(x) \geq 0$, $d_n(x)$ can be expressed by the equation (38). In the case of $b_n(x)<0$, $d_n(x)$ can be expressed by the equation (39). Moreover, in the case of $a_n(x)$ being zero, $d_n(x)$ can be expressed by the equation (40).

In the above explanation, the solution of the more general equation (29) has been calculated. Utilizing this solution, the solution of the equation (19) can be expressed as follows. First, $\Delta l(x)$ is defined as the equations (21-1) and (21-2). $l_1(x)$ and $d_n(x)$ herein define $a_1(x)$, $b_1(x)$, $c_1(x)$, $a_n(x)$, $b_n(x)$, and $c_n(x)$ as follows. First, $a_1(x)$ is defined as the following equation (47).

$$a_1(x) = -\gamma_d \int_A \{CAT(x')/\Delta_L^2\} g(x-x')dx' \qquad (47)$$

$b_1(x)$ is defined as the following equation (48).

$$b_1(x) = \left\{1 + \gamma_d \int_{pattern} \{FEC(x')/\Delta_L^2\} g(x-x')dx'\right\} \qquad (48)$$

$c_1(x)$ is defined as the following equation (49).

$$c_1(x) = -\gamma_d \int_A g(x-x')\rho_0(x'_{k,l})dx + \delta l(x) + \gamma_p f(x) - \delta l(x_i) \qquad (49)$$

$a_n(x)$ is defined as the following equation (50).

$$a_n(x) = -\gamma_d \int_A \{CAT(x')/\Delta_L^2\} g(x-x')dx' \qquad (50)$$

$b_n(x)$ is defined as the following equation (51).

$$b_n(x) = 1 + \gamma_d \int_A \{FEC(x')/\Delta_L^2\} g(x-x')dx' - \qquad (51)$$
$$\gamma_d \int_d \{CAT(x')/\Delta_L^2\} 2 l_{n-1}(x') g(x-x')dx'$$

$c_n(x)$ is defined as the following equation (52).

$$c_n(x) = l_{n-1}(x) + \gamma_d \int_A \{FEC(x')/\Delta_L^2\} l_{n-1}(x') g(x-x')dx'\} - \qquad (52)$$
$$\gamma_d \int_A \{CAT(x')/\Delta_L^2\} l_{n-1}(x')^2 g(x-x')dx' -$$
$$\gamma_d \int_A g(x-x')\rho_0(x'_{k,l})dx + \delta l(x) - \gamma_p f(x) + \delta l(x_i)$$

In the case of $b_1(x) \geq 0$, $l_1(x)$ can be expressed by the equation (53).

$$l_1(x) = \left\{-b_1(x) + \sqrt{b_1(x)^2 - 4a_1(x)c_1(x)}\right\} \Big/ 2a_1(x) \qquad (53)$$

In the case of $b_1(x)<0$, $l_1(x)$ can be expressed by the equation (54).

$$l_1(x) = \left\{-b_1(x) - \sqrt{b_1(x)^2 - 4a_1(x)c_1(x)}\right\} \Big/ 2a_1(x) \qquad (54)$$

Moreover, in the case of $a_1(x)$ being zero, $l_1(x)$ can be expressed by the equation (55)

$$l_1(x) = -c_1(x)/b_1(x) \qquad (55)$$

In the case of $b_n(x) \geq 0$, $d_n(x)$ can be expressed by the equation (56).

$$d_n(x) = \left(-b_n(x) + \sqrt{b_n(x)^2 - 4a_n(x)c_n(x)}\right) \Big/ 2a_n(x) \qquad (56)$$

In the case of $b_n(x)<0$, $d_n(x)$ can be expressed by the equation (57).

$$d_n(x) = \left(-b_n(x) - \sqrt{b_n(x)^2 - 4a_n(x)c_n(x)}\right)/2a_n(x) \quad (57)$$

Moreover, in the case of $a_n(x)$ being zero, $d_n(x)$ can be expressed by the equation (58).

$$d_n(x) = -c_n(x)/b_n(x) \quad (58)$$

The sum is defined to be infinite in the equations (21-1) and (25). However, in an actual calculation, it is not necessary to calculate the terms infinitely, and what is necessary is to use only the first term, the first several terms, or the first ten terms to several tens of terms according to required precision. The concrete precision acquired will be mentioned later.

Next, it will be explained that the solution obtained in the above is not an imaginary number. Supposing that the length of the shortest side is $L_{min}$ and $\delta l(x)$ is around $\gamma_d$, the values of $a_1(x)$ and $a_n(x)$ mentioned above are calculated to be around the values as shown in the following equation (59).

$$a_1(x), a_n(x) \approx \gamma_d/L_{min}^2 \quad (59)$$

Moreover, the values of $b_1(x)$ and $b_n(x)$ are calculated to be around the values as shown in the following equation (60).

$$b_1(x), b_n(x) \approx 1 + \gamma_d/L_{min} \quad (60)$$

Moreover, the values of $c_1(x)$ and $c_n(x)$ are calculated to be around the values as shown in the following equation (61).

$$c_1(x), c_n(x) \approx \gamma_d + \gamma_p \quad (61)$$

Now, the following will be assumed.

(Assumption 1) The length of the shortest side of the figure existing in the LSI pattern is sufficiently smaller than a global CD error generated. Under this assumption, when defining $\xi$ to be $\gamma_d/L_{min}$, $\xi$ becomes a minute amount, which can be expressed by the following equation (62).

$$b_1(x), b_n(x) \approx 1 + \xi \quad (62)$$

Therefore, $b_1(x)$ and $b_n(x)$ are never zero. Moreover, the value in the square root of the above equation (53) or (54) becomes the value expressed by the following equation (63).

$$b_1(x)^2 - 4a_1(x) \cdot c_1(x) \approx b_n(x)^2 - 4a_n(x) \cdot c_n(x) \approx 1 - 4\xi^2 \quad (63)$$

Therefore, it never becomes a negative value. In other words, under the Assumption 1, the above solution is never an imaginary root.

Next, with respect to the correction precision acquired by the solution above mentioned, a numerical computation result will be described.

Figure 5:
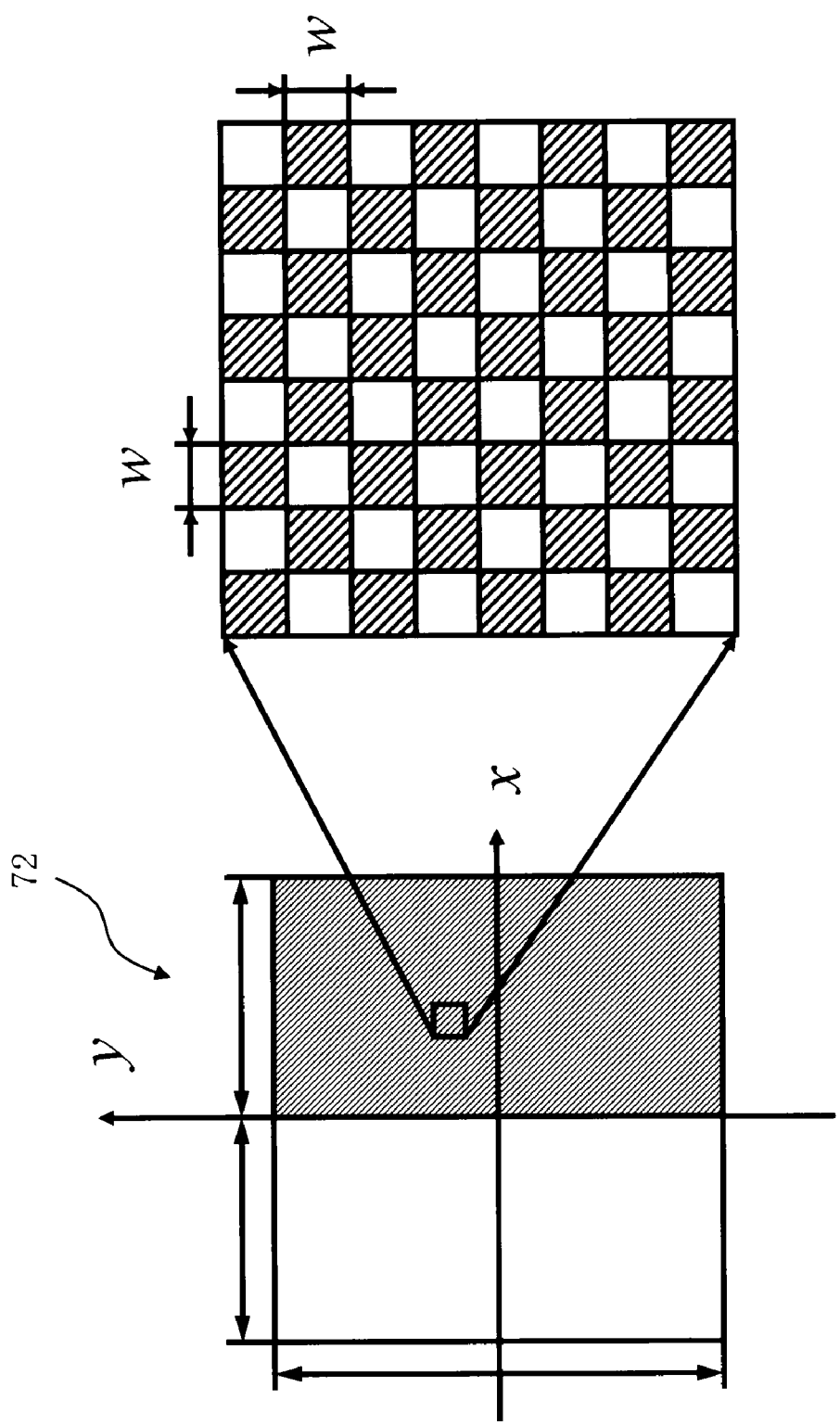
FIG. 5 shows an example of a pattern for measuring a correction error according to Embodiment 1.

FIG. 5 shows an example of a pattern for measuring a correction error according to Embodiment 1. A checkered pattern (checker board pattern) is formed in the right half of a writing region 72 which is a two-dimensional plane. Each rectangle size is defined to be w×w. In this case, the pattern density $\rho(x, y)$ can be expressed by the following equation (64).

$$\rho_0(x) = 1/2 \quad (x \geq 0) \quad (64)$$
$$0 \quad (x < 0)$$

Moreover, FEC (x, y) can be expressed by the following equation (65).

$$FEC(x) = 1/w \quad (x \geq 0) \quad (65)$$
$$\approx 0 \quad (x < 0)$$

CAT (x, y) can be expressed by the following equation (66).

$$CAT(x) = 1/2w^2 \quad (x \geq 0) \quad (66)$$
$$\approx 0 \quad (x < 0)$$

Figure 6:
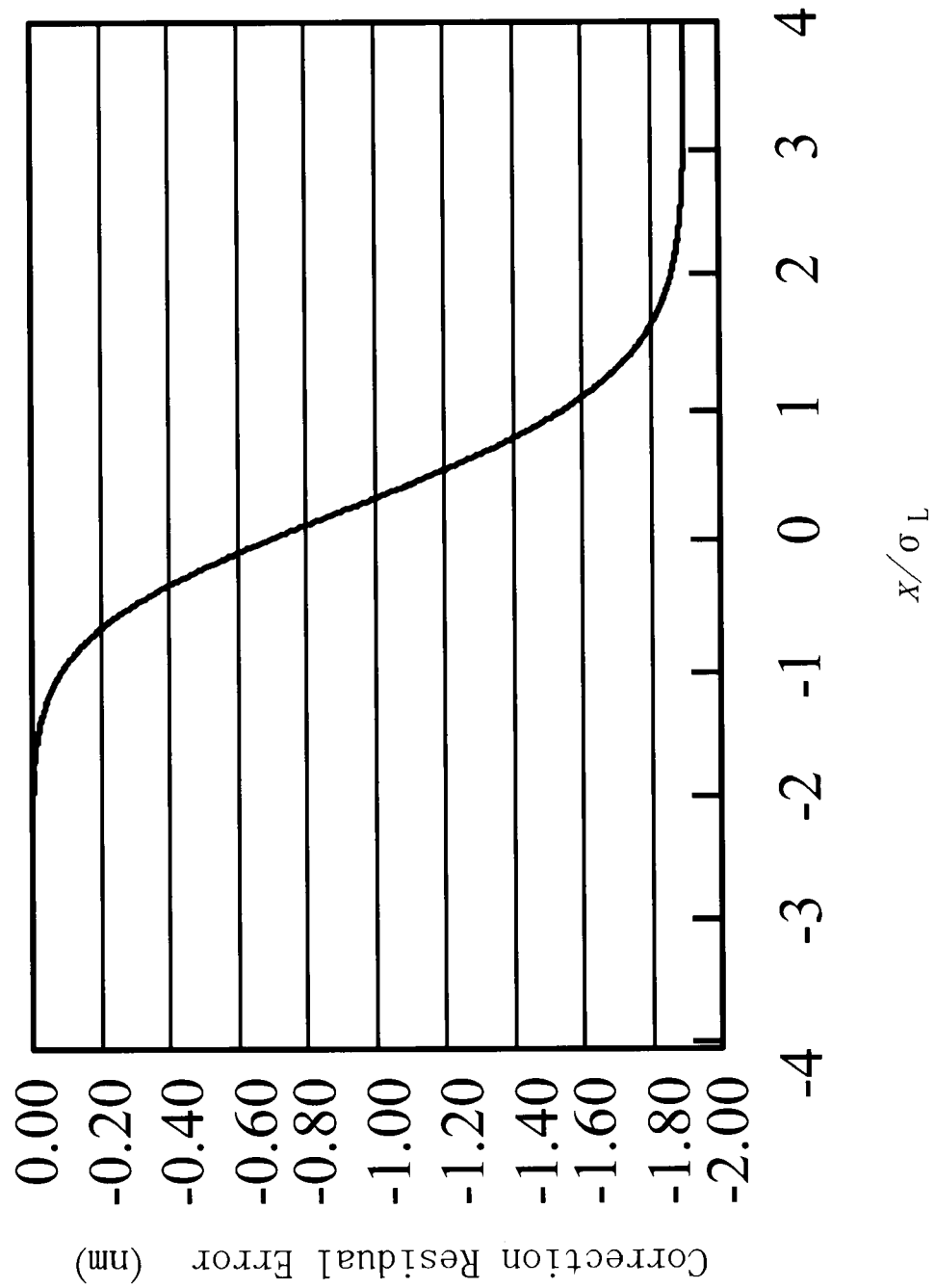
FIG. 6 is a graph showing an example of correction precision in the case of taking only the area into consideration.

FIG. 6 is a graph showing an example of the correction precision in the case of taking only the area into consideration. As an example, the case where only the area of a pattern is taken into consideration, and the contribution of the side and the apex is disregarded is shown. As shown in FIG. 6, since the contribution of the side and the apex is disregarded, it turns out that a correction residual error remains largely depending upon a position.

Figure 7:
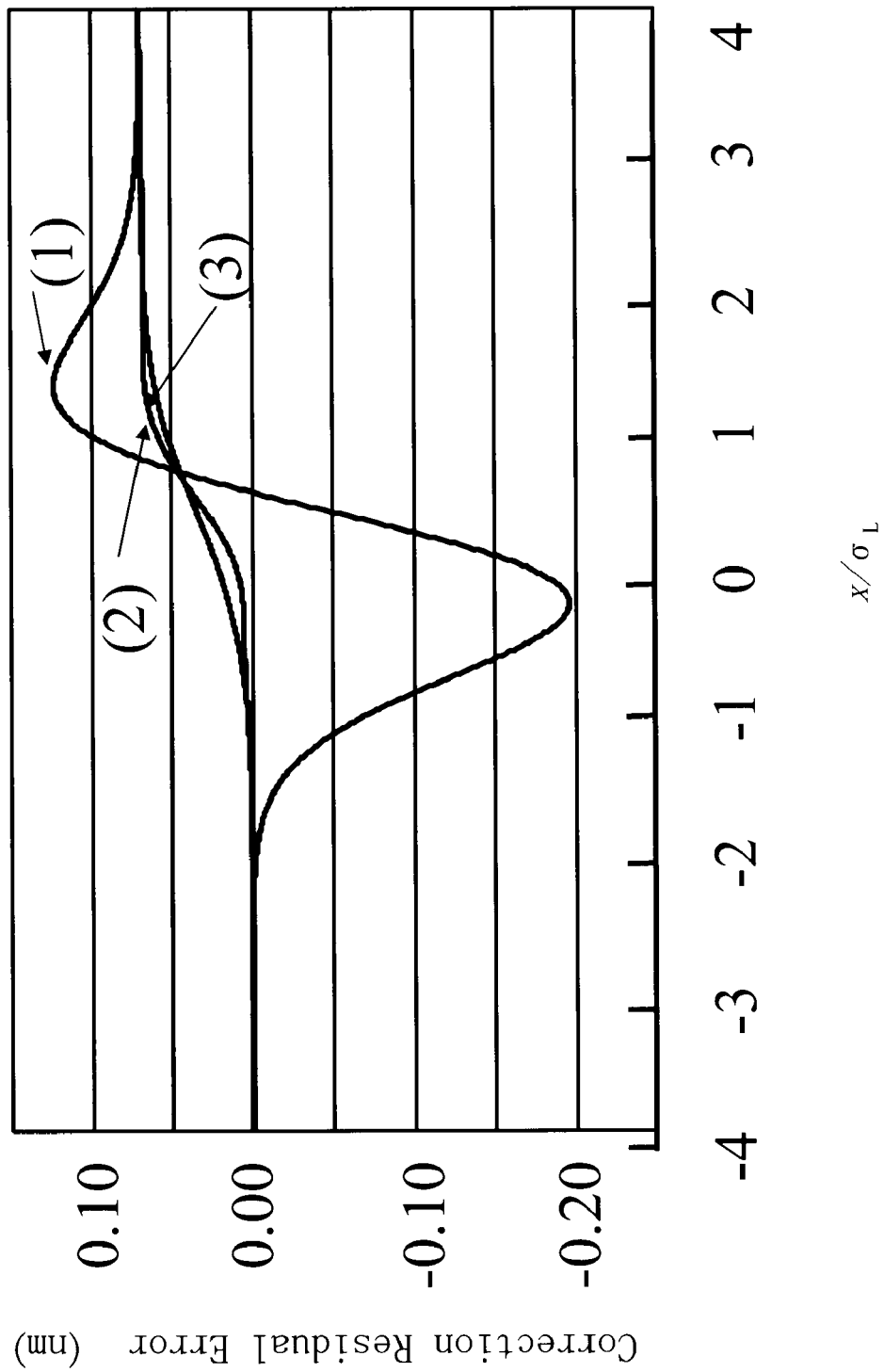
FIG. 7 is a graph showing an example of correction precision in the case of taking the area and the total length of sides into consideration according to Embodiment 1.

FIG. 7 is a graph showing an example of the correction precision in the case of taking the area and the total length of the sides into consideration according to Embodiment 1. The numeral in the parenthesis shows the calculation times. In this case, the correction residual error becomes smaller when the calculation times is twice than once. That is, the precision becomes higher when the solution is calculated by using the total length of the sides in addition to the area than when calculated taking only the area into consideration. However, when the number of calculation times is increased to be three times or more, no improvement is made in the precision. The reason for this is resulted from disregarding the contribution of the apex.

Figure 8:
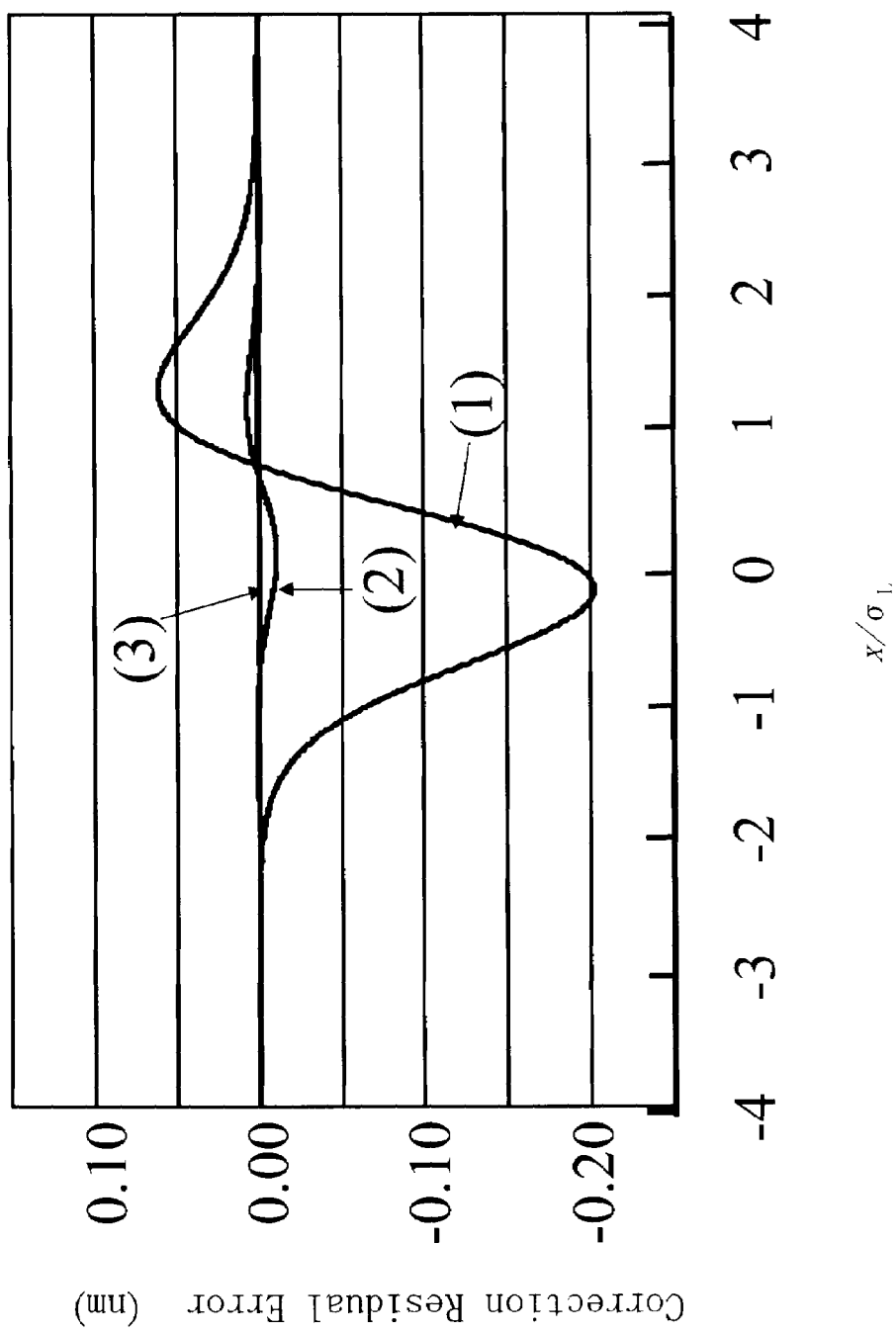
FIG. 8 is a graph showing an example of correction precision in the case of taking the contribution of the area, the total length of the sides, and the apex into consideration according to Embodiment 1.

FIG. 8 is a graph showing an example of the correction precision in the case of taking the contribution of the area, the total length of the sides, and the apex into consideration according to Embodiment 1. The numeral in the parenthesis shows the calculation times. The contribution of the sides and the apex is taken into consideration. By increasing the calculation times, the correction residual error can be controlled to be within 0.1 nm. Now, the case of correcting the loading effect generated at the time of etching a mask will be considered. According to ITRS2005, the dimension uniformity (dense pattern) required for the mask of HP45 nm generation and HP32 nm generation is 3.8 nm and 2.7 nm, respectively. Now, considering that there are many error coefficients generated in the mask manufacturing, the result of the estimation mentioned above and the estimation of ITRS are compared. Then, it turns out that sufficient precision cannot be obtained in the near future by the method of taking only the area into consideration. On the other hand, each solution of the cases 1 and 2 above stated enables it to fulfill the precision of future LSI. In particular, the case 2 which performs the correction by taking even the contribution of the sides and the apex into consideration enables it to achieve the correction of higher accuracy.

As mentioned above, by using the area and the total length of the sides of the perimeter of a pattern included in each mesh of a plurality of mesh-like grid regions (mesh) made by virtually dividing the pattern creation region of an exposure mask, it becomes possible to highly accurately calculate the correction amount for correcting a global CD error of the pattern generated by a flare and a loading effect. Furthermore, by including the value obtained by multiplying a coefficient $Q_c$ of the apex by $\Delta l(x)^2$, as the contribution of the apex of the pattern in a mesh, into the calculation, a more highly precise correction amount $\Delta l(x)$ for correcting the global CD error can be calculated.

Next, as the second point of Embodiment 1, in order to correct a pattern to be formed on a mask by using a highly precise correction amount $\Delta l(x)$, it is preferable to perform calculation by virtually arranging patterns of the same type around the circumference of the pattern. The reason for this will be explained below.

Figure 9:
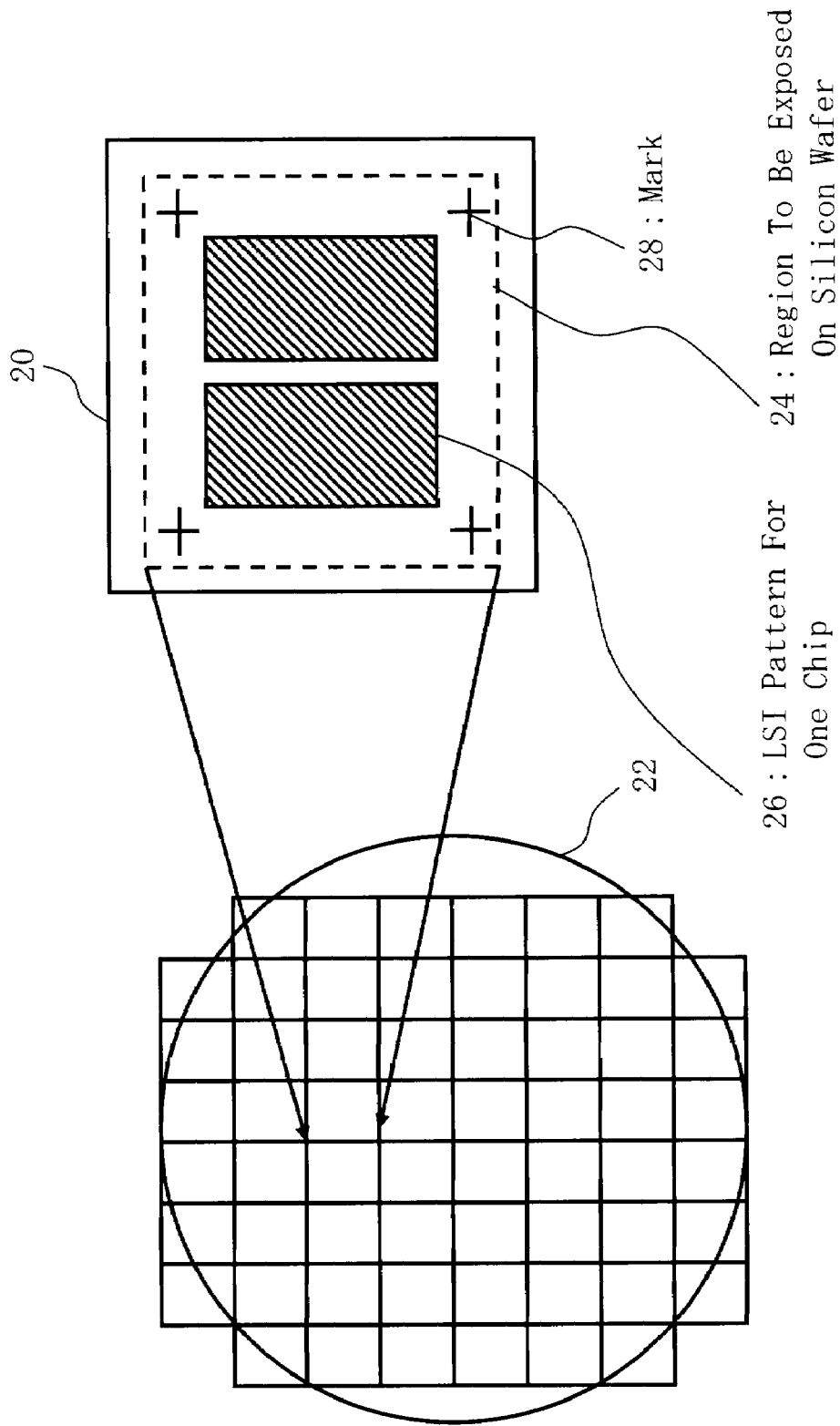
FIG. 9 shows an example of a disposition state in the case that a pattern formed on a mask is exposed onto a silicon wafer according to Embodiment 1.

FIG. 9 shows an example of a disposition state at the time of the pattern formed on the mask being exposed onto a silicon wafer, according to Embodiment 1.

As shown in FIG. 9, an LSI pattern 26 for one chip formed on a mask 20 is repeatedly transferred and printed onto a wafer 22 to cover spatially. In this case, an example is shown in which two patterns 26 are arranged on the mask 20. Moreover, a mark 28 is arranged at the four corners of a region 24 to be transferred and printed on the wafer 22, for example. The size of the region 24 to be transferred and printed onto the wafer 22 is approximately 10×10 cm on the mask 20, and will be 2.5×2.5 cm on the wafer 22. On the other hand, for example, with respect to the dry etching step performed after exposing and developing the resist on the wafer 22, the dimension change depending on a pattern density ranges several centimeters from the position where a pattern exists. Therefore, patterns included in the region 24, which has been exposed and developed by once transferring and printing, will affect the dimension of surrounding patterns. Although the dimension change amount varies depending upon the etching device, gas, and an object of the etching, it amounts to from 2 to 10 nm.

Figure 10:
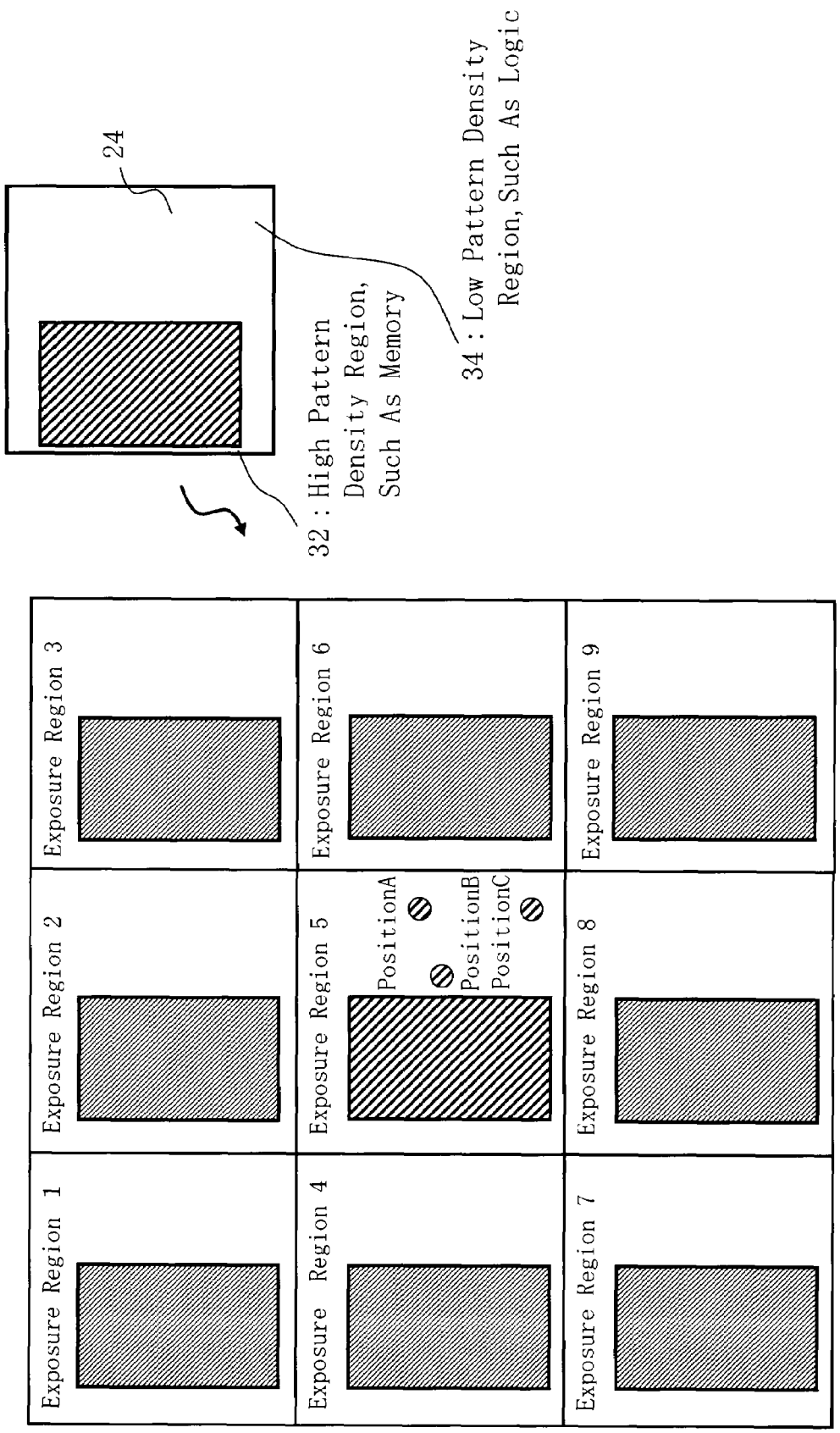
FIG. 10 shows an example of the case in which patterns intermingly having a dense part and a sparse part are adjoiningly arranged according to Embodiment 1.

FIG. 10 shows an example of the case where a plurality of patterns are adjoiningly arranged, in each of which a dense part and a sparse part intermingly exist, according to Embodiment 1. Concretely describing, a plurality of patterns, each intermingly having a dense region 32 and a sparse region 34, are adjoiningly arranged on the wafer. In such a state, the dimension change mentioned above appears notably. In FIG. 10, nine regions 24, each of which is transferred and printed by once optical exposure, are shown as an example. In an actual mask, patterns of the same type are also arranged on the periphery of the pattern concerned. If a transfer region 5 of FIG. 10 is observed, at the position B, the dimension becomes large under the influence of the dense pattern inside the transfer region 5. On the other hand, at the position A, the dimension becomes large under the influence of the dense pattern of a transfer region 6, and, at the position C, it is affected by the dense patterns of the transfer regions 6 and 9. Therefore, when correcting a pattern dimension on a mask, by considering such influence and performing correction on the supposition that patterns not to be formed on the mask exist on the periphery, it becomes possible to correct the dimension change including an error under the influence of the above-mentioned peripheral patterns.

Therefore, when forming a pattern on an exposure mask, it is preferable to perform as follows: First, patterns of the same type as the pattern to be formed on the exposure mask are virtually disposed on the periphery of the pattern for the exposure mask. Then, a virtual division is carried out for the pattern and the peripheral patterns to be divided into a plurality of mesh-like grid regions. A correction amount for correcting a pattern dimension error caused by a loading effect is calculated for each grid region which has been virtually divided, while including peripheral grid regions into the influence range $\sigma$. By including the peripheral meshes into the influence range $\sigma$, the pattern of the grid region close to the edge, such as the position A and the position C of FIG. 10, receives the influence of the density of a pattern in the peripheral grid region when calculating the correction amount. Therefore, when forming a pattern onto the exposure mask, it becomes possible to form a pattern of the grid region close to the edge to have highly precise pattern dimensions, by including the peripheral grid regions into the influence range. Thus, if the pattern of dimensions corrected by the correction amount calculated in the above method is formed on the exposure mask, highly precise correction for a global CD error can be achieved.

Even in this case, moreover, it is preferable to use the area and the total length of the perimeter sides of a pattern included in each grid region when calculating the correction amount. Furthermore, as mentioned above, by including the value obtained by multiplying the coefficient $Q_c$ of the apex by $\Delta l(x)^2$, as the contribution of the apex of the pattern in a mesh, into the calculation, a more highly precise correction amount $\Delta l(x)$ for correcting a global CD error can be calculated.

Next, as the third point of Embodiment 1, it will be explained that more suitable dimension correction can be performed for global CD errors generated in two or more manufacturing steps by performing a correction from the latter process to the former one in order. For forming a pattern circuit for one layer of a semiconductor device, the following steps are performed: mask forming, exposing, developing, processing a substrate by using a resist pattern after developing, namely, etching, forming a film, and CMP processing for planarization. Thus, in order to manufacture a semiconductor manufacturing apparatus, a plurality of manufacturing steps (process) are needed even for forming a pattern circuit for one layer. In that case, as mentioned above, a global CD error is generated by a flare in the exposure step, and a global CD error is generated by a loading effect in the etching or the CMP processing. First, it will be explained that it is difficult to perform a highly precise correction if the correction amount is calculated with being started from the former step.

For the sake of simplicity, when constituting a semiconductor circuit of one layer, it is supposed that a global CD error depending on a pattern density is generated only in two steps: the one performed first will be called a step 1 and the other one performed later will be called a step 2. A function $g(x)$ which indicates dependence property of the pattern density is assumed to be the same in both the steps, and a parameter $\gamma_d$ which indicates the amount of an error is also assumed to be the same value in both the steps. Moreover, a global CD error depending upon a position is assumed not to be generated. Under such conditions, global dimension errors generated in the steps 1 and 2 can be expressed by the following equations (67-1) and (67-2).

$$\delta l_1(x_i) = \gamma_d \sum_j g(x_i - x'_j)\rho_1(x'_j)\Delta_L^2 \qquad (67\text{-}1)$$

$$\delta l_2(x_i) = \gamma_d \sum_j g(x_i - x'_j)\rho_2(x'_j)\Delta_L^2 \qquad (67\text{-}2)$$

where $\rho_1(x_j)$ denotes a pattern density of the original pattern in the j-th small region, and $\rho_2(x_j)$ denotes a pattern density of the pattern, for which the step 1 has already been performed, in the j-th small region. The dimension error generated by passing through the two steps 1 and 2 becomes as the following equation (68).

$$\delta l_{Tot}(x_i) = \delta l_1(x_i) + \delta l_2(x_i) \qquad (68)$$

$$= \gamma_d \sum_j g(x_i - x'_j)\{\rho_1(x'_j) + \rho_2(x'_j)\}\Delta_L^2$$

Now, it is supposed that $g^*(x_j)$ is obtained as a function indicating characteristics of the density dependence property, and $\gamma^*_d$ is obtained as a parameter of an indication of the amount of an error, by collecting dimension changes generated in the two steps and examining characteristics of the density dependence property. This state can be simply expressed as the following equation (69).

$$\delta l_{Tot}(x_i) = \gamma_d^* \sum_j g^*(x_i - x'_j)\rho_1(x'_j)\Delta_L^2 \qquad (69)$$

However, the equation (69) cannot be right because the pattern density $\rho_2(x_j)$, which is the pattern density after passing through the step 1, and the pattern density $\rho_1(x_j)$, which is the original pattern density, should be essentially included in the integral expression such as the equation (68). In order to express the state as the equation (69) on purpose, what is necessary is to approximate $\rho_2(x_j)$ to be the same as $\rho_1(x_j)$, for example, and to define as $\gamma^*_d=2\times\gamma_d$. Then, since the approximation is performed, an error occurs in the equation (69). When the error occurs in the equation indicating a phenomenon which is used as the basis for performing correction, an error will also arise in a correction result, which results in a problem. Now, as an example, an error generated by such a state will be calculated.

It is considered that a line & space of 45 nm:45 nm is formed on the wafer. $\gamma_d$ is supposed to be 10 nm in both the steps, and the pattern density in measured by space. Since the density is a half in this line & space, the dimension of the space is increased by $\gamma_d\times\rho_1=10$ nm×0.5=5 nm, and the line is decreased by 5 nm. That is, it becomes a 40 nm:50 nm line & space. In the step 2, since the pattern density is 50/90=0.5555, the dimension of the space is further increased by $\gamma_d\times\rho_2=10$ nm×0.5555=5.555 nm. The subtotal of the dimensional change generated in the two steps is 10.555 nm.

On the other hand, when calculating the change of the dimension based on the original pattern density $\rho_1=0.5$ while defining $\gamma^*_d=2\times\gamma_d=20$ nm, it becomes 20 nm×0.5=10 nm. That is, 0.555 nm, which is the difference between 10.555 nm and 10 nm, is the error generated by collectively expressing the two processes to be one characteristic. It is impossible to disregard this error when manufacturing a future semiconductor.

Therefore, at the beginning, a first dimension correction amount for correcting an error generated by performing the step 2 is calculated, and then, a second dimension correction amount, which is for obtaining the dimension corrected by using the first dimension correction amount, is calculated by performing the step 1. The error generation mentioned above can be controlled by applying, to a pattern, a dimension correction amount which is finally obtained for making the dimension further be corrected by the second dimension correction amount.

That is, in a plurality of manufacturing steps for forming a circuit of one layer of a semiconductor device, a correction amount is calculated from the latter step to the former step in order. Specifically, when a posterior manufacturing step exists, a correction amount is calculated for correcting a dimension error based on the dimension which has been corrected in order by the correction amount for correcting a dimension error generated in the posterior manufacturing step, and when a posterior manufacturing step does not exist, a correction amount is calculated for correcting a dimension error based on the design dimension. Concretely describing, first, a correction amount for correcting a dimension error with respect to the design dimension is calculated in the last manufacturing step, and correcting is performed for the design dimension by using this calculated correction amount. Next, in the manufacturing step which is the last but one, a correction amount for correcting a dimension error with respect to the dimension that has been corrected is calculated. Then, correcting is performed for the dimension, which has been corrected, by using the correction amount calculated in the present step. This procedure is repeated up to obtaining a dimension corrected by using a correction amount for correcting a dimension error generated in the exposure step. Then, the pattern whose dimension has been corrected by using correction amounts up to the exposure step is formed on the exposure mask. If a pattern is exposed by using this exposure mask, the pattern becomes close to the design dimension in proportion to going to a latter manufacturing step. After completing the last manufacturing step, the pattern has been formed in the designed dimension. Accordingly, by performing above steps, it becomes possible to control the generation of errors mentioned above.

Now, an example of applying the above stated three methods of highly accurately correcting a global CD error to an LSI manufacturing step will be described. For the sake of simplicity, it is supposed that, with respect to all the global CD errors serving as the target of the correction, the range (distance) $\sigma_L$ of the influence of the global CD error is greater than or equal to 1 mm.

First, the position dependence property and the density dependence property of a dimension change are measured in advance for each process and each apparatus to be used.

Figure 11:
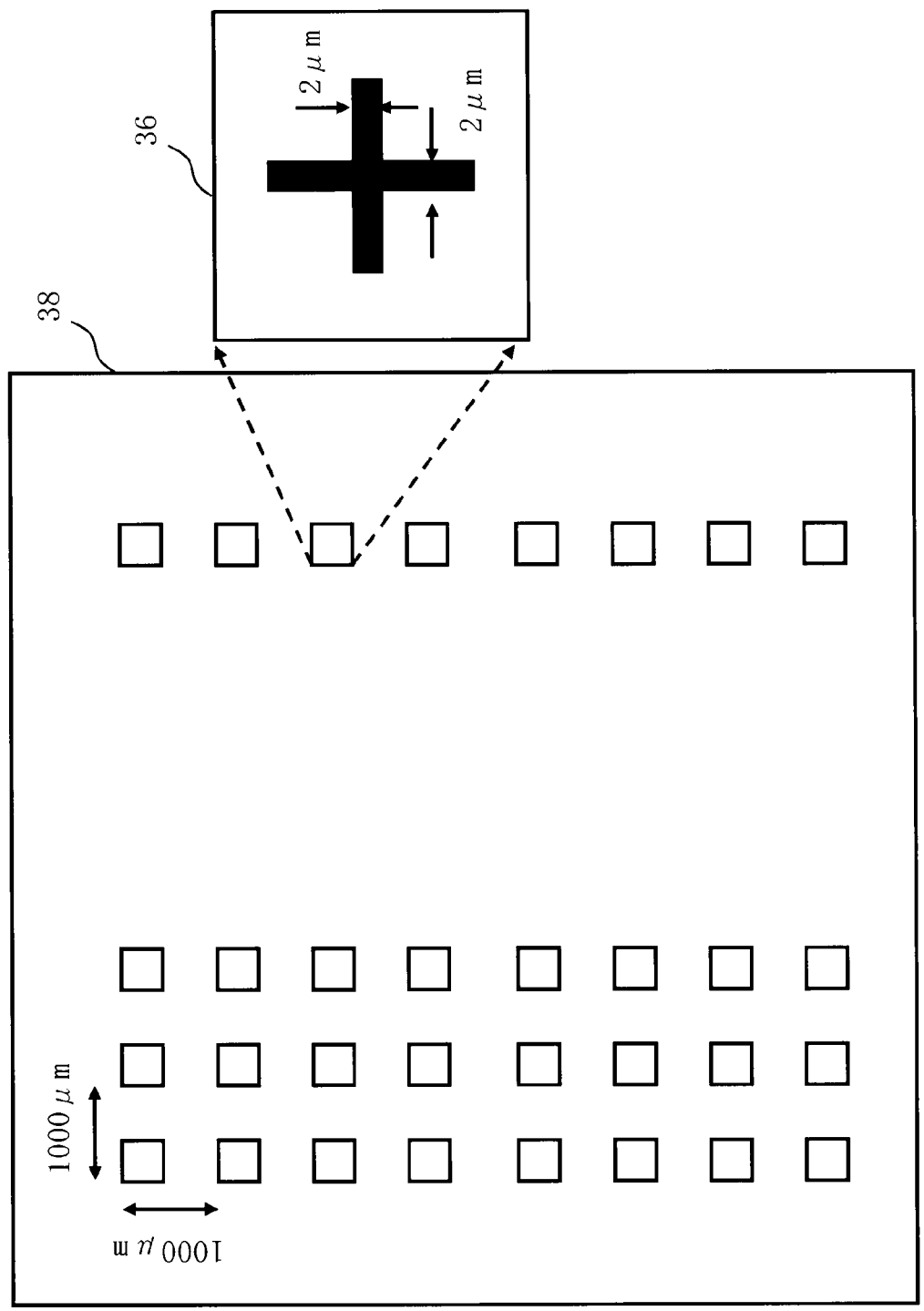
FIG. 11 shows an example of a pattern for evaluation for examining the pattern position dependence property of a global CD error according to Embodiment 1.

FIG. 11 shows an example of a pattern for evaluation for examining the pattern position dependence property of a global CD error according to Embodiment 1. Patterns 36 are vertically and laterally arranged at the pitch of 1 mm for measuring. This pattern 36 includes a cross of 2 μm wide in the region of approximately 0.1×0.1 mm in height and width.

Figure 12:
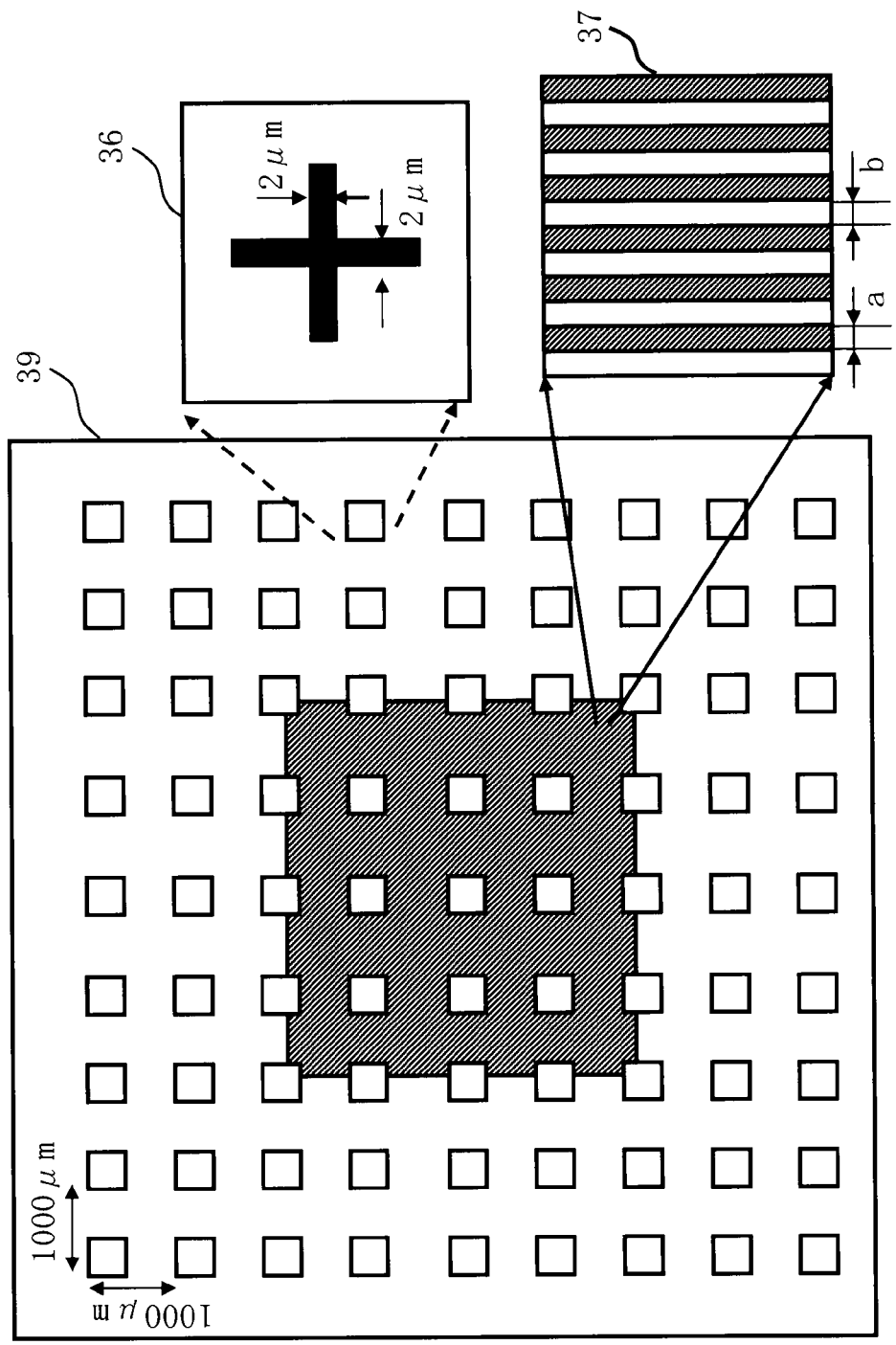
FIG. 12 shows an example of a pattern for evaluation for examining the pattern density dependence property of a global CD error according to Embodiment 1.

FIG. 12 shows an example of a pattern for evaluation for examining the pattern density dependence property of a global CD error according to Embodiment 1. The patterns 36 are also vertically and laterally arranged at the pitch of 1 mm for measuring. This pattern 36 includes a cross of 2 μm wide in the region of approximately 0.1×0.1 mm in height and width as well as FIG. 11. In addition to the pattern 36, a line & space pattern 37 is arranged in the center. It is supposed that this line & space is a ratio of 1 mm:1 mm (50% of density).

Each of the above patterns of the two types is written respectively on a different mask by using an electron beam pattern writing apparatus to be developed and etched. The mask on which the pattern 36 for measuring position dependence property is formed will be called a mask 38 for measuring position dependence property, and the mask on which the patterns 36 and 37 for measuring density dependence property are formed will be called a mask 39 for measuring density dependence property.

Then, the dimension of the cross pattern of these two masks 38 and 39 at each position is measured. The dimension of the i-th cross on the mask 38 for measuring position dependence property is defined to be $Mp_i$. Moreover, the dimension of the i-th cross on the mask 39 for measuring density dependence property is defined to be $Md_i$. $Mp_i$−design dimension (2 um)

is the position dependence property of the global CD error generated in the mask process, and will be expressed as $mp_i$. $Md_i$–$Mp_i$ is the density dependence property of the global CD error generated in the mask process, and will be expressed as $md_i$. Based on $mp_i$ and $md_i$ at each position, the characteristics of the global CD error generated in the mask manufacture process can be examined. For example, by performing approximation by using a least-squares method, it is possible to obtain the influence range σ in the case of defining the density dependence property function g(x, y) as a Gaussian equation of the equation (5-1) or the equation (5-2), and to obtain an optimal value of the coefficient γ in the equation (1) or the equation (2), for example. Similarly, the function form of a position dependence property function $γ_p f(x, y)$ in the equation (1) or the equation (2) can be obtained.

Alternatively, by performing approximation by using a least-squares method etc. based on the data of $mp_i$, a function form of the position dependence property function $γ_p f(x, y)$ in the equation (1) or the equation (2) can be calculated, and utilizing this function form, $Md_i$–f(xi, yi) may be defined to be $md_i$. Then, based on this $md_i$, by performing approximation by using a least-squares method, the density dependence property function g(x, y) in the equation (5-1) or the equation (5-2) may be calculated. This method of obtaining the density dependence property function g(x, y) based on the function form of $γ_p f(x, y)$ can also be similarly applied to the subsequent manufacturing steps.

Figure 13:
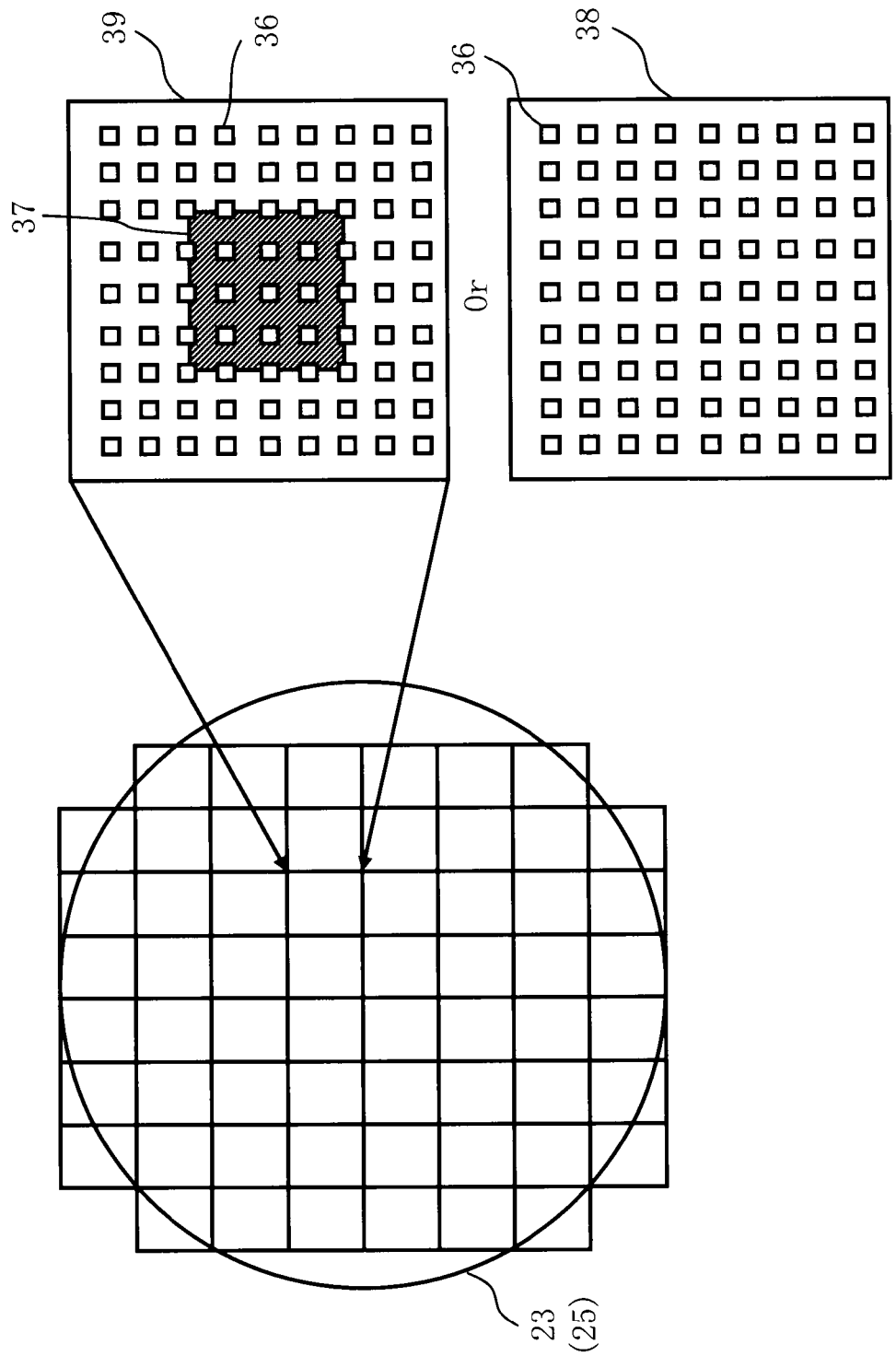
FIG. 13 shows a wafer for evaluation according to Embodiment 1.

Next, a method of examining characteristics of a GCD error, such as a flare, generated when exposing a pattern on the mask onto a wafer will be explained. The pattern is exposed onto wafers by using the two type masks 38 and 39. FIG. 13 shows a wafer for evaluation according to Embodiment 1. In FIG. 13, the patterns are exposed onto all over the wafer by using the mask 38 for measuring position dependence property. The wafer exposed in this way will be called a wafer 23 for measuring position dependence property. Similarly, patterns are exposed onto a wafer by using the mask 39 for measuring density dependence property, and the wafer exposed in this way will be called a wafer 25 for measuring density dependence property. The apparatus used for this process is an apparatus for manufacturing a semiconductor device, and is a scanner for a correction target for a GCD error generated. For example, it is preferable to use an excimer laser scanner of ¼ magnification and 193 nm wavelength. Then, developing is performed after the exposing. The dimension of the resist of the obtained cross pattern is measured with respect to the wafer 38 for measuring position dependence property and the wafer 39 for measuring density dependence property. The dimension of the i-th cross figure of the wafer 38 is defined to be $Fp_i$, and the dimension of the i-th cross figure of the wafer 39 is defined to be $Fd_i$. $Fp_i$–$Mp_i/4$ is the position dependence property of the GCD error generated in from transferring (exposing) to developing by using a scanner, and will be expressed as $fp_i$. ¼ herein is because the pattern on the mask is reduced and transferred by ¼ onto the wafer. Similarly, $Fd_i$–$Md_i/4$ is the density dependence property of the GCD error generated in from transferring (exposing) to developing by using a scanner, and will be expressed as $fd_i$. Based on $fp_i$ and $fd_i$ obtained with respect to each position, function characteristics of the GCD error generated in from transferring to developing by using a scanner can be examined. For example, by performing approximation by using a least-squares method, it is possible to obtain the influence range σ in the case of defining the density dependence property function g(x, y) as a Gaussian equation of the equation (5-1) or the equation (5-2), and to obtain an optimal value of the coefficient γ in the equation (1) or the equation (2), for example. Similarly, the function form of a position dependence property function $γ_p f(x, y)$ in the equation (1) or the equation (2) can be obtained.

Next, using a resist pattern as a mask, etching is performed. The apparatus used for this process is an apparatus for manufacturing a semiconductor device, and is an etching device for a correction target for a GCD error generated. For example, it is preferable to use a reactive ion etching apparatus etc. After etching, the resist film is exfoliated, and then the dimension of the cross pattern obtained after washing is measured with respect to the wafer 38 for measuring position dependence property and the wafer 39 for measuring density dependence property.

The dimension of the i-th cross figure of the wafer 38 is defined to be $W1p_i$, and the dimension of the i-th cross figure of the wafer 39 is defined to be $W1d_i$. $W1p_i$–$Fp_i$ is the position dependence property of the GCD error generated by etching, and will be expressed as $w1p_i$. Similarly, $W1d_i$–$Fd_i$ is the density dependence property of the GCD error generated by etching, and will be expressed as $w1d_i$. Function characteristics of the GCD error generated in etching can be examined based on $w1p_i$ and $w1d_i$ obtained with respect to each position. For example, by performing approximation by using a least-squares method, it is possible to obtain the influence range σ in the case of defining the density dependence property function g(x, y) as a Gaussian equation of the equation (5-1) or the equation (5-2), and to obtain an optimal value of the coefficient γ in the equation (1) or the equation (2), for example. Similarly, the function form of a position dependence property function $γ_p f(x, y)$ in the equation (1) or the equation (2) can be obtained.

Next, a metal film is deposited by the damascene method, and a surplus metal film overflowing from the opening is ground to be planarized by the CMP method. The apparatus used for this process is an apparatus for manufacturing a semiconductor device, and is a CMP apparatus for a correction target for a GCD error generated. After CMP processing, the dimension of the cross pattern obtained after washing is measured with respect to the wafer 38 for measuring position dependence property and the wafer 39 for measuring density dependence property. The dimension of the i-th cross figure of the wafer 38 is defined to be $W2p_i$, and the dimension of the i-th cross figure of the wafer 39 is defined to be $W2d_i$. $W2p_i$–$W1p_i$ is the position dependence property of the GCD error generated in from depositing the metal film to the CMP processing, and will be expressed as $w2p_i$. Similarly, $W2d_i$–$W1d_i$ is the density dependence property of the GCD error generated in from depositing the metal film to the CMP processing, and will be expressed as $w2d_i$. Function characteristics of the GCD error generated in from depositing the metal film to the CMP processing can be examined based on $w2p_i$ and $w2d_i$ obtained with respect to each position. For example, by performing approximation by using a least-squares method, it is possible to obtain the influence range σ in the case of defining the density dependence property function g(x, y) as a Gaussian equation of the equation (5-1) or the equation (5-2), and to obtain an optimal value of the coefficient γ in the equation (1) or the equation (2), for example. Similarly, the function form of a position dependence property function $γ_p f(x, y)$ in the equation (1) or the equation (2) can be obtained.

As mentioned above, the characteristics and the function system of position dependence property and density dependence property of the GCD error generated in each manufacturing step can be obtained.

Next, a method of correcting by using the characteristics of each step acquired as described above will be explained. For the sake of simplicity, it is supposed that a global CD error depending on a position occurs only in the mask manufacturing process and does not occur in and after the optical transferring step. The function indicating the characteristics of the global CD error generated at each step is calculated as mentioned above, and the function and the coefficient in each step will be expressed as follows:

(1) Mask Manufacturing Step
  Density dependence property $g_m(x)$, $\sigma_m$, $\gamma_{dm}$
  Position dependence property $f_{pm}(x)$, $\gamma_{pm}$ (2) From Exposing to Developing
  Density dependence property $g_l(x)$, $\sigma_l$, $\gamma_l$ (3) Etching
  Density dependence property $g_e(x)$, $\sigma_e$, $\gamma_e$ (4) CMP
  Density dependence property $g_d(x)$, $\sigma_d$, $\gamma_d$ First, in order to finally form a circuit pattern of one layer on the wafer, which is required for the semiconductor device, it is necessary to corrected an error generated in the step just prior to the step concerned. In the example herein, the CMP step corresponds to it.

In the step S102 of FIG. 1, the GCD error generated by CMP is corrected. A dimension correction amount $\Delta l(x)$ required for this step will be calculated.

First, using the design data of LSI, the inside of the pattern creation region of the design pattern is virtually divided so that it may become a grid region (mesh-like region) in which each side of each grid has an influence range of $\sigma_d/10$. Then, pattern density $\rho_0$ of the figure in each mesh, a total length $l_{sum}$ of the sides of the figure existing in each mesh, and a coefficient $Q_c$ of the apex existing in each mesh are calculated.

Next, as shown in FIG. 9, supposing that patterns of the same type are arranged on the periphery of the pattern concerned on the wafer 22, and defining the influence range, which is to be integrally calculated, to be $3\sigma_d$, the target region for the correction calculation is broadened. Then, using $g_d(x)$, $\sigma_d$, and $\gamma_d$, and defining $\delta l(x)$ to be zero in the equation (8), a dimension correction amount $\Delta l(x)$ in each mesh is calculated. That is, the dimension correction amount $\Delta l(x)$ which makes the global CD error be "0" is calculated. As the method of calculation, the cases 1 and 2 mentioned above should be suitably used. Moreover, as described above, it is more preferable for the calculation to include the contribution of the apex in addition to the area and the total length $l_{sum}$ of the sides of the figure.

Next, using the CAD system, the dimension of the figure in each mesh is reduced or enlarged by the correction amount obtained.

Figures 14A, 14B, 14C, 14D:
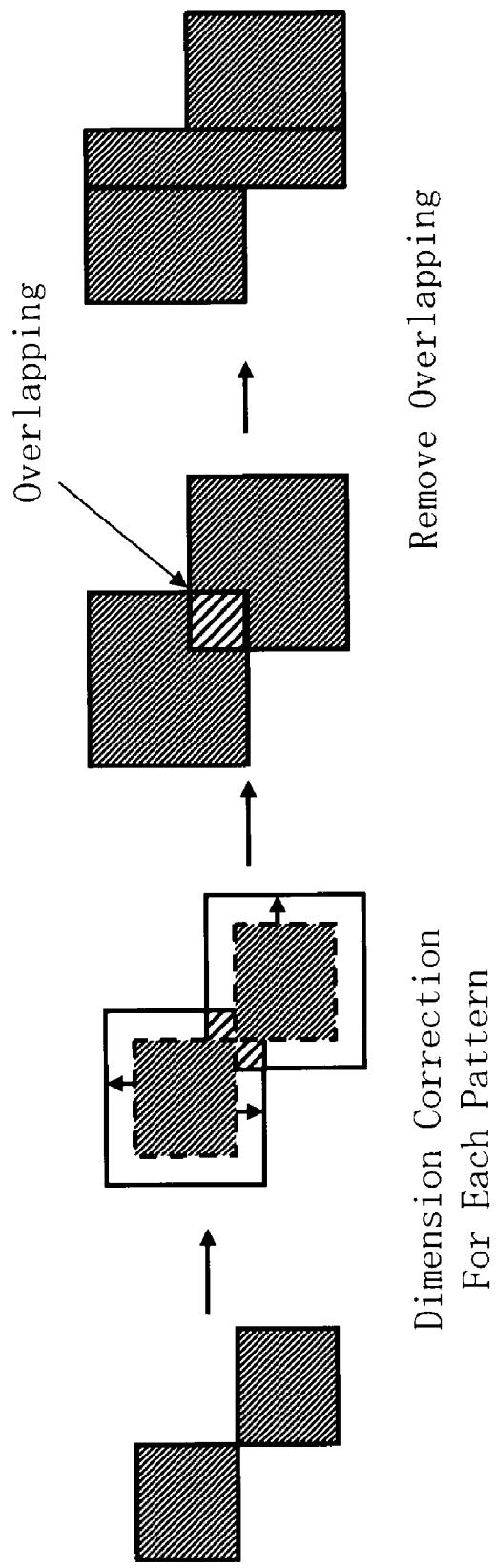
FIGS. 14A-14D show an example of dimension correction according to Embodiment 1.

FIGS. 14A to 14D show an example of the dimension correction according to Embodiment 1. When the two figures shown in FIG. 14A are corrected to be enlarged as shown in FIG. 14B, there is a case that the two figures may overlap each other at the border of the mesh as shown in FIG. 14C. In that case, the overlapping is removed by using the function of the CAD system as shown in FIG. 14D.

Figures 15A, 15B, 15C, 15D:
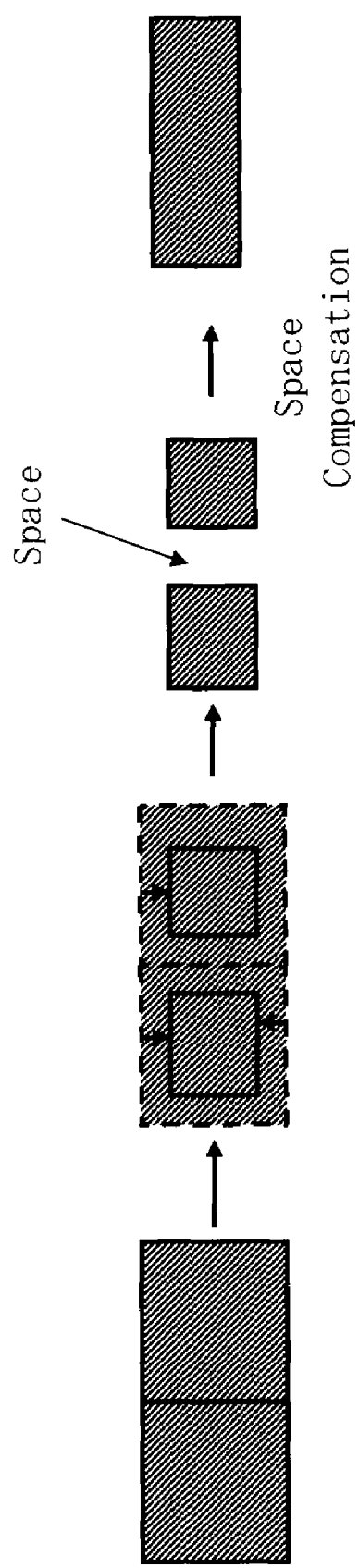
FIGS. 15A-15D show another example of dimension correction according to Embodiment 1.

FIGS. 15A to 15D show another example of the dimension correction according to Embodiment 1. When the two figures shown in FIG. 15A are corrected to be reduced as shown in FIG. 15B, there is a case that a space may be generated between the two figures at the border of the mesh as shown in FIG. 15C. In that case, what is necessary is just to compensate the space by using the function of the CAD system as shown in FIG. 15D.

If the above patterns are obtained before the CMP step, it becomes possible to obtain a pattern of the dimension as designed by performing the CMP step.

Now, in order to actually obtain corrected patterns before the CMP step, that is after etching, a global CD error generated by etching is corrected in the step S104 of FIG. 1. First, a dimension correction amount $\Delta l(x)$ required for this step is calculated.

If the dimension correction amount $\Delta l(x)$ that makes the global CD error be "0" is defined as $\Delta l_d(x)$, the design dimension$-\Delta l_d(x)$ (that is, design dimension minus $\Delta l_d(x)$) becomes the dimension after the correction, which is defined to be $l_d(x)$. Using this dimension $l_d(x)$, the inside of the pattern creation region is virtually divided so that it may become a grid region (mesh-like region) in which each side of each grid has an influence range of $\sigma_e/10$. Then, pattern density $\rho_0$ of the figure in each mesh, a total length $l_{sum}$ of the sides of the figure existing in each mesh, and a coefficient $Q_c$ of the apex existing in each mesh are calculated.

Next, as shown in FIG. 9, supposing that patterns of the same type are arranged on the periphery of the pattern concerned on the wafer 22, and defining the influence range, which is to be integrally calculated, to be $3\sigma_e$, the target region for the correction calculation is broadened. Then, using $g_e(x)$, $\sigma_e$, and $\gamma_e$, and defining $\delta l(x)$ to be zero in the equation (8), a dimension correction amount $\Delta l(x)$ in each mesh is calculated. That is, the dimension correction amount $\Delta l(x)$ which makes the global CD error be "0" is calculated. As the method of calculation, the cases 1 and 2 mentioned above should be suitably used. Moreover, as described above, it is more preferable for the calculation to include the contribution of the apex in addition to the area and the total length $l_{sum}$ of the sides of the figure.

Next, using the CAD system, the dimension of the figure in each mesh is reduced or enlarged by the correction amount obtained as well as the correction at the CMP step.

If the above patterns are obtained before the etching step, it becomes possible to obtain a pattern of the dimension desired at the stage before the CMP processing by performing the etching step.

Now, in order to actually obtain corrected patterns before the etching step, that is after exposing, a global CD error generated by exposing is corrected in the step S106 of FIG. 1. First, a dimension correction amount $\Delta l(x)$ required for this step is calculated.

If the dimension correction amount $\Delta l(x)$ that makes the global CD error at the etching step be "0" is defined as $\Delta l_e(x)$, $l_d(x)-\Delta l_e(x)$ becomes the dimension after the correction, which is defined to be $l_e(x)$. Using this dimension $l_e(x)$, the inside of the pattern creation region is virtually divided so that it may become a grid region (mesh-like region) in which each side of each grid has an influence range of $\sigma_l/10$. Then, pattern density $\rho_0$ of the figure in each mesh, a total length $l_{sum}$ of the sides of the figure existing in each mesh, and a coefficient $Q_c$ of the apex existing in each mesh are calculated.

Next, as shown in FIG. 9, supposing that patterns of the same type are arranged on the periphery of the pattern concerned on the wafer 22, and defining the influence range, which is to be integrally calculated, to be $3\sigma_l$, the target region for the correction calculation is broadened. Then, using $g_l(x)$, $\sigma_l$, and $\gamma_l$, and defining $\delta l(x)$ to be zero in the equation (8), a dimension correction amount $\Delta l(x)$ in each mesh is calculated. That is, the dimension correction amount $\Delta l(x)$ which makes the global CD error be "0" is calculated. As the method of calculation, the cases 1 and 2 mentioned above should be suitably used. Moreover, as described above, it is more preferable for the calculation to include the contribution of the apex in addition to the area and the total length $l_{sum}$ of the sides of the figure.

Next, using the CAD system, the dimension of the figure in each mesh is reduced or enlarged by the correction amount obtained as well as the correction at the CMP step.

If the above patterns are obtained before the exposing step, it becomes possible to obtain a pattern of the dimension desired at the stage before the etching processing by performing the exposing step.

Now, in order to actually obtain corrected patterns before the exposing step, that is after manufacturing the mask, a global CD error generated by the mask manufacturing (formation) is corrected in the step S108 of FIG. 1. First, a dimension correction amount $\Delta l(x)$ required for this step is calculated.

If the dimension correction amount $\Delta l(x)$ that makes the global CD error at the exposing step be "0" is defined as $\Delta l_f(x)$, $l_e(x) - \Delta l_f(x)$ becomes the dimension after the correction, which is defined to be $l_f(x)$. Using this dimension $l_f(x)$, the inside of the pattern creation region is virtually divided so that it may become a grid region (mesh-like region) in which each side of each grid has an influence range of $\sigma_m/10$. Then, pattern density $\rho_0$ of the figure in each mesh, a total length $l_{sum}$ of the sides of the figure existing in each mesh, and a coefficient $Q_c$ of the apex existing in each mesh are calculated.

In the case of correcting a global GCD error generated in the mask manufacturing, which is the last process, a term of position dependence property is added. Moreover, at this mask manufacturing step, differing from other examples described above, since what is necessary is to correct only the pattern to be formed on the mask, it is not necessary to suppose there are patterns of the same type on the periphery of the pattern concerned to broaden the region. Then, using $g_m(x)$, $\sigma_m$, $\gamma_{dm}$, $f_{pm}(x)$ and $\gamma_{pm}$, and defining $\Delta l(x)$ to be zero in the equation (8), a dimension correction amount $\Delta l(x)$ in each mesh is calculated. That is, the dimension correction amount $\Delta l(x)$ that makes a global error be "0" is calculated. As the method of calculation, the cases 1 and 2 mentioned above should be suitably used. Moreover, as described above, it is more preferable for the calculation to include the contribution of the apex in addition to the area and the total length $l_{sum}$ of the sides of the figure.

Next, using the CAD system, the dimension of the figure in each mesh is reduced or enlarged by the correction amount obtained as well as the correction at the CMP step.

If the above patterns are obtained before the exposing step, it becomes possible to obtain a pattern of the dimension desired at the stage before the exposing step by performing the mask manufacturing step.

As an example, each step for forming a metal wire, such as copper (Cu), by the damascene method after forming a contact for wiring will be explained below.

In the step S201 of FIG. 1, a mask is manufactured using the pattern whose dimension has been corrected as mentioned above. Although the forming is performed by resizing the dimension itself, it is also acceptable to correct the dimension by controlling an exposure dose at the time of writing a pattern, as described below.

FIGS. 16A to 18C show examples of cross-sectional views with respect to the steps along the flow for manufacturing a semiconductor device in FIG. 1.

Figure 16A:
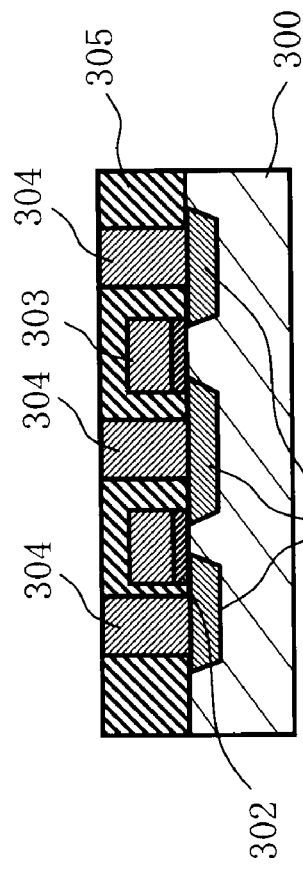
FIGS. 16A-16C show examples of cross sectional views of steps based on a flow for manufacturing a semiconductor in FIG. 1.

FIG. 16A shows the state where the contact for wiring has been formed. After forming a channel 301 in a substrate 300 where a silicon wafer is used, a gate oxide film 302 and a gate 303 are formed. Then, a contact 304 is formed in the channel 301. The gate oxide film 302, the gate 303, and the contact 304 are formed in an interlayer insulation film 305.

Figure 16B:
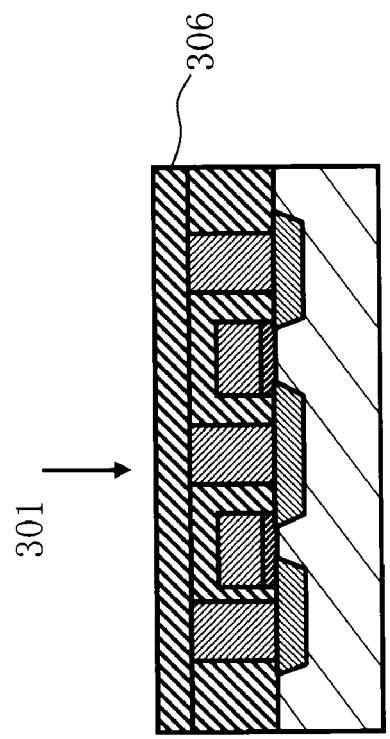
Figure 16C:
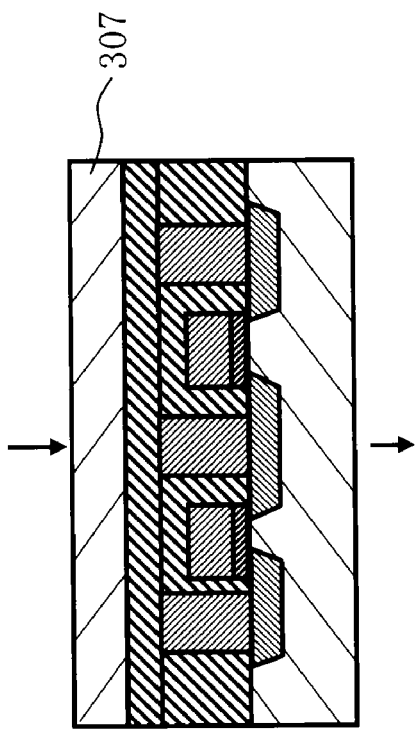
Figures 18A, 18B, 18C:
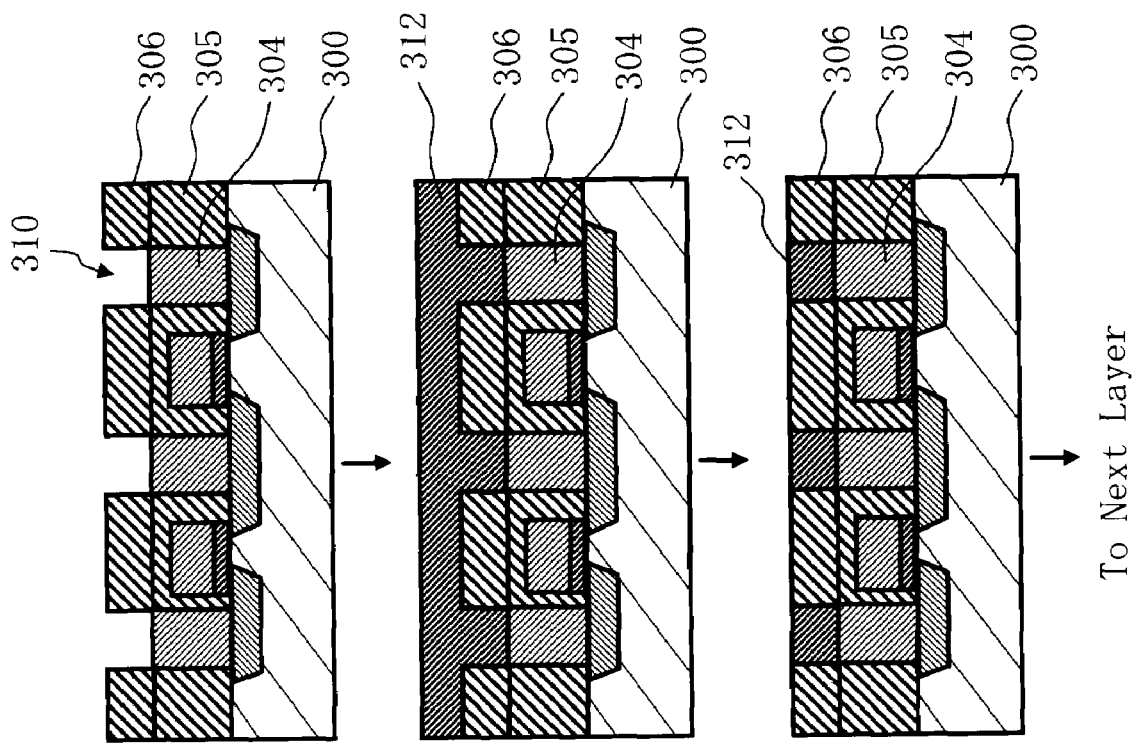
FIGS. 18A-18C show examples of cross sectional views of steps based on a flow for manufacturing a semiconductor in FIG. 1.

First, in FIG. 16B, on the substrate 300 after forming the contact for wiring, an upper-layer insulated film 306 (first film) is formed by the chemistry vapor phase growth (CVD) method or the applying method (SOD method). Then, as shown in FIG. 16C, a resist film 307 is formed on the insulated film 306 by the applying method. As shown in FIG. 17A, the pattern after the correction is exposed by an ultraviolet light 308 by using the mask after the correction mentioned above. The excimer laser scanner of 193 nm wavelength mentioned above may be used as the apparatus. Then, as shown in FIG. 17B, a resist pattern is formed by developing after exposing the resist. As shown in FIG. 17C, an opening part 310 is formed by etching a lower-layer insulated film 306 by using the resist film 307 as a mask. The reactive ion etching apparatus mentioned above may be used as the apparatus. As shown in FIG. 18A, the resist film 307 is exfoliated by ashing, etc. Then, as shown in FIG. 18B, a metal film 312 (second film) is deposited inside the opening part 310 and on the surface of the insulated film 306. When depositing Cu as the metal film 312, an electrolysis plating method may be used. Moreover, before depositing Cu, a barrier metal film for preventing Cu from diffusing is formed. Then, a Cu seed film used as a cathode pole in the electrolysis plating may be formed on the barrier metal film by the spatter method, etc. As shown in FIG. 18C, the surplus metal film 312, which is overflowing from the opening part 310, is ground to be removed by the CMP method. A planarized pattern circuit of one layer can be form by the steps described above.

When forming a mask, since the pattern data has already been corrected so that all the errors generated at each step where a global CD error occurs may be corrected, the pattern finally formed can be the one as designed. Thus far, processing for one layer of the LSI manufacturing step has been explained. Then, by performing the same processing for forming a pattern of other layer, it becomes possible to form a pattern at each step with high dimensional accuracy.

As mentioned above, according to Embodiment 1, a dimension change generated in a semiconductor manufacturing step can be corrected more correctly. Moreover, a more accurate pattern can be formed on the mask. Consequently, the semiconductor device finally obtained can be formed with pattern dimensions of high precision.

Embodiment 2

In Embodiment 2, another example of calculating a correction amount will be explained. In Embodiment 1, a pattern is corrected in each step, from the latter step to the former one, by calculating the area and the side length at each step with using the CAD system. Since the number of times of using the CAD system can be reduced, an example of reducing it will be described below according to Embodiment 2. Other respects are the same as those in Embodiment 1, and the final correction amount of all the steps are calculated by obtaining correction amounts from the latter step to the former one of all the steps, for example. First, the equation (19) can be transformed to the following equation (70).

$$\delta l(x) = -\Delta l(x) + \gamma_d \int_A g(x-x')\rho_0(x'_{k,t})dx' - \qquad (70)$$

-continued $$\gamma_d \int_A [FEC(x')/\Delta_L^2]\Delta l(x')g(x-x')dx' +$$

$$\gamma_d \int_A [CAT(x')/\Delta_L^2]\Delta l(x')^2 g(x-x')dx' + \gamma_p f(x)$$

Now, considering forming a pattern of one layer on a silicon wafer, a number is assigned to a process for actually achieving the forming a pattern, to be reverse to the order of the step. That is, a (reverse) number 1 is assigned to the last step (for example, CMP), and a (reverse) number 2 is assigned to the step just before the last step (etching on a wafer). For performing correction in the (last) process, to which the (reverse) number 1 is assigned, it needs to define $\delta l(x)=0$ in the equation (70). This can be obtained by defining $\delta l(x)=0$ in the equations (47) to (58), which are the solution of the equation (19), and by calculating them. Now, it will be explained a calculation method of correction amounts in the (reverse) number 2 or more steps. It is assumed that calculating a correction amount for a step has already been finished once or more. In other words, it is supposed that the amount for increasing or decreasing the dimension of the figure in each mesh has already been obtained by the correction calculation performed so far. This correction amount is supposed to be $\Delta l_{k-1}(x)$, which is a known amount. With respect to the equation (70), what is necessary is just to define $\delta l(x)=-\Delta l_{k-1}(x)$. Furthermore, at the LSI manufacturing step which is the current correction target, it is supposed that what is necessary is to reduce the dimensions of all the figures in the i-th mesh by $\Delta l_k(x)$ from the design value. This $\Delta l_k(x)$ is an unknown number to be obtained. The equation (70) can be expressed as the following equation (71).

$$-\Delta l_{k1}(x) = -\Delta l_k(x) + \gamma_{dk} \int_A g_k(x-x')\rho_0(x'_{k,l})dx' - \qquad (71)$$

$$\gamma_{dk} \int_A [FEC(x')/\Delta_l^2]\Delta l_k(x')g_k(x-x')dx' +$$

$$\gamma_{dk} \int_A [CAT(x')/\Delta_l^2]\Delta l_k(x')^2 g_k(x-x')dx' + \gamma_{pk}f_k(x-x')$$

where the parameter and the characteristic function in the k-th process are defined to be $\gamma_{dk}$, $\gamma_{pk}$, $g_k(x-x')$, and $f_k(x-x')$. The solution of this equation (71) can be obtained by defining $\delta l(x)=-\Delta l_{k-1}(x)$ in the equations (47) to (58) which are the solution of the equation (19) and performing calculation by using the equations. Based on this calculation, the correction amount $\Delta l_k(x, y)$ can be obtained. The obtained amount becomes a known amount at the next step where another correction calculation is to be performed next (the step of (reverse) number k+1). Then, similarly to the above, the next correction calculation can be carried out.

First, in the step S102 of FIG. 1, a dimension correction amount $\Delta l(x)$ for correcting a global CD error generated by CMP is calculated as mentioned above. This value is defined to be $\Delta l(x, y)$.

First, using the design data of LSI, the inside of the pattern creation region of the design pattern is virtually divided so that it may become a grid region (mesh-like region) in which each side of each grid has an influence range of $\sigma_d/10$. Then, pattern density $\rho_0$ of the figure in each mesh, a total length $l_{sum}$ of the sides of the figure existing in each mesh, and a coefficient $Q_c$ of the apex existing in each mesh are calculated.

Next, as shown in FIG. 9, supposing that patterns of the same type are arranged on the periphery of the pattern concerned on the wafer 22, and defining the influence range, which is to be integrally calculated, to be $3\sigma_d$, the target region for the correction calculation is broadened. Then, using $g_d(x)$, $\sigma_d$, and $\gamma_d$, and defining $\delta l(x)$ to be zero in the equation (8), a dimension correction amount $\Delta l(x)$ in each mesh is calculated. That is, the dimension correction amount $\Delta l(x)$ which makes the global CD error be "0" is calculated. As the method of calculation, the cases 1 and 2 mentioned above should be suitably used. Moreover, as described above, it is more preferable for the calculation to include the contribution of the apex in addition to the area and the total length $l_{sum}$ of the sides of the figure.

Next, in the step S104 of FIG. 1, a dimension correction amount $\Delta l(x)$ for correcting a global CD error generated by etching is calculated. This value is defined to be $\Delta l_2(x, y)$.

The smallest value in $\sigma_m$, $\sigma_l$, $\sigma_e$, and $\sigma_d$ is defined to be s. The inside of the pattern creation region is virtually divided so that it may become a grid region (mesh-like region) in which each side of each grid has an influence range of s/10. Then, values obtained when performing a correction at the CMP step are used for pattern density $\rho_0$ of the figure in each mesh, a total length $l_{sum}$ of the sides of the figure existing in each mesh, and a coefficient $Q_c$ of the apex existing in each mesh.

Next, as shown in FIG. 9, supposing that patterns of the same type are arranged on the periphery of the pattern concerned on the wafer 22, and defining the influence range, which is to be integrally calculated, to be $3\sigma_e$, the target region for the correction calculation is broadened. Then, using $g_e(x)$, $\sigma_e$, and $\gamma_e$, and defining $\Delta l_{k-1}(x)$ to be $\Delta l_1(x)$ in the equation (71), a dimension correction amount $\Delta l_2(x)$ in each mesh is calculated. Moreover, as described above, it is more preferable for the calculation to include the contribution of the apex in addition to the area and the total length $l_{sum}$ of the sides of the figure.

Next, in the step S106 of FIG. 1, a dimension correction amount $\Delta l(x)$ for correcting a global CD error generated by exposing is calculated. This value is defined to be $\Delta l_3(x, y)$.

The grid region (mesh) whose influence range is s/10 is used as it is. Values obtained when performing a correction at the CMP step are used for a pattern density $\rho_0$ of the figure in each mesh, a total length $l_{sum}$ of the sides of the figure existing in each mesh, and a coefficient $Q_c$ of the apex existing in each mesh.

Next, as shown in FIG. 9, supposing that patterns of the same type are arranged on the periphery of the pattern concerned on the wafer 22, and defining the influence range, which is to be integrally calculated, to be $3\sigma_l$, the target region for the correction calculation is broadened. Then, using $g_l(x)$, $\sigma_l$, and $\gamma_l$, and defining $\Delta l_{k-1}(x)$ to be $\Delta l_2(x)$ in the equation (71), a dimension correction amount $\Delta l_3(x)$ in each mesh is calculated. Moreover, as described above, it is more preferable for the calculation to include the contribution of the apex in addition to the area and the total length $l_{sum}$ of the sides of the figure.

Next, in the step S108 of FIG. 1, a dimension correction amount $\Delta l(x)$ for correcting a global CD error generated by manufacturing (forming) a mask is calculated. This value is defined to be $\Delta l_4(x, y)$.

Also herein, the grid region (mesh) whose influence range is s/10 is used as it is. Values obtained when performing a correction at the CMP step are used for a pattern density $\rho_0$ of the figure in each mesh, a total length $l_{sum}$ of the sides of the figure existing in each mesh, and a coefficient $Q_c$ of the apex existing in each mesh.

In the case of correcting a global CD error generated in the mask manufacturing, which is the last process, a term of position dependence property is added. Moreover, at this mask manufacturing step, differing from other examples described above, since what is necessary is to correct only the pattern to be formed on the mask, it is not necessary to suppose there are patterns of the same type on the periphery of the pattern concerned to broaden the region. Then, using $g_m(x)$, $\sigma_m$, $\gamma_{dm}$, $f_{pm}(x)$ and $\gamma_{pm}$, and defining $\Delta l_{k-1}(x)$ to be $\Delta l_3(x)$ in a equation (71), a dimension correction amount $\Delta l_4(x)$ in each mesh is calculated. Moreover, as described above, it is more preferable to include the contribution of the apex in addition to the area and the total length $l_{sum}$ of the sides of the figure.

$\Delta l_4(x)$ obtained in such a way is an amount to be corrected from the figure dimension (design dimension) of the original pattern for each mesh position, for correcting global CD errors generated in all the steps. An actual reduction or enlargement of a pattern may be performed using the CAD system to correct the dimension of the figure which exists in the mesh. In this case, as mentioned above, unnecessary space and overlapping between the figures generated at the border region can be removed by using the function of the CAD system.

Next, using the pattern obtained in such a way, a desired pattern of desired high precision can be obtained from manufacturing a mask to a wafer process. According to this method, what is necessary is just to perform calculation once for the area or the side with respect to the original pattern (design pattern), namely, differing from Embodiment 1, it is not necessary to perform calculation at each step by using the CAD system etc. Moreover, what is necessary is just to actually correct a pattern once by the CAD system, namely, differing from the example in Embodiment 1, it is not necessary to correct the pattern at each step by using the CAD processing. For this reason, processing for correction can be achieved within a shorter time than that of the example in Embodiment 1.

When forming a mask, since the pattern data has already been corrected so that all the errors generated at each step where a global error occurs may be corrected, the pattern finally formed can be the one as designed. What is necessary is just to perform each semiconductor manufacturing step shown in FIG. 1 for processing one layer. Thus far, processing for one layer of the LSI manufacturing step has been explained. Then, by performing the same processing for forming a pattern of other layer, it becomes possible to form a pattern at each step with high dimensional accuracy.

Embodiment 3

According to Embodiment 3, it will be explained that global CD errors generated from the mask manufacturing step to the damascene step are treated at a time. In a practical case, since there is an influence due to the order among processes, the accuracy decreases when treating global CD errors at a time. However, it becomes possible to complete the processing of correction within a shorter time than that of Embodiments 1 and 2. Except for the method of calculating and the method of using the CAD system, other respects are the same as those in Embodiment 1.

Using the mask 38 for measuring position dependence property mentioned above, patterns on the mask 38 are transferred and printed (exposed) onto all over the wafer. Similarly, using the mask 39 for measuring density dependence property, patterns are transferred and printed onto the wafer. Then, after transferring and printing, development is performed. Furthermore, by performing etching, patterns are formed on both the wafers 23 and 25 through the processes from depositing a metal film to a damascene process by CMP. Then, the dimension of a cross pattern at each position on the wafers 23 and 25 is measured. The dimension of the i-th cross pattern on the wafer 23 for measuring position dependence property is defined to be $Wp_i$, and the dimension of the i-th cross pattern on the wafer 25 for measuring density dependence property is defined to be $Wd_i$.

$Wp_i$-design dimension/4 is position dependence property of a global CD error generated in the steps from the mask manufacturing to the CMP step, and will be expressed as $wp_i$. The reason for using 1/4 herein is that the pattern on the mask is reduced by a ratio of 1/4 when being transferred and printed onto the wafer. Similarly, $Wd_i$-design dimension/4 is density dependence property of a global CD error generated in the steps from the mask manufacturing to the CMP step, and will be expressed as $wd_i$. Based on $wp_i$ and $wd_i$ at each position, characteristics of the global CD error can be examined. For example, by performing approximation by using a least-squares method, a function system of a position dependence property function $\gamma_p f(x, y)$ can be obtained. Moreover, a density dependence property function $g(x, y)$ can also be obtained by a similar way. For example, since there are four sorts of global CD error generation factors: the mask manufacturing step, the exposing step, the etching step, and the CMP step, in the case of defining the function $g(x)$ as a Gaussian equation of the equation (5-1) or the equation (5-2), and considering the sum of four Gaussian equations, it is possible to obtain each influence range $\sigma_n$ and each optimal value of the coefficient $\gamma_n$ respectively.

By using the method described above, a function system with respect to the characteristics, the position dependence property and the density dependence property of the global CD error generated at each step can be calculated.

Next, a method of correcting by using the characteristics of each step acquired by the above way will be explained. For ease of explanation, it is supposed that a global CD error depending on a position occurs only in the mask manufacturing process and does not occur in and after the step of optical transferring.

It is assumed that a function indicating the characteristics of global CD errors generated at all the steps is calculated by the way mentioned above, and each function and each coefficient are obtained as follows. As the density dependence property, a multi-Gaussian which expresses the equation (8) by using four Gauss functions is used. It is supposed that the parameter of each Gauss function is obtained as follows: $\sigma_1$, $\sigma_2, \ldots, \sigma_4$ and $\gamma_1, \gamma_2, \ldots, \gamma_4$ are parameters with respect to the density dependence property, and $f_{pm}(x)$ and $\gamma_{pm}$ are parameters with respect to the position dependence property. According to the supposition mentioned above, the position dependence property is an error depending only on the position inside the mask. The smallest value in $\sigma_1$, $\sigma_2$, $\sigma_3$, and $\sigma_4$ is defined to be $\sigma_{min}$.

First, using the design data of LSI, the inside of the pattern creation region of the design pattern is virtually divided so that it may become a grid region (mesh-like region) in which each side of each grid has an influence range of $\sigma_d/10$. Then, pattern density $\rho_0$ of the figure in each mesh, a total length $l_{sum}$ of the sides of the figure existing in each mesh, and a coefficient $Q_c$ of the apex existing in each mesh are calculated.

Next, as shown in FIG. 9, supposing that patterns of the same type are arranged on the periphery of the pattern concerned on the wafer 22, and defining the influence range, which is to be integrally calculated, to be $3\sigma_1$, $3\sigma_2$, $3\sigma_3$, and $3\sigma_4$ respectively, the target region for the correction calculation is broadened. Then, using g(x), $\sigma_1$, $\sigma_2$, - - -, $\sigma_4$, $\gamma_1$, $\gamma_2$, . . . , $\gamma_4$, $f_{pm}(x)$ and $\gamma_{pm}$, and defining $\delta l(x)$ to be zero in the equation obtained by extending the equation (8) to four multi-Gaussian equations, a dimension correction amount $\Delta l(x)$ in each mesh is calculated. That is, the dimension correction amount $\Delta l(x)$ which makes the global CD error be "0" is calculated. As the method of calculation, the cases 1 and 2 mentioned above should be suitably used. Moreover, as described above, it is more preferable for the calculation to include the contribution of the apex in addition to the area and the total length $l_{sum}$ of the sides of the figure.

Next, using the CAD system, the dimension of the figure in each mesh is reduced or enlarged by the correction amount obtained. In this case, as mentioned above, unnecessary space and overlapping between the figures generated at the border region can be removed by using the function of the CAD system.

If a mask with patterns of the dimensions mentioned above can be obtained, the pattern finally formed can be the one as designed. That is, the pattern in which global CD errors are largely reduced can be obtained. What is necessary is just to perform each semiconductor manufacturing step shown in FIG. 1 for processing one layer. Thus far, processing for one layer of the LSI manufacturing step has been explained. Then, by performing the same processing for forming a pattern of other layer, it becomes possible to form a pattern at each step with high dimensional accuracy.

Embodiment 4

In each of the foregoing Embodiments, there is described the structure in which before writing a pattern on a mask, a pattern dimension $CD_0$ of the design pattern is corrected beforehand (resized) to a pattern dimension $CD_d$ that is for writing a pattern whose global CD error has been corrected. However, the method of correcting a global CD error is not restricted thereto. Correction of the pattern dimension on the mask can also be performed by writing a pattern, not with changing the pattern itself, but with adjusting an exposure dose by using a calculated dimension correction. For example, the dimension may be changed depending upon a position by using a mask writing apparatus using laser light (called a laser writing apparatus, hereinafter) without changing the pattern itself. This can be performed as follows: In the laser pattern writing apparatus, a pattern dimension after developing and etching in the mask manufacture can be controlled according to the exposure dose of laser light, i.e., the length of the irradiation time. This correlation between the pattern dimension and the exposure dose is examined beforehand, and when controlling a dimension which should be controlled depending upon an obtained (written) position, the irradiation time can be calculated based on the dimension to be controlled and this correlation. Then, a pattern is written during this irradiation time. The above structure enables a laser pattern writing apparatus to write a pattern on the mask while achieving the dimension correction obtained as mentioned above without directly correcting the pattern by the CAD system.

Figure 19:
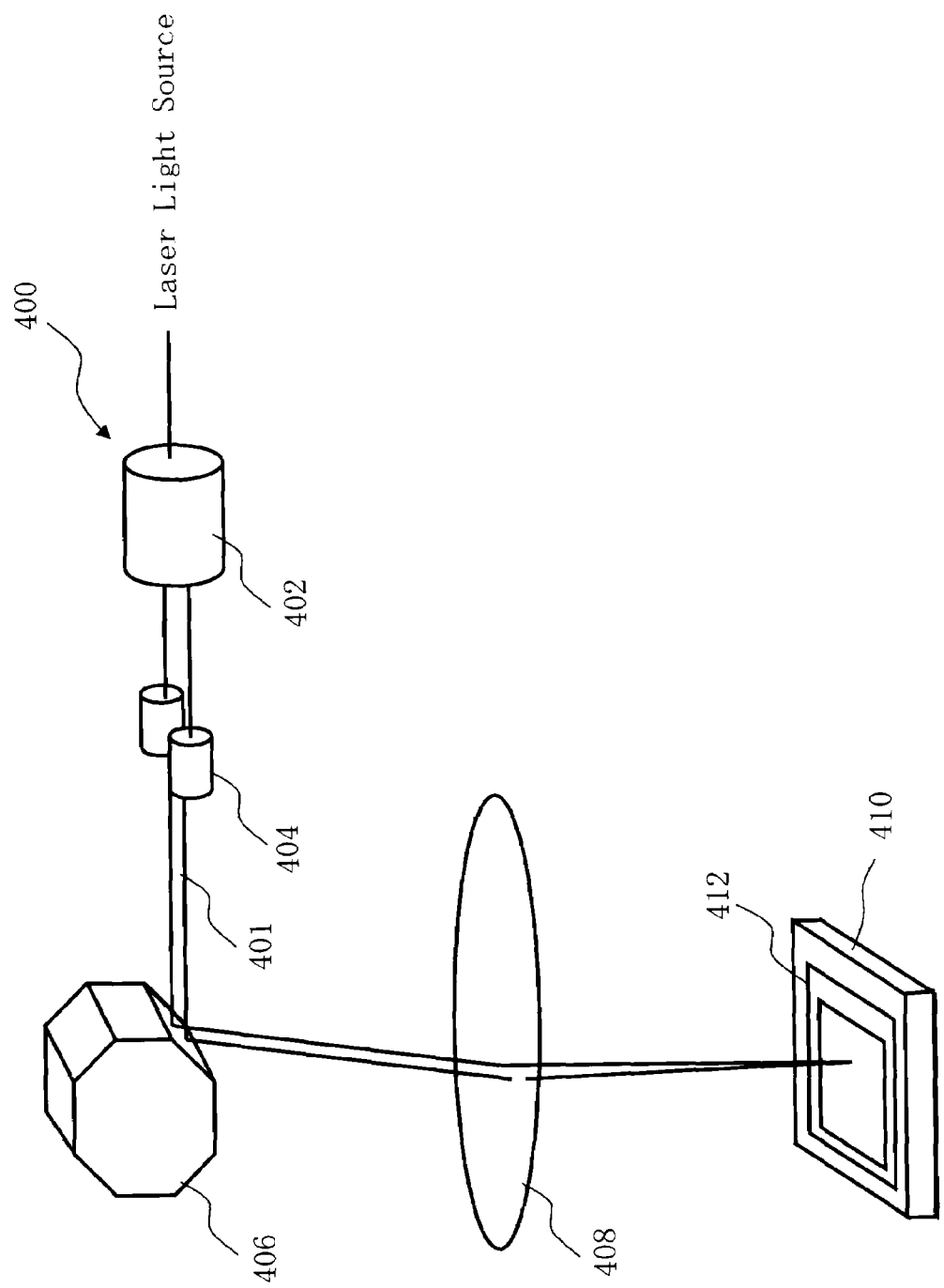
FIG. 19 is a schematic diagram showing a main structure of a laser pattern writing apparatus according to Embodiment 4.

FIG. 19 is a schematic diagram showing the main structure of a laser pattern writing apparatus according to Embodiment 4. In a laser pattern writing apparatus 400, a pattern is written on a mask 412 as follows: First, a laser light 401 generated in a laser light source is decomposed into a plurality of beams (for example, 10 beams) by a beam splitter 402. Each beam is input into an acoustooptic element 404. This acoustooptic element 404 is an element for controlling the beam going or not going. It is possible to adjust a beam strength or a time of beam on (state in which the beam reaches the mask 412) by using this element. That is, by controlling the acoustooptic element 404, an exposure dose can be changed according to a position. Then, by controlling the dimension by changing the exposure dose, a pattern dimension on the mask can be adjusted so that global CD correction may be performed. The laser light 401 which passed through the acoustooptic element 404 is reflected by one surface of a polygon mirror 406, and reduced by a lens 408. Then, the resist on the mask 412 placed on a stage 410 is exposed. At this time, by rotating the polygon mirror 406, the reflection angle of the beam is changed so that the beam may scan over the mask 412. The stage 410 is equipped with a mechanism of continuously moving in the direction perpendicular to the scanning direction of the beam, and a function of step moving in the scanning direction.

The following processing is performed when actually writing an LSI pattern on the mask 412 by using the elements, mechanism and function mentioned above. An LSI pattern is divided into regions each of which can be written by one continuous movement of the stage. Then, writing a pattern in each region is performed by polarizing and turning on or off the beams while continuously moving the stage 410. First, a correlation between the pattern dimension and the exposure dose is calculated beforehand. This correlation is input into an apparatus as first data by the form of a table or a function, and stored in a storage device (not shown). On the other hand, a dimension correction amount $\Delta l(x)$ of each mesh region, which has been obtained by performing one of Embodiments described above, is input into the laser pattern writing apparatus 400 as the second data. The second data is also stored in a storage device (not shown). The laser pattern writing apparatus 400 reads the second data from the storage device, and acquires a dimension correction amount $\Delta l(x)$ for writing each mesh from the second data. Moreover, the laser pattern writing apparatus 400 reads the first data from the storage device and acquires an exposure dose for obtaining the dimension which has been corrected by the acquired dimension correction amount $\Delta l(x)$, from the first data. Then, an irradiation time t is calculated from the acquired exposure dose, and input into the acoustooptic element 404 to adjust the exposure dose for each beam. By performing this, it becomes possible to control the dimension of a figure according to a position of an LSI pattern and to correct a global CD error.

Although the exposure dose is adjusted by controlling the on-off time of a beam in this example, it is also acceptable to adjust the exposure dose by controlling the beam intensity. Moreover, although the case of writing a pattern while continuously moving the stage 410 has been explained, it is also acceptable to apply a method called a step & repeat, which is the method of writing a pattern while the stage is stopped, and after completing writing the region, moving to a next region to write another pattern.

Embodiment 5

Although, in Embodiment 4, the method of using a laser pattern writing apparatus has been explained, it is also acceptable to control a pattern dimension by using a pattern writing apparatus using electron beams (called an electron beam pattern writing apparatus hereinafter) so that global CD correction may be achieved. A structure for controlling a pattern dimension by an electron beam pattern writing apparatus will be explained below. When using an electron beam pattern writing apparatus, a pattern dimension can also be controlled by adjusting an exposure dose, or an irradiation time as well as the case of the laser pattern writing apparatus. However, in the electron beam pattern writing apparatus, since there is a phenomenon of the proximity effect in addition to a global CD error, it is preferable to perform correction of the proximity effect simultaneously.

When writing a circuit pattern by applying an electron beam on a mask covered with resist, the electron beam exposes the resist, penetrates the resist layer, and reaches the underlying layer and the mask substrate, where the beam spreads backward (backward scattering occurs). Then, the electron beam enters the resist layer again, and exposes an unexpected portion of the resist. This phenomenon is called the proximity effect. When the density of a pattern to be written is high, the exposure amount due to the backward scattering increases, namely, the effectual exposure dose increases, which causes the dimension of the pattern to be enlarged. That is, the dimension of a pattern changes depending on the density of the pattern. As a phenomenon, the respect that the dimension changes depending on the pattern density is the same as a global CD error being a target for correction, but they differ in the following respect.

Firstly, the range of the influence is different. Although the exposure amount due to the backward scattering is usually expressed by the Gauss function as stated above, the value of the influence range $\sigma$ of the proximity effect is approximately 10 μm at the acceleration voltage of 50 kV usually used. That is, the value of the influence range $\sigma$ of the proximity effect is further smaller than that of a global CD error being from several mm to several cm. Because of this, an error due to the proximity effect is called a local error.

Secondly, the cause is different. The proximity effect is generated in an electron beam pattern writing apparatus itself which draws a mask pattern, and generated due to a change of the effectual exposure dose as mentioned above. Therefore, correction of the proximity effect can be achieved by adjusting and correcting the exposure dose. On the other hand, a global CD error is not generated from the change of an effectual exposure dose, but is generated at the step after writing a pattern by using a pattern writing apparatus.

Conventionally, global CD correction has not been performed in the electron beam pattern writing apparatus. On the other hand, controlling of an exposure dose has been performed in order to achieve the proximity effect correction. For this reason, when even the global CD correction needs to be performed by controlling an exposure dose, it becomes necessary to make the global CD correction be consistent with the proximity effect correction. This will be explained later. Now, an example of the method of correcting the proximity effect will be described. An absorption amount $E(x)$ of an electron beam energy at the position $x=(x, y)$ of the resist is expressed by the following equation (72).

$$E(x) = K\left\{D(x) + \eta \int_{pattern} D(x')g(x-x')dx'\right\} \quad (72)$$

The first term of the equation (72) is a contribution due to forward scattering, and the second term is a contribution due to backward scattering. The parameter K is a conversion coefficient of from the exposure dose to a stored energy. Moreover, $\eta$ is a parameter indicating the influence of the proximity effect, and is a ratio between the contribution of a stored energy due to forward scattering and the contribution of backward scattering. In the case of the acceleration voltage of 50 kV, the value of $\eta$ is approximately 0.8. The function $g(x)$ fulfills the conditions of the following equation (73).

$$\int_{-\infty}^{\infty}\int_{-\infty}^{\infty} g(x,y)dxdy = 1 \quad (73)$$

Moreover, a Gauss function is used as the following equation (74).

$$g(x)=(1/\pi\sigma_b^2)\exp\{-(x-x')^2/\sigma_b^2\} \quad (74)$$

where $\sigma_b$ is an indication of backward scattering, and in the case of the acceleration voltage of 50 kV, the influence range $\sigma_b$ is approximately 10 μm. The equation for determining an optimal exposure dose $D(x)$ depending on a position for correcting the proximity effect can be expressed by the following equation (75) when defining the exposure dose at pattern density 100% to be $D_{100\%}$.

$$D(x)=D_{100\%} \cdot D^*(x) \quad (75)$$

However, $D^*(x)$ is given by an integral equation of the following equation (76).

$$\{1/(1+2\eta)\}\left\{D^*(x)/2 + \eta \int_{pattern} D^*(x')g(x-x')dx'\right\} = 1 \quad (76)$$

This solution can be expressed by the following equations (77-1) to (77-3), for example, according to the reference documents (JP 3469422 and U.S. Pat. No. 5,863,682).

$$D^*(x) = \sum_{n=1}^{\infty} d_n^*(x) \quad (77\text{-}1)$$

$$d_1(x) = (1/2+\eta)\bigg/\left\{1/2+\eta \int_{pattern} g(x-x')dx'\right\} \quad (77\text{-}2)$$

$$d_n(x) = \quad (77\text{-}3)$$
$$\eta\left\{d_{n-1}(x)\int_{pattern} g(x-x')dx' - \int_{pattern} d_{n-1}(x')g(x-x')dx'\right\}\bigg/$$
$$\left\{1/2+\eta\int_{pattern} g(x-x')dx'\right\}$$

Although the sum is defined to be infinite in the equation (77-1), the required precision can be practically acquired by calculating the first several terms. In a practical correction calculation, an LSI pattern or a mask pattern to be written is divided into regions each of which is the size of $\Delta\times\Delta$ (for example, $(\sigma/10)\times(\sigma/10)$) being sufficiently smaller than $\sigma$. Then, a figure existing in the i-th small region is written with an exposure dose $D(x_i)$ which can be expressed by the following equations (78-1) to (78-4) while defining the center coordinates of the small region to be $x_i$.

$$D(x_i) = D_{100\%} \cdot D^*(x_i) \quad (78\text{-}1)$$

$$D^*(x_i) = \sum_{n=1}^{N} d_n^*(x_i) \quad (78\text{-}2)$$

-continued $$d_1(x_i) = (1/2 + \eta) \bigg/ \bigg\{ 1/2 + \eta \sum_j \rho(x_j) g(x_i - x_j) \Delta^2 \bigg\} \quad (78\text{-}3)$$

$$d_n(x_i) = \eta \left\{ \begin{array}{l} d_{n-1}(x_i) \sum_j \rho(x_j) g(x_i - x_j) \Delta^2 - \\ \sum_j \rho(x_j) d_{n-1}(x'_j) g(x_i - x_j) \Delta^2 \end{array} \right\} \bigg/ \quad (78\text{-}4)$$

$$\bigg\{ 1/2 + \eta \sum_i \rho(x_j) g(x_i - x_j) \Delta^2 \bigg\}$$

where, $\rho(x_j)$ is the pattern density in the j-th small region, and the sum is to be calculated with respect to small regions on the periphery including the i-th small region. For example, it is enough to calculate the sum with respect to all the small regions which exist within $3\sigma_b$ to $4\sigma_b$. Next, a method of simultaneously performing global CD correction and the proximity effect correction will be explained.

Figure 20:
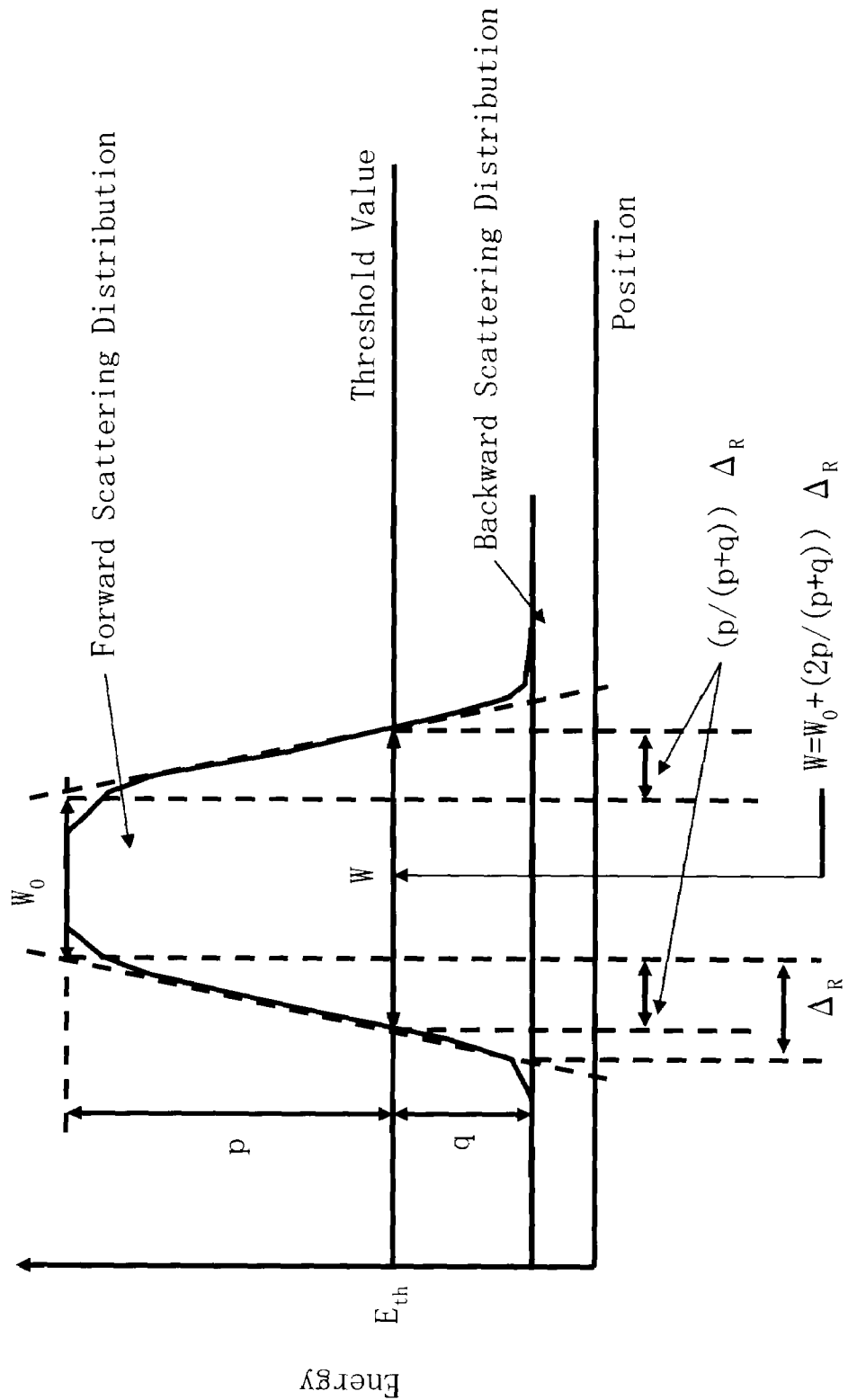
FIG. 20 shows an example of a threshold value model according to Embodiment 5.

FIG. 20 shows an example of a threshold value model according to Embodiment 5. In the model of FIG. 20, it is supposed that the dimension W of a pattern is specified by the position where a threshold value $E_{th}$ crosses the energy distribution given to the resist by electron beams. Using p and q in FIG. 20, the amount f is defined to be $f=q/(p+q)$. The width of the upper part of the energy distribution is defined to be $W_0$, and the width required for rising from the bottom to the upper part is defined to be $\Delta_R$. In this case, the width W can be obtained by $W=W_0+2\Delta_R \cdot f$. Therefore, the dimension W is specified by f. In order to change the dimension by $\Delta l(x_i)$ in each small region, it is necessary to change the amount f to be depending upon $\Delta l(x_i)$ in each area, which will be expressed as $f(\Delta l(x_i))$. For example, in the case of $\Delta l(x_i)=0$, namely when it is as designed, since it becomes $f=1/2$, it can be $f(0)=1/2$. According to Embodiment 5, it is necessary to change the dimension by $\Delta l(x_i)$ by controlling the exposure dose, and to perform this for all the patterns which exist in the small region. Therefore, the equation of the proximity effect correction shown in the following equation (79) which is made by correcting the equation (72) must come into effect.

$$K \bigg\{ f(\Delta l(x)) D(x) + \eta \int_A D(x') g(x - x') dx' \bigg\} = C \quad (79)$$

where the first term of the equation is a contribution due to forward scattering, and the second term is a contribution due to backward scattering. The parameter K is a conversion coefficient of from the exposure dose to a stored energy. Moreover, $\eta$ is a parameter indicating the influence of the proximity effect, and is a ratio between the contribution of a stored energy due to forward scattering and the contribution of backward scattering. Moreover, C is a certain constant. For the sake of simplicity, the function $g(x)$ is on the assumption of the Gaussian distribution of the equation (74).

$\sigma_b$ in the equation (74) is a spread of backward scattering, and is approximately 10 μm when the acceleration voltage is 50 kV.

Figure 21:
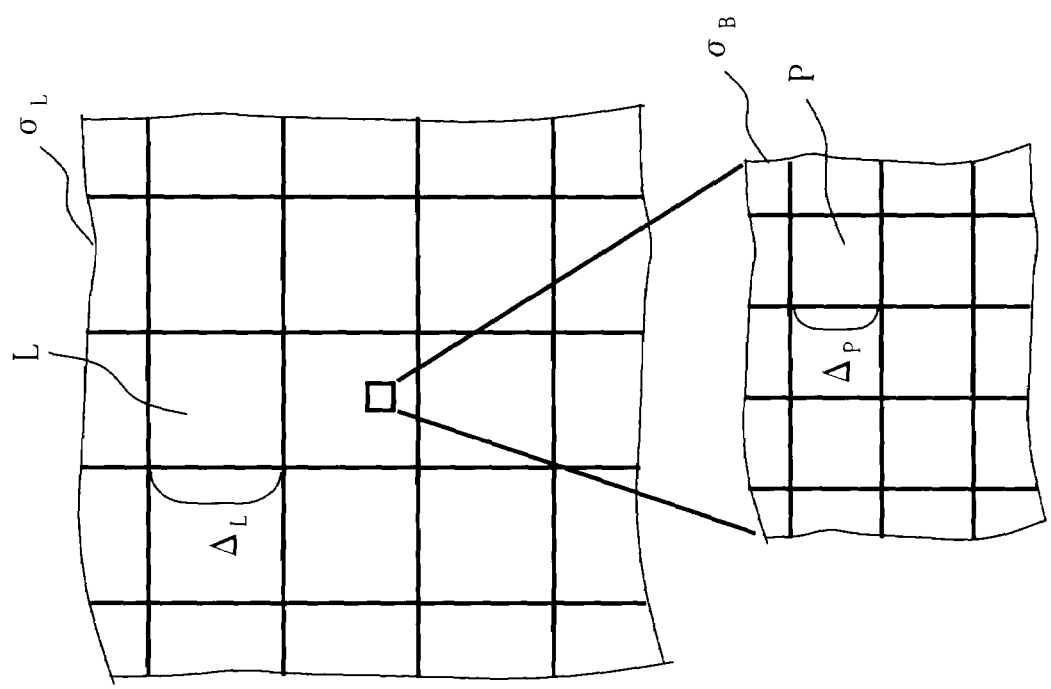
FIG. 21 shows examples of a small region for global CD correction and a small region for proximity effect correction according to Embodiment 5.

FIG. 21 shows an example of a small region for global CD correction and a small region for proximity effect correction according to Embodiment 5. As shown in FIG. 21, in addition to a mesh-like small region L for global CD correction, a mesh-like small region P for proximity effect correction is also applied. All the area of an LSI is virtually divided as shown in FIG. 21, and it is supposed that the size $\Delta p$ of the region P is sufficiently smaller than the spread $\sigma_b$ of the proximity effect (ex. 1 μm). The optimal exposure dose which satisfies the equation (79) is not calculated for each figure, but calculated for each region P. The exposure dose $D(x)$ is expressed as the following equation (80).

$$D(x) = D_{100\%}(x) D_n(x) \quad (80)$$

where $D_{100\%}(x)$ indicates an exposure dose by which the dimension of a pattern (for example, 1 μm:line & space of 1 μm) whose density is 100% in the meaning of the proximity effect can be corrected by a predefined $\Delta l(x)$. $D_n(x)$ is the exposure dose standardized by $D_{100\%}(x)$ in each area. Since $D_{50\%}(x)$ is an exposure dose for controlling the dimension for performing a process correction of a line & space of 1:1, its spatial change is about a dimension change distance by a process, i.e., on the order of mm or cm. Substituting the equation (80) into the equation (79), it can be expressed as the following equation (81).

$$k \bigg\{ \begin{array}{l} D_{100\%}(x) D_n(x) f(\Delta l(x)) + \\ \eta \int_A D_{100\%}(x') D_n(x') g(x - x') dx' \end{array} \bigg\} = C \quad (81)$$

where $g(x-x')$ is an amount which becomes zero at $3\sigma_b$ (approximately 30 μm), but $D_{50\%}(x)$ is an amount becomes zero when on the order of mm to cm. Therefore, in contrast with $g(x-x')$, the change of $D_{50\%}(x)$ can be disregarded and can thus be taken out of the integral. Because of this, the equation (81) can be transformed as the following equation (82).

$$k \bigg\{ D_{100\%}(x) D_n(x) f(\Delta l(x)) + \eta D_{100\%}(x) \int_A g(x - x') dx' \bigg\} = C \quad (82)$$

Further transforming the equation (82), it can be expressed as the following equation (83).

$$k \bigg\{ 2 D_{100\%}(x) f(\Delta l(x)) \bigg[ \begin{array}{l} D_n(x)/2 + \\ \eta^*(\Delta l(x)) \int_A D_n(x') g(x - x') dx' \end{array} \bigg] \bigg\} = C \quad (83)$$

where $\eta^*(\Delta l(x))$ is defined as the following equation (84).

$$\eta^*(\Delta l(x)) = \eta/2 f(\Delta l(x)) \quad (84)$$

Moreover, since $\eta^*(\Delta l(x))$ can be regarded as a constant value in a small region, the following equation (85) is a normal equation for correcting the proximity effect, and can be solved.

$$(2/(1+\eta)) \bigg[ d(x)/2 + \eta^*(\Delta l(x)) \int_A d(x') g(x - x') dx' \bigg] = 1 \quad (85)$$

What is necessary in order to eliminate the error generated on the border of the i-th small region L is to perform a correction calculation while including the small region P which exists within the periphery of $3\sigma_b$ to $4\sigma_b$ and to adopt only the result in the small region L. When the solution of the equation (85) is $d(x, \eta^*(\Delta l(x)))$, and $d(x, \eta^*(\Delta l(x)))$ is used as $D_n(x)$ of the equation (80), the equation (83) can be expressed as the following equation (86).

$$k2D_{100\%}(x)f(\Delta l(x))(2/(1+\eta*(\Delta l(x))))=C \qquad (86)$$

Therefore, $D_{100\%}(x)$ can be obtained by the following equation (87).

$$D_{100\%}(x)=C/[2kf(\Delta l(x))(2/(1+\eta*(\Delta l(x))))] \qquad (87)$$

Using the solutions, the exposure dose $D(x)$ can be obtained by the following equation (88).

$$D(x)=D_{100\%}(x)d(x) \qquad (88)$$

where $D_{100\%}(x)$ is defined by the equation (87), and $d(x)$ is the solution of the equation (85). As mentioned above, it turned out that, in order to change the dimension by controlling the exposure dose by using the electron beam pattern writing apparatus, it is necessary to change not only the exposure dose of the pattern (line & space in the above case) used as a standard but also the parameter η of the proximity effect correction.

Now, using solutions of the above equations, concrete processing procedures when using the electron beam pattern writing apparatus will be explained. The respect of forming a pattern of one layer in the semiconductor manufacturing step through some steps and the method of calculating a corrected dimension, while applying the solution mentioned above, are the same as those described in one of Embodiments 1 to 3 mentioned above. Therefore, a method of forming a corrected dimension on the mask while performing writing based on the design pattern when forming a pattern by using an electron beam pattern writing apparatus will be explained.

Figure 22:
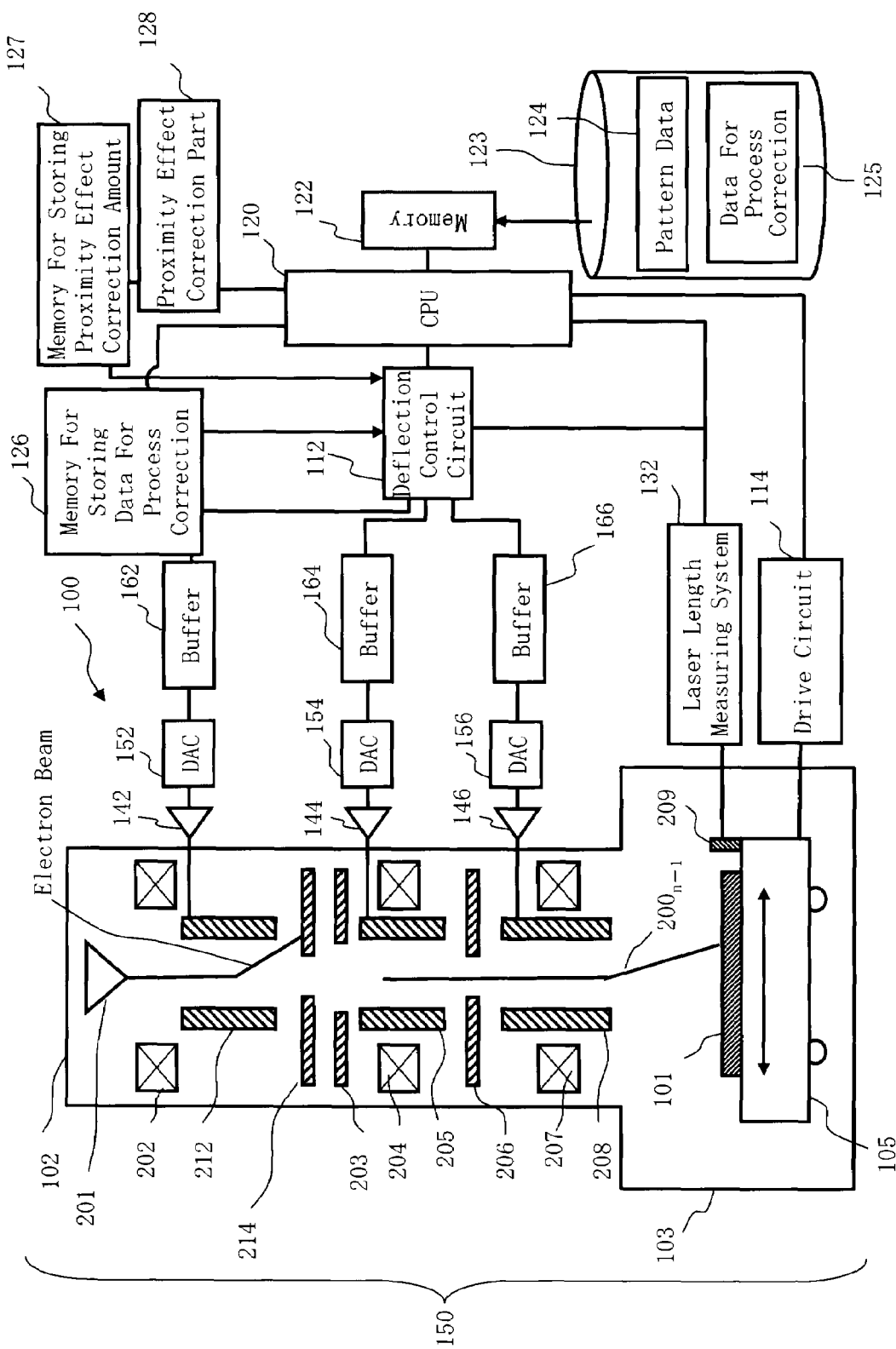
FIG. 22 is a schematic diagram showing a structure of a pattern writing apparatus according to Embodiment 5.

FIG. 22 is a schematic diagram showing a structure of a pattern writing apparatus according to Embodiment 5. In the figure, as an example of a charged particle beam pattern writing apparatus, there is shown a pattern writing apparatus 100 being a variable-shaped electron beam pattern writing apparatus. The pattern writing apparatus 100 writes a pattern on a target object "workpiece" or "sample" 101. The pattern writing apparatus 100 includes a writing part 150 and a control system. The writing part 150 includes an electron lens barrel 102 and a writing chamber 103. In the electron lens barrel 102, there are arranged an electron gun assembly 201, an illumination lens 202, a blanking (BLK) deflector 212, a blanking (BLK) aperture plate 214, a first forming aperture plate 203, a projection lens 204, a forming deflector 205, a second forming aperture plate 206, an objective lens 207 and an object deflector 208. An XY stage 105 is arranged in the writing chamber 103. A reflective mirror 209 for measuring laser length is arranged on the XY stage 105. Moreover, the target object 101 is laid on the XY stage 105. The exposure mask mentioned above is included in the target object 101. On the other hand, the control system includes a control calculator (CPU) 120 used as a computer, a memory 122, a deflection control circuit 112, a laser length measuring system 132, a drive circuit 114, a deflection amplifier 142, a digital/analog converter (DAC) 152, a buffer memory 162, a deflection amplifier 144, a DAC 154, a buffer memory 164, a deflection amplifier 146, a DAC 156, a buffer memory 166, a storage device 123, a data storing memory 126 for correcting a process, a memory 127 for storing a proximity effect correction amount, and a proximity effect correction part 128.

For example, the BLK deflector 212 of an electrostatic type turns beams on by making an electron beam 200 pass without deflection, and turns the beams off by performing deflection. For example, the forming deflector 205 of an electrostatic type is located posterior to the BLK deflector 212 on the optical path, and deflects and forms the electron beam 200. For example, the object deflector 208 of an electrostatic type is located posterior to the forming deflector 205 on the optical path, and deflects the electron beam 200 onto a predefined position of the target object 101.

The memory 122, the deflection control circuit 112, the laser length measuring system 132, the drive circuit 114, and the proximity effect correction part 128 are connected to the CPU 120 through a bus not shown. The deflection control circuit 112 and the drive circuit 114 are controlled by the CPU 120. Data, a calculation result, etc. inputted into the CPU 120 are stored in the memory 122. The laser length measuring system 132, the buffer memory 162, the buffer memory 164, and the buffer memory 166 are connected to the deflection control circuit 112 through a bus not shown. The DAC 152 is connected to the buffer memory 162, the deflection amplifier 142 is connected to the DAC 152, and the deflection amplifier 142 is connected to the BLK deflector 212. Similarly, the DAC 154 is connected to the buffer memory 164, the deflection amplifier 144 is connected to the DAC 154, and the deflection amplifier 144 is connected to the forming deflector 205. Similarly, the DAC 156 is connected to the buffer memory 166, the deflection amplifier 146 is connected to the DAC 156, and the deflection amplifier 146 is connected to the object deflector 208. Although only the structure elements necessary for explaining Embodiments are shown in FIG. 22, it should be understood that other structure elements generally necessary for the pattern writing apparatus 100 may also be included.

The electron beam 200 emitted from the electron gun assembly 201, after being collected by the illumination lens 202 and passing through the BLK aperture plate 214 while forming a crossover, illuminates the whole of the first forming aperture plate 203 having a hole of an oblong figure, for example, a rectangle. First, the electron beam 200 is formed to be an oblong figure, for example, a rectangle. Then, the electron beam 200 of the first aperture image which passed the first forming aperture plate 203 is projected on the second forming aperture plate 206 by the projection lens 204. The position of the first aperture image on the second forming aperture plate 206 is controlled by the forming deflector 205 in order to change the beam shape and dimension. The electron beam 200 of the second aperture image which passed the second forming aperture plate 206 is focused by the objective lens 207, deflected by the object deflector 208, and illuminates an intended position on the target object 101 on the XY stage 105 movably arranged. The XY stage 105 is driven in the XY directions by the drive circuit 114. The position of the XY stage 105 can be measured by the method of reflecting a laser beam emitted from the laser length measuring system 132 by the reflective mirror 209 and receiving the reflected laser beam by the laser length measuring system 132.

Moreover, the inside of the electron lens barrel 102 and the writing chamber, where the XY stage 105 is arranged, is exhausted by a vacuum pump (not shown), and controlled to be a pressure lower than atmospheric pressure.

The BLK deflector 212 is controlled by the deflection control circuit 112, the buffer memory 162, the DAC 152 and the deflection amplifier 142. The forming deflector 205 is controlled by the deflection control circuit 112, the buffer memory 164, the DAC 154 and the deflection amplifier 144. The object deflector 208 is controlled by the deflection control circuit 112, the buffer memory 166, the DAC 156, and the deflection amplifier 146.

When moving the position of the electron beam 200 on the target object 101, or when completing the irradiation time, the electron beam 200 is deflected by the BLK deflector 212 of an electrostatic type in order that the electron beam 200 may not illuminate an unnecessary region on the target object 101. Then, the deflected electron beam 200 is blocked off by the BLK aperture plate 214. Consequently, the electron beam 200 does not reach the surface of the target object 101. That is, by deflecting the electron beam 200 by using the BLK deflector 212 and blocking off the deflected electron beam 200 by using the BLK aperture plate 214, it becomes possible to illuminate the electron beam only during a predefined time period.

Figure 23:
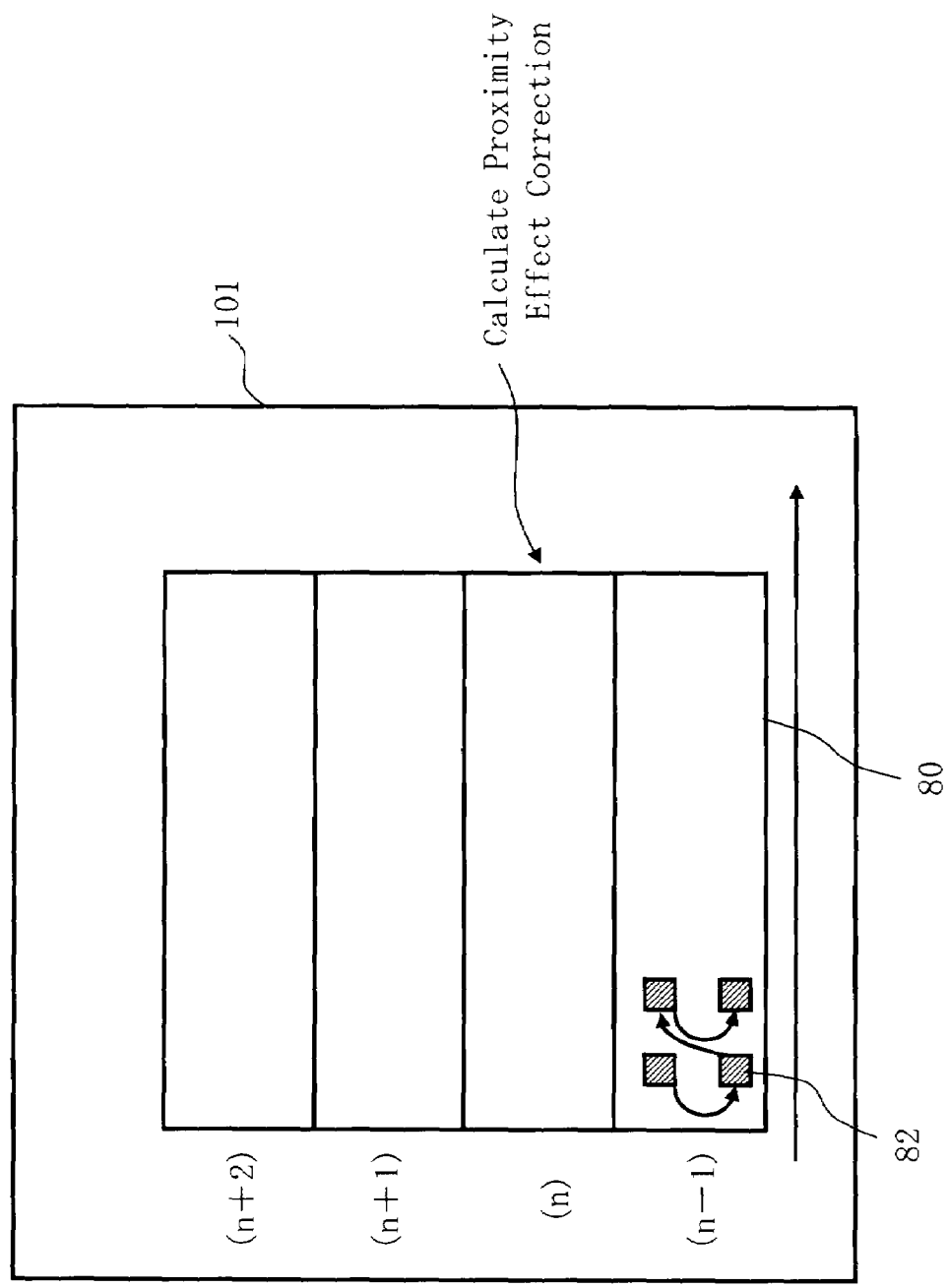
FIG. 23 shows an example of a writing unit region according to Embodiment 5.

FIG. 23 shows an example of a writing unit region according to Embodiment 5. Writing a pattern is performed while continuously moving the XY stage 105. As shown in FIG. 23, the LSI pattern is divided into regions (stripes) 80 in each of which a pattern can be written by one continuous movement of the stage. While continuously moving the XY stage 105 and controlling the shape, the size, the position, and the irradiation time of a beam, a pattern 82 is written in the stripe 80. After completing the processing for one stripe 80, a pattern in the next stripe 80 is written similarly. All the stripes are processed to write an intended LSI pattern.

In this case, the proximity effect correction part 128 performs processing in parallel to the writing. That is, while writing the n-th stripe 80, calculation for proximity effect correction in the next (n+1)th stripe 80 is performed. A concrete correction calculation is executed as follows: For example, when carrying out a correction calculation for the n-th stripe 80, patterns existing in before and after the n-th stripe 80 are added to the pattern existing in the n-th stripe 80. Concretely, patterns existing within $4\sigma_b$ to $5\sigma_b$ outwardly from the side of the n-th stripe are added. This processing is performed for correctly including the influence of the pattern existing in the next stripe, nearly at the border of the stripe. After correcting, only the correction data for the target stripe is used as a correction result, and the data for the added to the patterns in the outer stripe is not used. With respect to patterns in the adjoining stripe, data in the case of the adjoining stripe itself becoming a target stripe can be used. Inputting and using a group of values of $\eta$ for each small region for global CD correction (called a small region L), the pattern writing apparatus 100 performs calculation for the proximity effect correction. Data for the group of values of $\eta$, etc. may be stored in the storage device 123, as process correction data 125. Moreover, pattern data 124 is stored in the storage device 123.

First, the proximity effect correction part 128 divides the inside of the stripe 80 into mesh-like small regions L. Then, a target small region L is enlarged in the direction of an adjoining small region L by $3\sigma_b$ to $4\sigma_b$. Further, the inside of the extended region is divided into mesh-like small regions (called a small region P), each of which is sufficiently smaller, for example 1×1 μm, than the influence range $\sigma_b$ used as the spread range of the proximity effect. Pattern density of the pattern existing in each small region P is calculated. In that case, with respect to small regions L on the periphery, the density of the pattern existing in the small region concerned is calculated, or when being extended to the adjoining stripe, the density of the pattern existing in the region having been extended to the adjoining stripe is calculated. Using the pattern density obtained by such a method, the proximity effect correction part 128 inputs the value of $\eta$ corresponding to each small region L, from the storage device 123 through memory 122 and the CPU 120. Further, the value of $\eta$ is input into a correction calculation subsystem in the proximity effect correction part 128, and the subsystem performs calculation for each small region P using this input value. A correction exposure dose d(x) used as a proximity effect correction amount can be calculated as the solution of the equation (85) mentioned above. This procedure is performed for all the small regions L in a stripe. In such a way, the proximity effect correction amount for one stripe is calculated for each small region P. The calculated proximity effect correction amount is stored in the memory 127 for storing the proximity effect correction amount.

Moreover, a standard exposure dose $D_{100\%}(x)$ for global CD correction, which has been calculated using other software separately beforehand, is stored in the storage device 123. Alternatively, it may be calculated by the CPU 120. The dimension correction amount $\Delta l(x)$ for global CD correction at each mesh (small region L) is calculated by using one of the methods of Embodiments 1 to 3 mentioned above. The standard exposure dose $D_{100\%}(x)$ obtained by using a dimension correction amount $\Delta l(x)$ calculated in each mesh can be computed from the equation (87). Moreover, a proximity effect correction parameter $\eta^*(\Delta l(x))$ can be computed from the equation (84). In this way, the standard exposure dose $D_{100\%}(x)$ and the proximity effect correction parameter $\eta^*(\Delta l(x))$ of each mesh are calculated as input data to the pattern writing apparatus 100, and stored in the storage device 123, as data 125 for process correction. The CPU 120 reads the standard exposure dose $D_{100\%}(x)$ from the storage device 123 through the memory 122, and stores it in the data storing memory 126 for process correction.

When actually writing, the correction exposure dose d(x) for each small region P for proximity effect correction stored in the memory 127, and the standard exposure dose $D_{100\%}(x)$ for each small region L for global CD correction stored in the data storing memory 126 are used. For example, in the case of writing a certain shot $s_1$, the deflection control circuit 112 calculates which global CD correction mesh includes the irradiation position of the shot $s_1$, and reads the standard exposure dose $D_{100\%}(x)$ for global CD correction corresponding to the obtained mesh, from the data in the data storing memory 126 for process correction. This read standard exposure dose $D_{100\%}(x)$ is defined to be $Ds_1$. Moreover, the deflection control circuit 112 calculates which proximity effect correction mesh includes the irradiation position of the shot $s_1$, and reads the proximity effect correction exposure dose d(x) corresponding to the obtained mesh, from the data in the memory 127 for storing the proximity effect correction amount. This read proximity effect correction exposure dose d(x) is defined to be $ds_1$. Then, the deflection control circuit 112 defines the exposure dose D(x) of the shot $s_1$ to be $Ds_1 \times ds_1$, and computes the irradiation time t by dividing $Ds_1 \times ds_1$ by the current density B. The deflection control circuit 112 outputs a signal for controlling a voltage to be applied to the forming deflector 205, to the buffer 164 through the DAC 154 and the deflection amplifier 144. Based on this signal, the size of the shot is controlled. Moreover, the deflection control circuit 112 outputs a signal for controlling a voltage to be applied to the object deflector 208 used for deflecting a position, to the buffer memory 166 through the DAC 156 and the amplifier 146. Based on this signal, the position of the shot is controlled. Then, the deflection control circuit 112 outputs a signal for controlling a voltage to be applied to the BLK deflector 212, to the buffer memory 162 through the DAC 152 and the amplifier 142. Based on this signal, a voltage for turning the beam on (null voltage in a usual case) is applied to the BLK deflector 212 during the irradiation time t calculated above.

The structure mentioned above enables to control the dimension of a figure to be formed on the mask by emitting a shot of a predefined dose during a predefined time period.

Thus, it is possible to correct a global CD error related to a loading effect or a process, of the pattern written in the above way.

Embodiment 6

In each Embodiment mentioned above, the case of correcting a global CD error has been explained. For example, since the influence range σ of a global CD error resulting from the loading effect generated at the time of etching is on the order of about cm, the suitable mesh size used for calculation is approximately 1 mm. Moreover, since the influence range σ of a global CD error resulting from a flare is approximately 4 to 16 μm, the suitable mesh size is approximately 400 to 1600 nm. That is, for correcting a global CD error, it is preferable for the mesh size to be in the range of 100 nm to 10 mm. Such a size usually includes two or more figures. Therefore, in each Embodiment mentioned above, calculation is usually performed for each mesh region including two or more figures.

However, the equation and the method used for calculating a dimension correction amount Δl(x) in each foregoing Embodiment are not restricted to the size of the region stated above. For example, the equation and the method can be used when correcting a local CD error resulting from a micro loading effect whose influence range σ is approximately 250 nm. In that case, the suitable mesh size is approximately 50 nm. That is, for correcting a local CD error, such as a micro loading effect, whose range is narrowed, it is preferable for the mesh size to be in the range smaller than 100 nm. Such a size usually includes one figure or a part of one figure. Therefore, usually, even for a calculation for each mesh region including one figure or a part of one figure, the equation and the method for calculating a dimension correction amount Δl(x) described in each foregoing Embodiment can also be used. In that case, what is necessary is just to change values of the mesh size $\Delta_L$, the influence range $\sigma_L$, and the correction coefficient $\gamma_d$. For example, it is sufficient to approximately set 250 nm as the influence range $\sigma_L$, 50 nm as the mesh size $\Delta_L$, and −10 nm as the correction coefficient $\gamma_d$.

Figure 24:
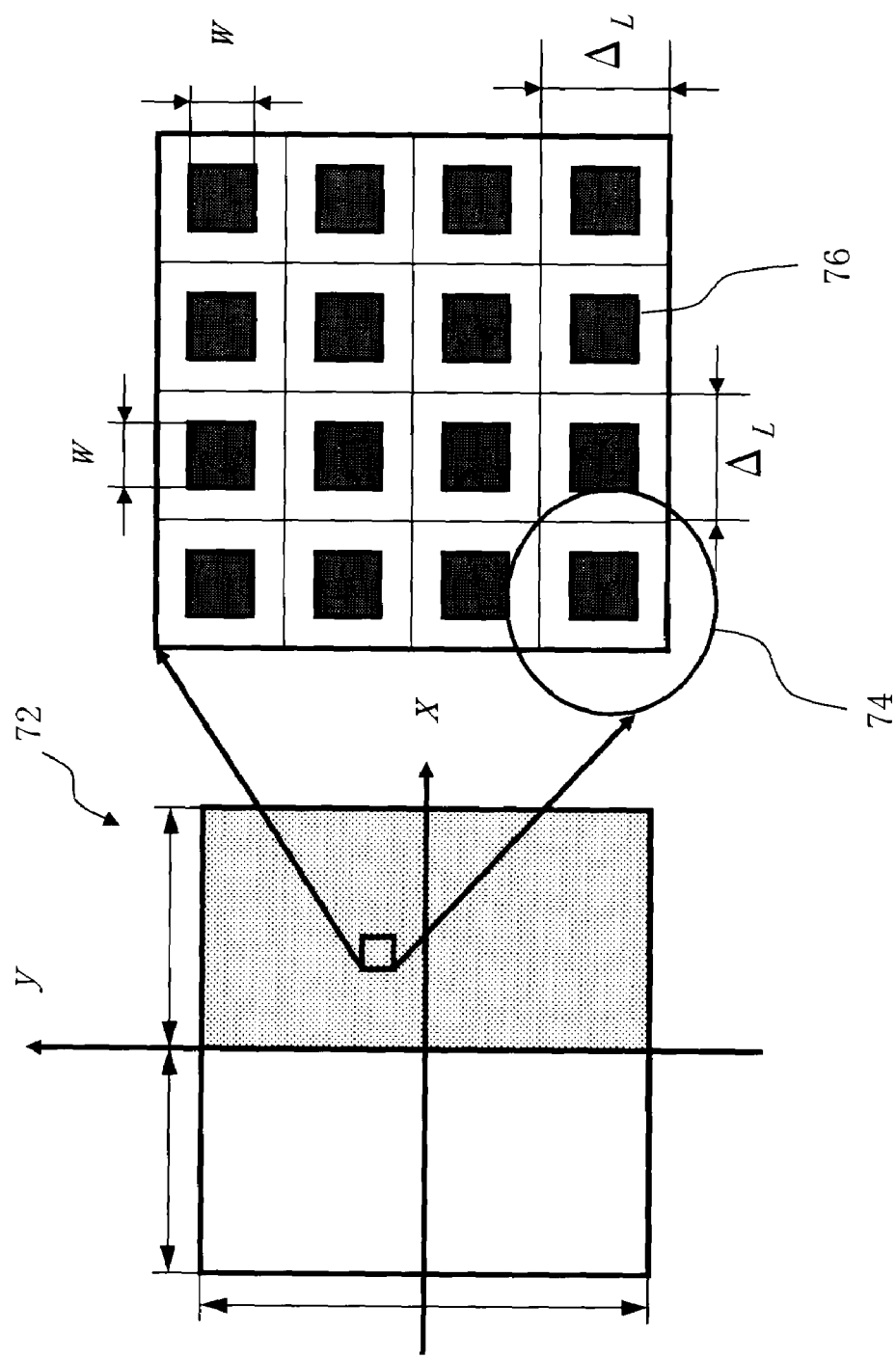
FIG. 24 shows an example of a pattern for measuring a correction error according to Embodiment 6.

An example of a calculation result in the case of correcting an error of a local CD whose range is narrowed will now be explained. FIG. 24 shows an example of a pattern for measuring a correction error according to Embodiment 6. At the right half of the writing region 72 being a two-dimensional plane, a rectangular figure 76, such as a contact hole pattern, is formed. The size of each rectangle is defined to be w×w. A mesh region 74 of the pattern for calculating a local CD error, such as a micro loading effect, is divided into regions of the size of $\Delta_L \times \Delta_L$. In this case, approximately, 50 nm is set as the mesh size $\Delta_L$, 250 nm is set as the influence range $\sigma_L$, and −10 nm is set as the correction coefficient $\gamma_d$.

Figure 25:
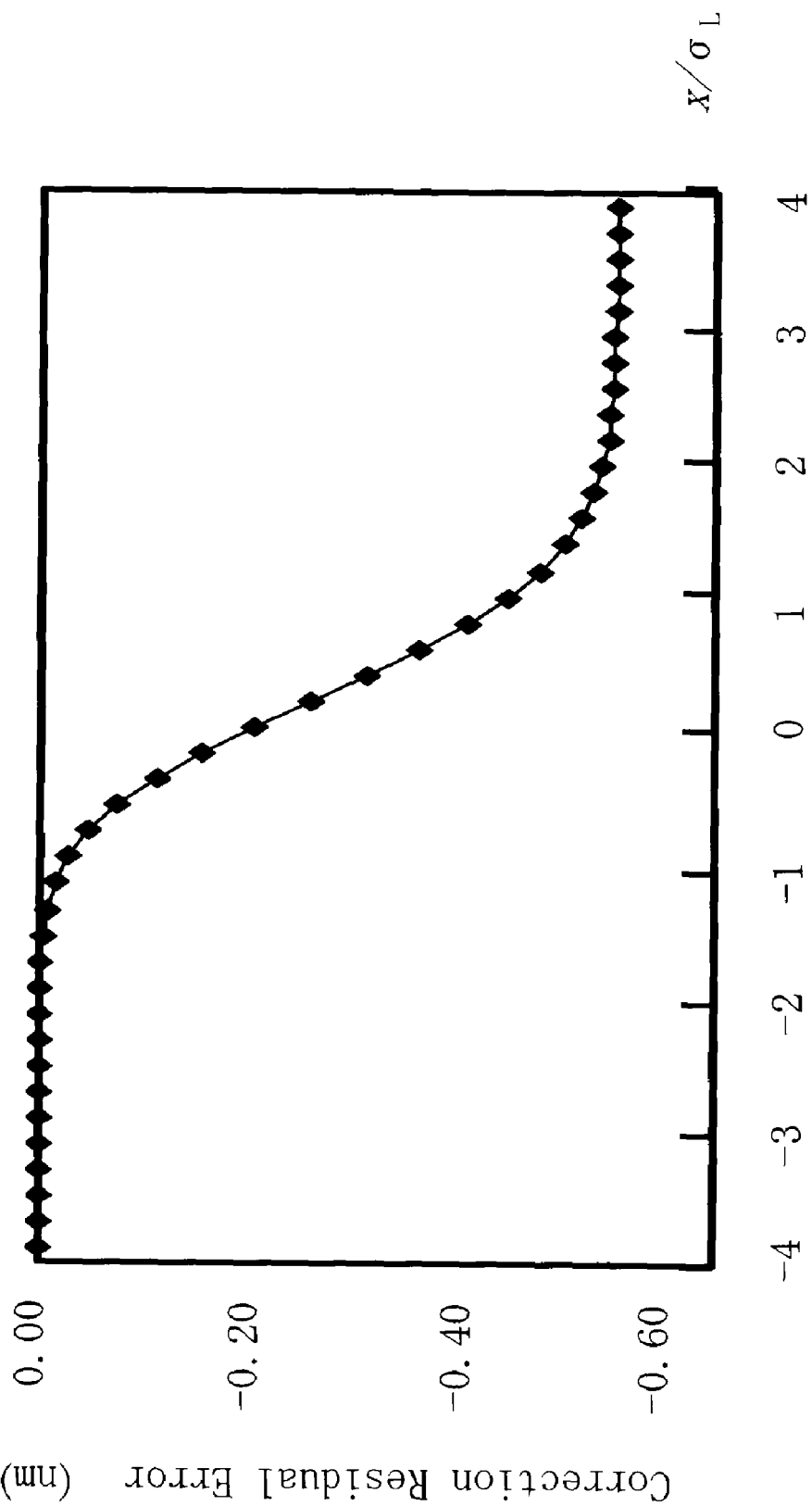
FIG. 25 is a graph showing an example of correction precision in the case of taking only the area into consideration according to Embodiment 6.

FIG. 25 is a graph showing an example of correction precision in the case of taking only the area into consideration according to Embodiment 6. In this case, as an example, only the area (or density) of a pattern is considered, and contribution of the side and the apex are disregarded. As shown in FIG. 25, it turns out that since the contribution of the side and the apex are disregarded, a correction residual error largely remains depending upon a position.

Figure 26:
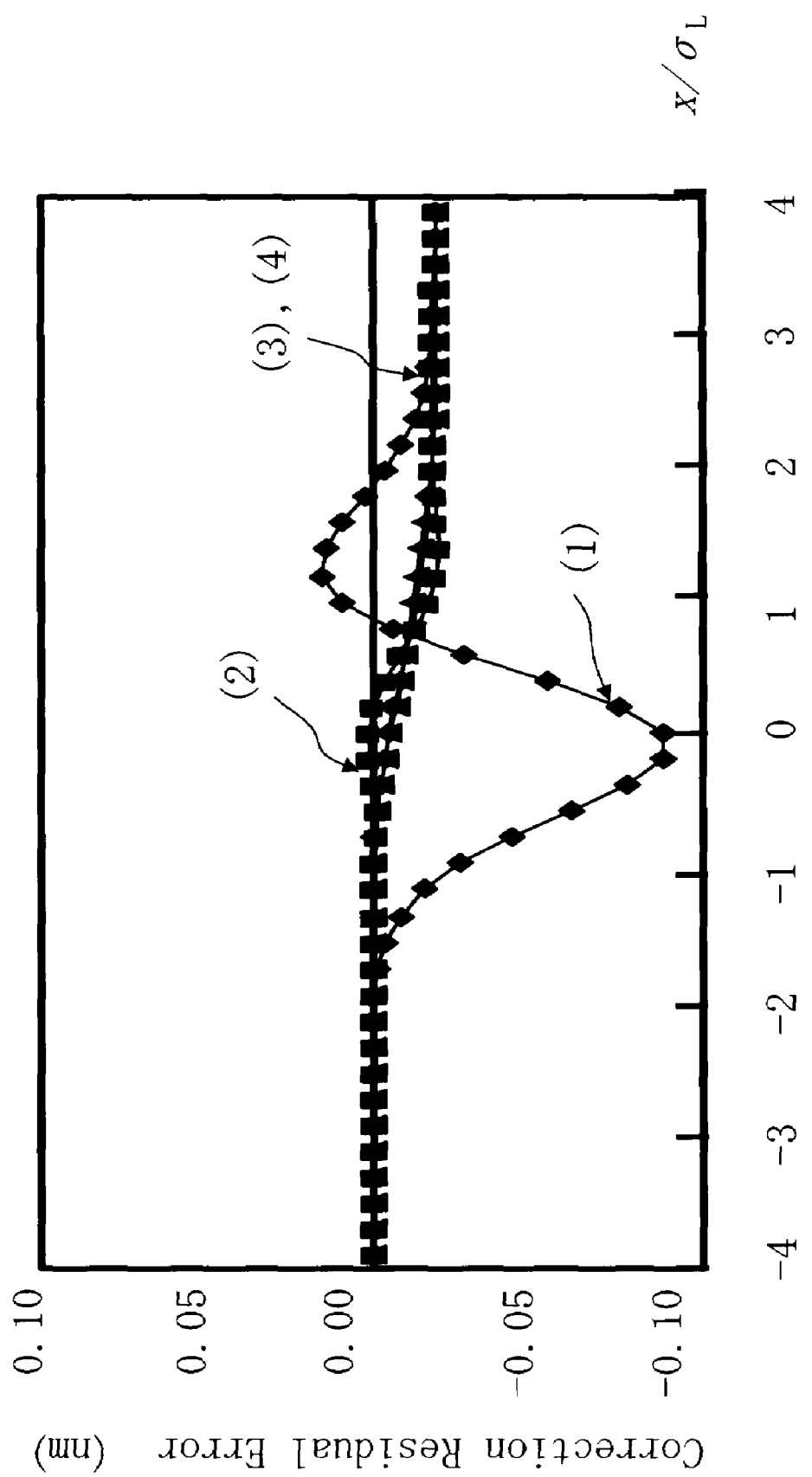
FIG. 26 is a graph showing an example of correction precision in the case of taking the area and the total length of the sides into consideration according to Embodiment 6.

FIG. 26 is a graph showing an example of correction precision in the case of taking the area and the total length of the sides into consideration according to Embodiment 6. The numeral in the parenthesis shows the calculation times. In this case, the correction residual error becomes smaller when the calculation times is twice than once. That is, in the case of calculating the solution using the total length of the sides in addition to the area, a higher precision can be obtained than the case of taking only the area into consideration. This enables to suppress the error to be 0.02 nm, and then, depending on precision demanded, a sufficient correction may be performed. Now, a method of further enhancing this correction precision will be explained below. In the example of FIG. 26, even if the calculation times is increased to be three times or more, the precision cannot be improved. This is caused by having disregarded the contribution of the apex.

Figure 27:
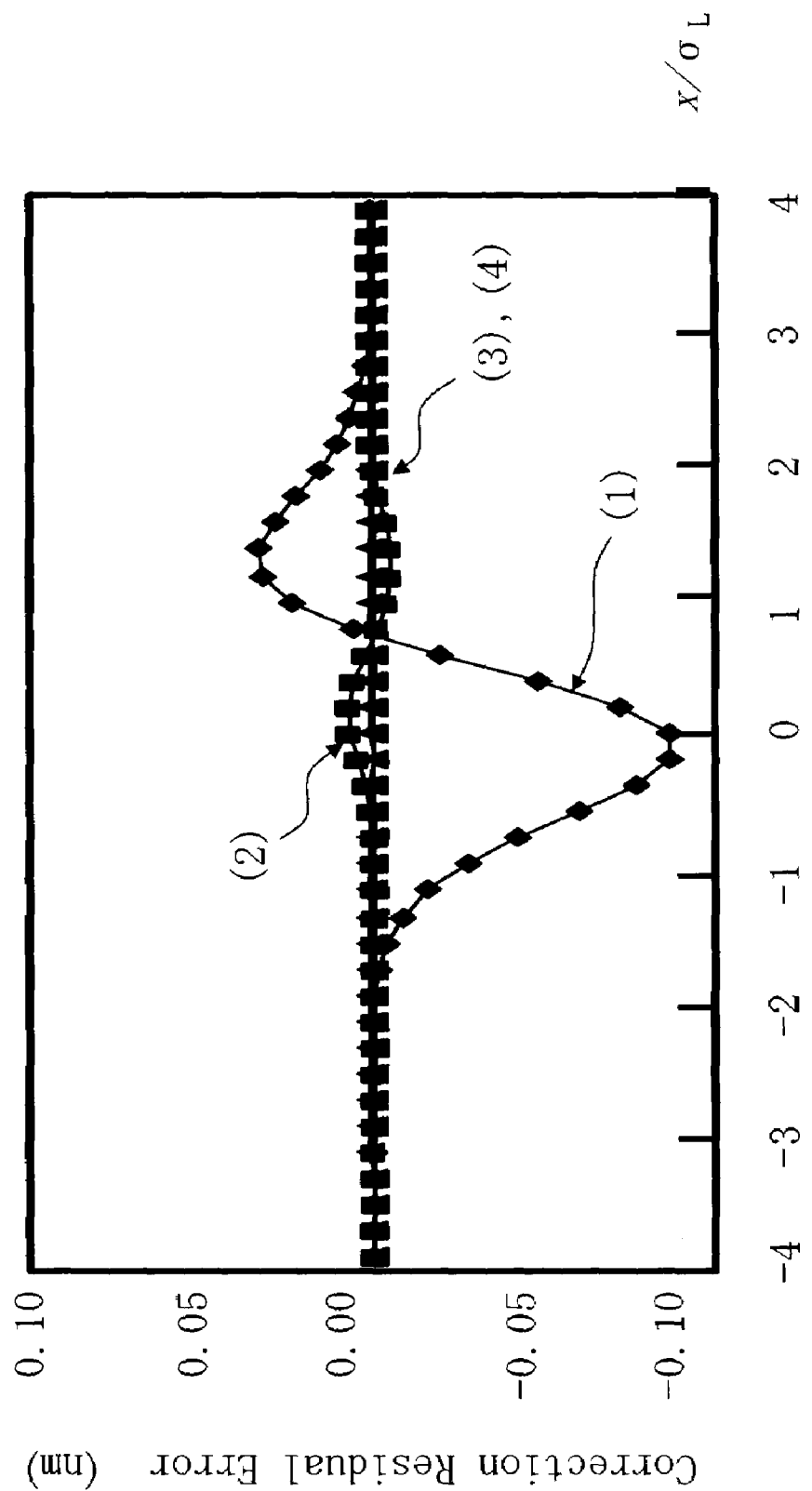
FIG. 27 is a graph showing an example of correction precision in the case of taking the contribution of the area, the total length of the sides, and the apex into consideration according to Embodiment 6.

FIG. 27 is a graph showing an example of correction precision in the case of taking the contribution of the area, the total length of the sides, and the apex into consideration according to Embodiment 6. The numeral in the parenthesis shows the calculation times. In this case, the contribution of the side and the apex is taken into consideration. By increasing the calculation times, the correction residual error can be suppressed within 0.1 nm.

As shown in FIG. 25, it is anticipated that, if solely applying the method of taking only the area into consideration, the precision may become insufficient as miniaturization of a pattern progresses. On the other hand, as shown in FIGS. 26 and 27, it becomes possible to fulfill the precision requirement of the future LSI by applying each solution of the cases 1 and 2. In particular, by performing a correction with considering the contribution of the side and the contribution of the apex as the case 2, a further higher correction can be performed.

As mentioned above, by utilizing the area and the total length of the sides of the perimeter of a pattern included in each mesh of a plurality of grid regions (mesh) made by virtually dividing the pattern creation region of an exposure mask, it becomes possible to highly accurately calculate a correction amount for correcting a local CD error of the pattern generated by a micro loading effect. Furthermore, by including a value obtained by multiplying the coefficient $Q_c$ of the apex by $\Delta l(x)^2$ in the calculation, as the contribution of the apex of the pattern in the mesh, it becomes possible to calculate a further higher precise correction amount Δl(x) for correcting an error of a local CD whose range is narrowed.

Figure 28:
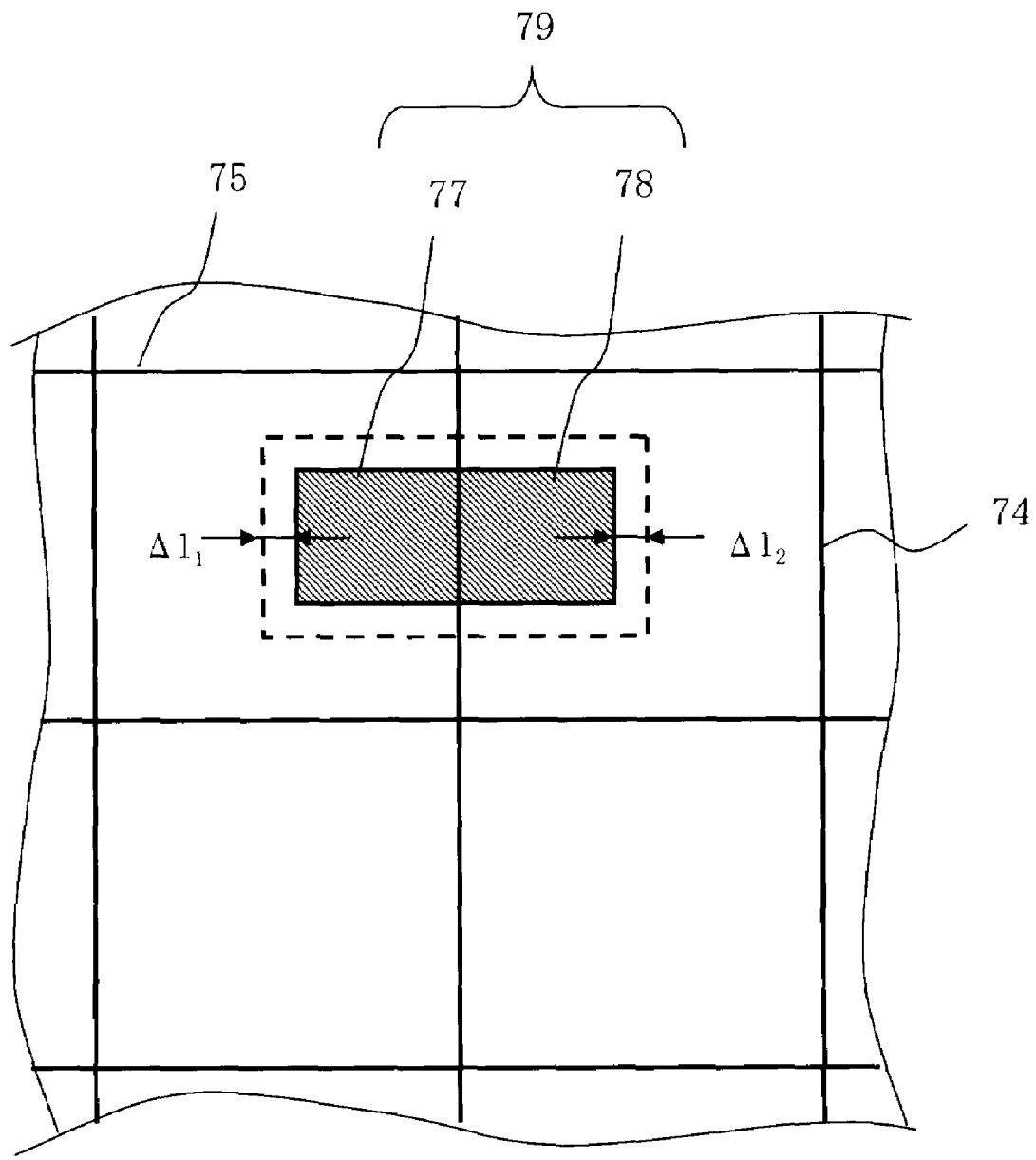
FIG. 28 shows an example of a pattern according to Embodiment 6.

In FIG. 24, the case of including one figure 76 in the mesh region 74 is shown, but it is not restricted thereto. FIG. 28 shows an example of a pattern according to Embodiment 6. If the mesh size is narrowed, only a part of the figure 79 can be included in the mesh region 74 as shown in FIG. 28. In such a case, partial figures 77 and 78 included in the mesh regions 74 and 75 are calculated separately. Then, a dimension correction amount Δl(x) is calculated for each mesh region. In this case, a dimension correction amount $\Delta l_1(x)$ of the partial figure 77 included in the mesh region 75 and a dimension correction amount $\Delta l_2(x)$ of the partial figure 78 included in the mesh region 74 are calculated to perform a dimension correction respectively.

Next, as described in Embodiment 1 and as shown in FIG. 1, a more highly precise correction can be performed if a CD error is corrected in order from the latter step to the former one in each manufacturing step. The same can be said for a local CD error due to a micro loading effect. In the example of FIG. 1, a CD error due to a micro loading effect will be corrected at the step (S104) of correcting an error generated in the etching step at the time of forming a pattern on the wafer. Then, the correction precision when related to the step (S106) of correcting a global CD error caused by a flare generated in the exposure step (S202) which is one step posterior to the mask forming step (S201) will be explained below. In calculating a dimension correction due to a micro loading effect herein, it is defined that $\sigma_L$=250 nm and $\gamma_d$=−10 nm. Moreover, in calculating a dimension correction caused by a flare, using the equation of a double Gaussian, it is defined that $\sigma_{L1}=4$ μm, $\gamma_{d1}=10$ nm, $\sigma_{L2}=17$ μm, and $\gamma_{d2}=10$ nm.

Figure 29:
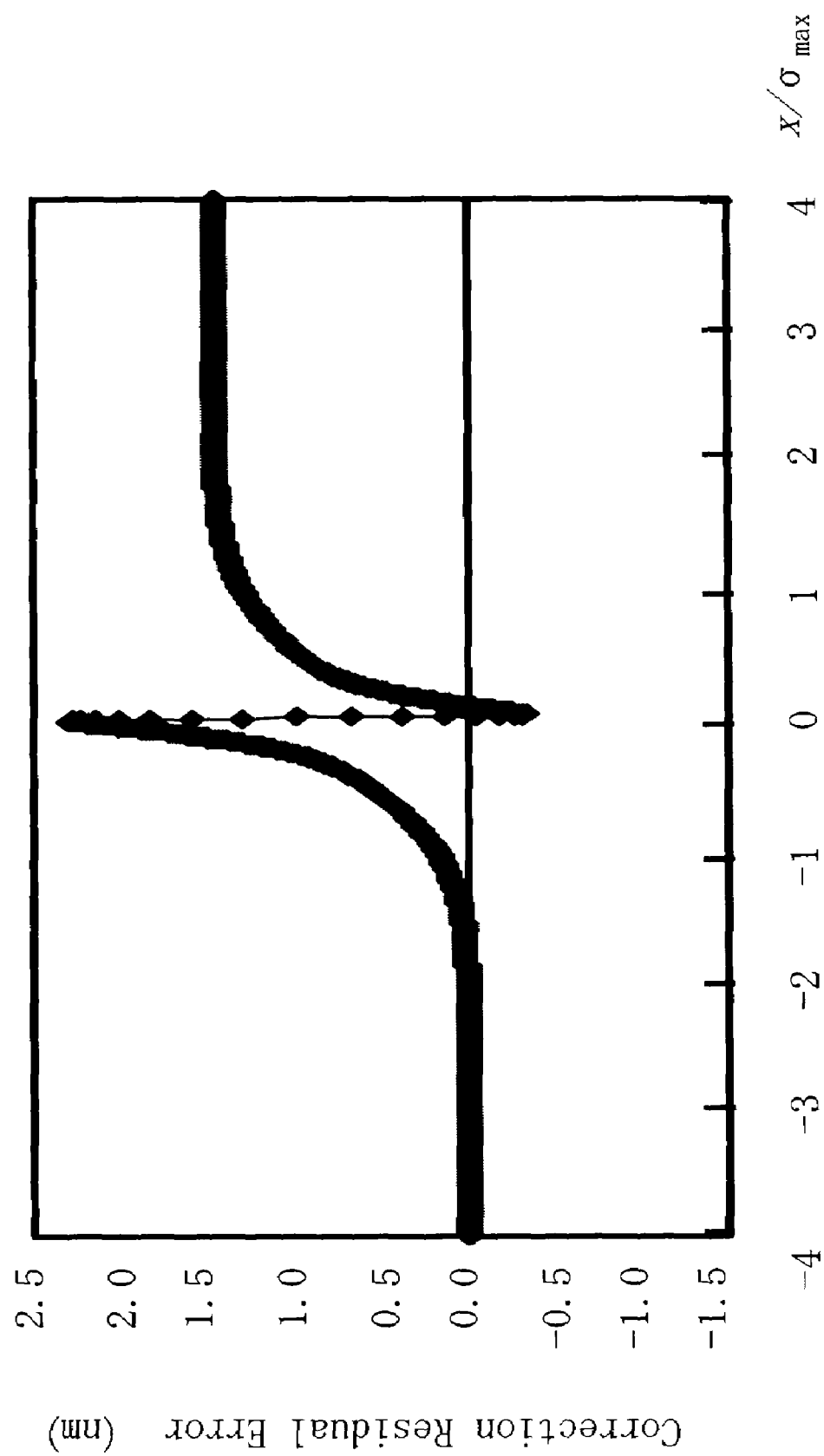
FIG. 29 is a graph showing an example of dimension accuracy in the case of not correcting a CD error due to a micro loading effect and a flare according to Embodiment 6.

FIG. 29 is a graph showing an example of dimension accuracy in the case of not correcting a CD error due to a micro loading effect and a flare according to Embodiment 6. As shown in FIG. 29, when not correcting, a correction residual error largely remains depending upon a position.

Figure 30:
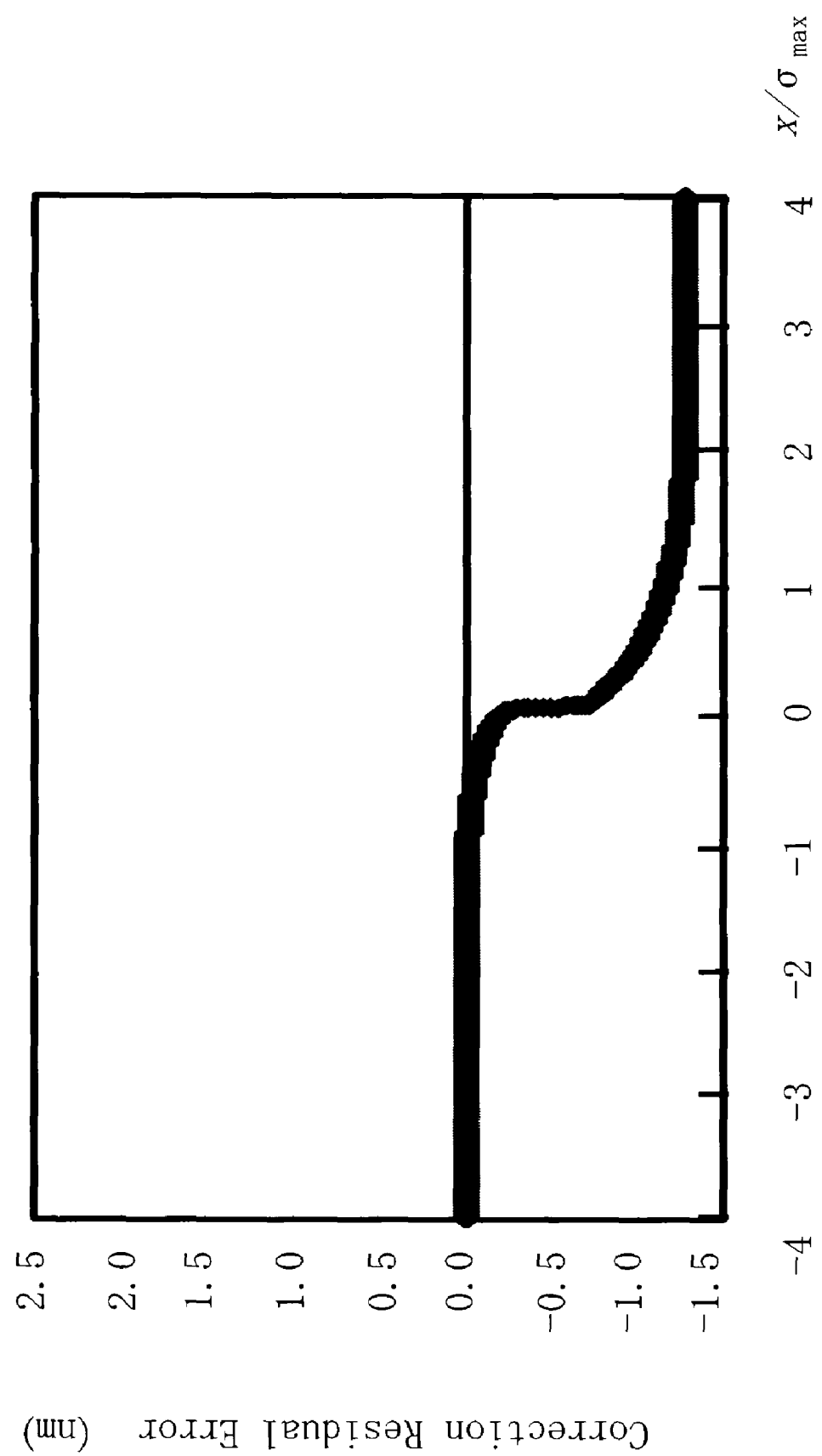
FIG. 30 is a graph showing an example of correction precision in the case of taking only the area into consideration while disregarding the influence of the process procedure according to Embodiment 6.

FIG. 30 is a graph showing an example of correction precision in the case of taking only the area into consideration while disregarding the influence of the process procedure according to Embodiment 6. As an example, the case of taking only the area (density) of a pattern into consideration and disregarding the contribution of the side and the apex is shown. As shown in FIG. 30, since the influence of the process procedure and the contribution of the side and the apex are disregarded, a correction residual error largely remains depending upon a position.

Figure 31:
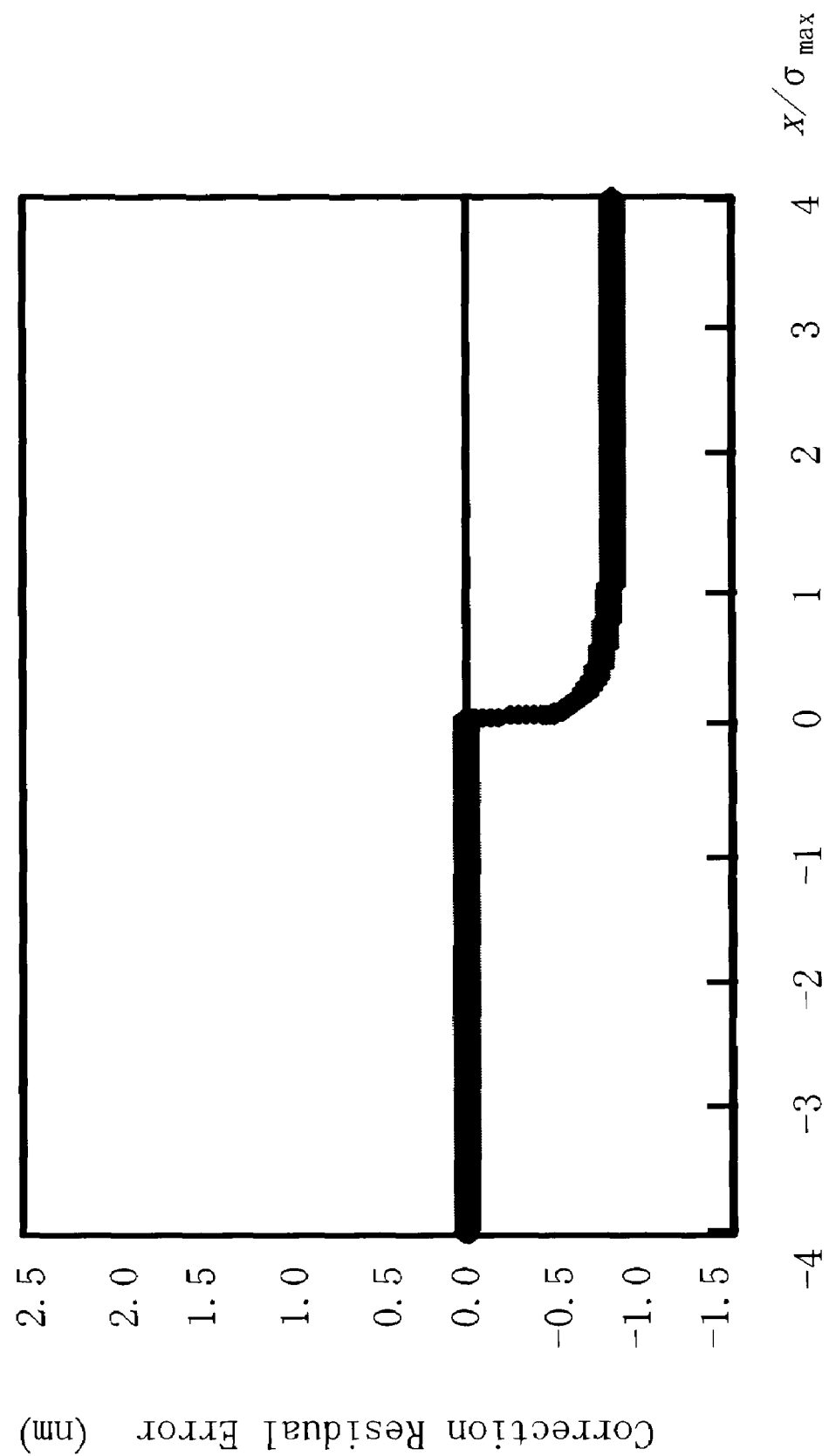
FIG. 31 is a graph showing an example of correction precision in the case of taking the contribution of the area, the total length of the sides, and the apex into consideration while disregarding the influence of the process procedure according to Embodiment 6.

FIG. 31 is a graph showing an example of correction precision in the case of taking the contribution of the area, the total length of the sides, and the apex into consideration while disregarding the influence of the process procedure according to Embodiment 6. Since the contribution of the side and the apex are considered in addition to the area, the correction residual error becomes small to some extent compared with FIG. 30, but since the influence of the process procedure is disregarded, the correction residual error still remains.

Figure 32:
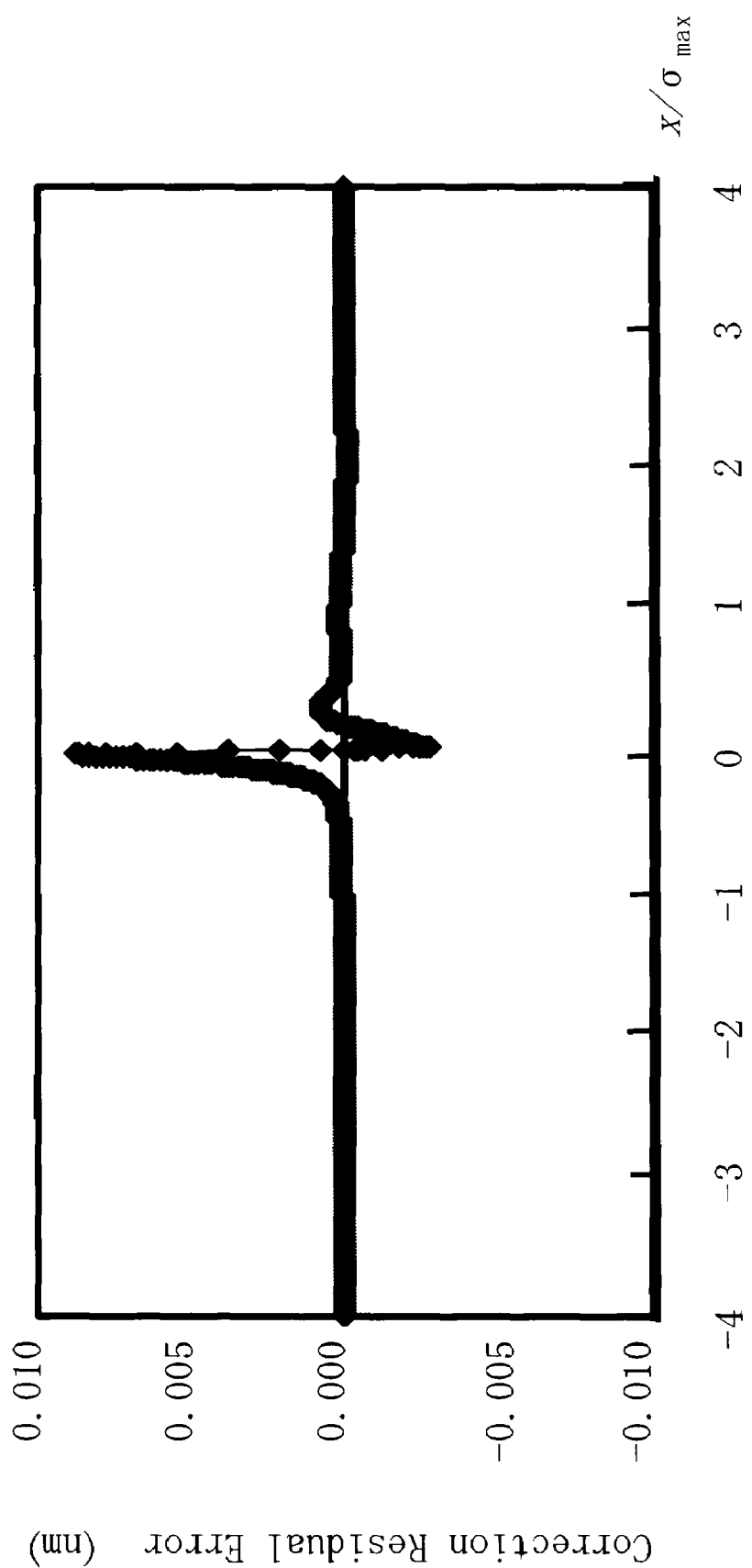
FIG. 32 is a graph showing an example of correction precision in the case of taking the influence of the process procedure, and the contribution of the area, the total length of the sides, and the apex into consideration according to Embodiment 6.

FIG. 32 is a graph showing an example of correction precision in the case of taking the influence of the process procedure, and the contribution of the area, the total length of the sides, and the apex into consideration according to Embodiment 6. Since the influence of the process procedure is considered in addition to the contribution of the area, the side and the apex, the correction residual error can be suppressed within 0.1 nm.

Embodiment 7

In each foregoing Embodiment, when correcting a CD error in order from the latter step to the former one of each manufacturing step, it is premised that calculation in all the steps are performed based on the smallest mesh size $\Delta_L$ and the influence range $\sigma_L$. However, such a way needs great number of times of calculation. Then, according to Embodiment 7, a method capable of calculating at high speed will be explained.

An unknown function $\Delta dk(x)$ is defined by the following equation (89):

$$\Delta l_k(x) = \Delta l_{k+1}(x) + \Delta d_k \quad (89)$$

Similarly to each Embodiment mentioned above, $\Delta l_{k+1}(x)$ is defined as a known function. In the case of using $\Delta d_k(x)$ instead of an unknown function $\Delta l_k(x)$, the equation with respect to $\Delta d_k(x)$ can be expressed as the following equation (90) by using the equation (89).

$$0 = -\Delta d_k(x) + \gamma_d \int_A g_k(x-x')\rho_0(x')dx' - \qquad (90)$$

$$\gamma_d \int_A [FEC_k^*(x')/\Delta_l^2]\Delta d_k(x')g_k(x-x')dx' +$$

$$\gamma_d \int_A [CAT(x')/\Delta_l^2]\Delta d_k(x')^2 g_k(x-x')dx' + F_k(x)$$

where $FEC_k^*(x)$ is defined by the following equation (91).

$$FEC_k^*(x) = FEC(x')/\Delta_l^2 - 2\Delta l_{k+1}(x')CAT(x')/\Delta_l^2 \quad (91)$$

Moreover, $F_k(x)$ can be defined by the following equation (92).

$$F_k(x) = -\gamma_d \int_A [FEC(x')/\Delta_l^2]\Delta l_{k+1}(x')g_k(x-x')dx' + \qquad (92)$$

$$\gamma_d \int_A [CAT(x')/\Delta_l^2]\Delta l_{k+1}(x')^2 g_k(x-x')dx' +$$

$$\gamma_{dk} f_k(x)$$

When substituting $FEC(x)$ with $FEC_k^*(x)$, and $\gamma_{pf}(x)-\Delta l(x)$ with $F_k(x)$ in the equation (19), the equation (19) becomes the same as the equation (92). Therefore, if the solution of the equation (19) is expressed as $Q(x, \gamma_{dk}, FEC(x), CAT(x), \gamma_{pf}(x)-\delta l(x))$, the solution of the equation (90), that is $\Delta d_k(x)$, can be expressed by the following equation (93).

$$\Delta d_k(x) = Q(x, \gamma_{dk}, FEC_k^*(x), CAT(x), F_k(x)) \quad (93)$$

In Embodiment 1 mentioned above, approximated solutions, that is the equations (21-1) to (28) have already been obtained as the solution of the equation (19). Moreover, approximated solutions, that is the equations (47) to (58) have already been obtained as highly precise solution of the equation (19). By using these solutions, therefore, the solution can be obtained by substituting $FEC(x)$ with $FEC_k^*(x)$, and $\gamma_{pf}(x)-\delta l(x)$ with $F_k(x)$. Then, by using the solution, the value of $\Delta d_k(x)$ can be calculated. $\Delta l_k(x)$ can be calculated from the value of $\Delta l_{k+1}(x)$ being a known function and $\Delta d_k(x)$ having become a known function, by using the equation (89). As mentioned above, a difference $\Delta d_k(x)$ between the dimension correction amounts of manufacturing steps is calculated. Then, by using this difference $\Delta d_k(x)$, a dimension correction amount $\Delta l_k(x)$ for each mesh region in the manufacturing step prior by one step can be calculated. Using this method, a high-speed calculation method is hereafter explained.

As mentioned above, the dimension correction amount $\Delta l(x)$ is calculated for a region, as a unit, which is sufficiently smaller than the minimum value ($\sigma_{min}$) of σ. The place of the value γ varies depending upon a process. For example, in the case of a micro loading effect, the value γ is approximately 250 nm, and in the case of a flare, it is approximately 10 μm, where the ratio is 1:40. In such a case, the correction computation time becomes immense because of the following reasons. Since it is necessary to make the small region sufficiently smaller than σ (250 nm) when correcting both the micro loading effect and the flare, the size of the small region becomes ⅕ of 50 nm.

For performing a correction of a flare in this small region, it is necessary to perform a convolution in a Gauss function. However, if defining the spread σ of the influence of the flare to be 10 μm, and considering the influence up to 3σ, it becomes necessary to perform a convolution with respect to all the small regions within a circle whose radius is 30 μm. The number of small regions in this circle is $\pi(30 \text{ μm}/50 \text{ nm})^2 = 1 \times 10^6$. On the other hand, if the size of LSI is defined to be a 1 cm square, the number of small regions is $(1 \text{ cm}/50 \text{ nm})^2 = 4 \times 10^{10}$. Since the convolution mentioned above needs to be performed for each of the small regions, the calculation times will become $4 \times 10^{16}$. If the processing speed of the computer is to perform calculation of $1 \times 10^9$ times during 1 second, the computation time will be a $4 \times 10^{16}/10^9 = 4 \times 10^7$ seconds, which is approximately equivalent to three days. This is far from manufacturing the LSI. Then, a method of solving this problem by utilizing an algorithm using the equations (89) to (93) will be described.

Figure 33:
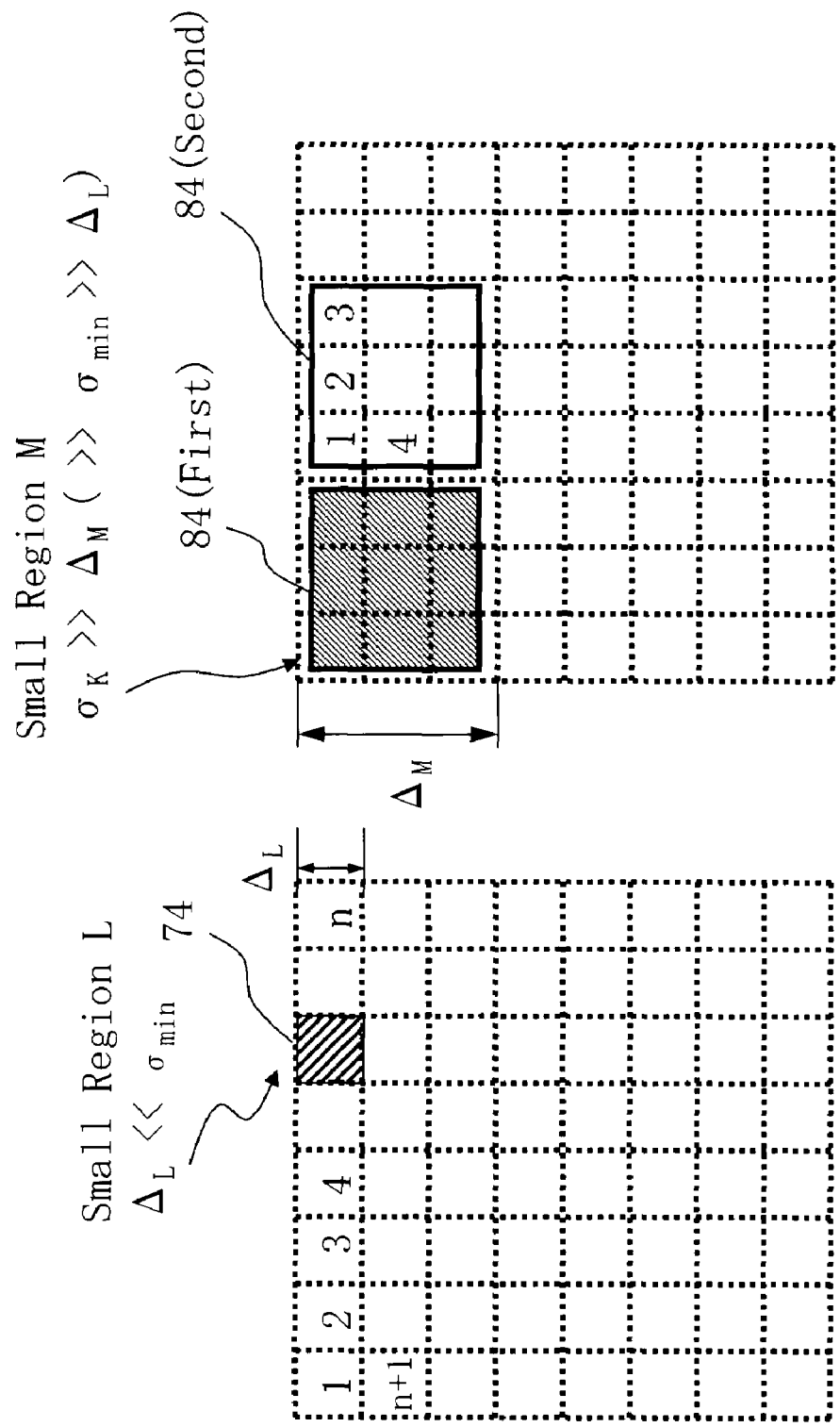
FIG. 33A and FIG. 33B show examples of mesh regions according to Embodiment 7.
Figure 34:
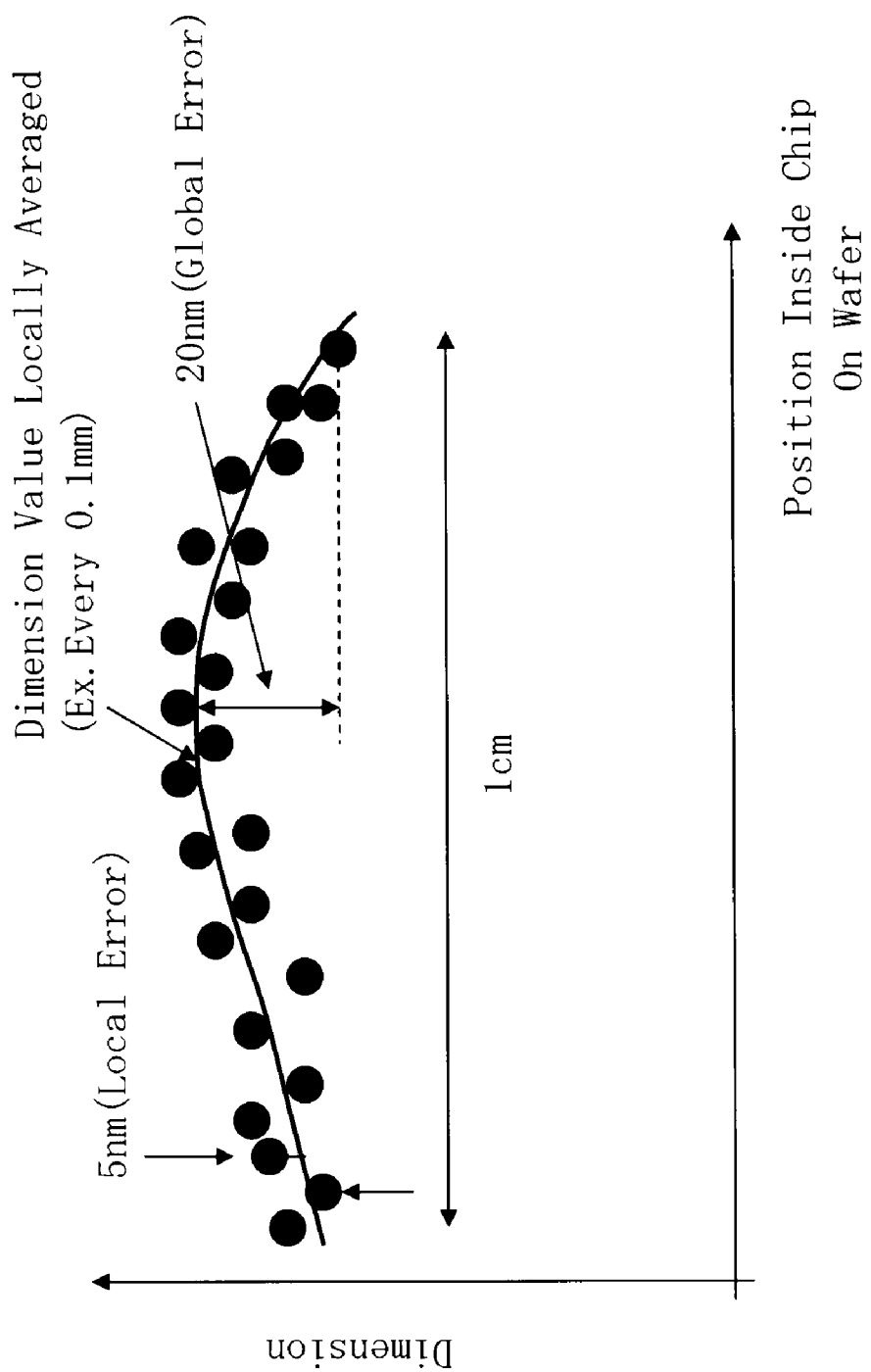
FIG. 34 shows an example of a state of a pattern dimension change from the view point of the whole of the inner part of the chip.

FIGS. 33A and 33B show examples of a mesh region according to Embodiment 7. In performing a correction calculation, a step of calculating for correction of a certain process will be considered. As shown in FIG. 33A, it is supposed that $\sigma_k$ in this process is extraordinarily larger than the size of the small region 74 used as the small region L. As shown in FIG. 33B, another small region 84 (small region M) which is different from the small region 74 for calculating a dimension correction amount $\Delta l(x)$ is defined and introduced. The size of this small region 84 is defined to be $\Delta_M \times \Delta_M$. It is assumed that the size of $\Delta_M$ is sufficiently smaller than $\sigma_k$ but sufficiently larger than the size $\Delta_L \times \Delta_L$ of the small region 74. For example, it is defined that $\Delta_L$=50 nm, $\sigma_{min}$=250 nm, $\Delta_M$=1 μm, and $\sigma_k$=10 μm. In order to be easily understood, it is supposed the value of the function $f_k(x)$ of position dependence property changes more slowly than the value of the function $g_k(x)$. In this case, it turns out from the equations (90) and (91) that $\Delta d_k(x)$ is a function whose value changes slowly at the distance of around $\sigma_k$, because functions except for $\Delta d_k(x)$ in the equations (90) and (91) have such features. For example, the second term of the equation (90) is obtained by performing a convolution for a density (function whose value changes slowly at the distance of around $\sigma_k$) by using $g_k(x)$. Therefore, it may be regarded in the small region 84 which is sufficiently smaller than $\sigma_k$ that the value of $\Delta d_k(x)$ is almost constant and does not change depending upon a position. Therefore, for example, the value of $\Delta d_k(x)$ is calculated only at the center of the small region 84 and (1): the value calculated only at the center is used in all the small regions 74 within the small region 84, or (2): when calculating the value of $\Delta d_k(x)$ at a certain point, it can be obtained by performing interpolation by using $\Delta d_k(x)$ calculated at the center of the peripheral small region 84. That is, no fatal large error is generated even when applying the above method of (1) or (2). Owing to this, performing a convolution for all the small regions 74 in the small region 84 becomes unnecessary, thereby largely reducing the computation time.

Furthermore, utilizing this small region 84, the computation amount at the time of performing a convolution calculation can also be largely reduced, which will be described below. When calculating $\Delta d_k(x)$, as can be seen in the equation (92), it becomes necessary to perform a convolution as shown in the following equation (94).

$$u(x) = \int_A g_k(x - x') D(x') dx' \tag{94}$$

where $D(x)$ is, for example, $\rho_0(x)$ or $FEC(x)\Delta l_k(x)/\Delta l_L$. Expressing the equation (94) in the form of sum, it becomes as the following equation (95).

$$u(x_i) = \sum_j g_k(x_i - x_j) D(x_j) \Delta_L^2 \tag{95}$$

In the equation (95), the sum is calculated with respect to the small region 84 (small region M). Numbering of the small region 74 (small region L) is changed to be (l, j), where l is a (serial) number of the small region M, and j is a (serial) number of the small region 74 (small region L) in the l-th small region 84 (small region M). Then, the equation (95) can be expressed as the following equation (96).

$$u(x_{i,Ce}) = \sum_l \sum_j g_k(x_{i,Ce} - x_{l,j}) D(x_{l,j}) \Delta_L^2 \tag{96}$$

$g_k(x)$ hardly changes in the small region 74 (small region L). Therefore, no large error is generated even when $g_k(x)$ is represented by the value obtained at the center of the small region 84 (small region M) and moved out of the sum with respect to the small region L. Therefore, the equation (96) can be transformed to the following equation (97).

$$u(x_{i,Ce}) = \sum_l g_k(x_{i,Ce} - x_{l,Ce}) \left[ \sum_j D(x_{l,j}) \Delta_L^2 \right] \tag{97}$$

Now, the following amount $D^+(x_l, c_e)$ is defined and introduced as shown in the following equation (98).

$$D^+(x_{i,m}) = \sum_j D(x_{i,j}) \Delta_L^2 / \Delta_M^2 \tag{98}$$

Using $D^+(x_l, m)$ of the equation (98), $u(x_i, c_e)$ can be calculated as the following equation (99).

$$u(x_{i,Ce}) = \sum_l g_k(x_{i,Ce} - x_{l,Ce}) D^+(x_{l,Ce}) \Delta_M^2 \tag{99}$$

When this equation (99) is used, since the small region to be used for performing a convolution is not the small region L but the small region M, which is larger than the small region when compared, the computation amount at the time of performing a convolution calculation can be largely reduced than directly calculating the equation (95).

The effect of the method mentioned above will be verified below. If the equation (95) is directly calculated, the computation amount becomes $\pi(3\sigma_k/\Delta L)^2 (L/\Delta_L)^2$, where L is the size of LSI (for example, 1 cm). On the other hand, according to the method mentioned above, the computation amount for calculating $D^+(x_l, c_e)$ is $(L/\Delta_L)^2$, and the computation amount for performing a convolution is $\pi(3\sigma_k/\Delta_M)^2 (L/\Delta_M)^2$. The ratio between the computation amount for calculating $D^+(x_l, c_e)$, and the computation amount for directly calculating the equation (95) is $\pi(3\sigma_k/\Delta_L)^2$. This ratio becomes $1 \times 10^{-6}$ when $\sigma_k$ is 10 μM (local flare) and $\Delta_L$ is 50 nm (size of the small region L with respect to a micro loading effect). The computation amount of $D^+(x_l, c_e)$ is sufficiently small compared with that for performing a convolution by directly calculating the equation (95). Although the computation time in the case of directly calculating the equation (90) is estimated to be three days, if a proportional calculation is performed according to this ratio, the computation time for calculating $D^+(x_l, c_e)$ becomes 40 seconds.

Moreover, the ratio between $\pi(3\sigma_k/\Delta_L)^2 (L/\Delta_L)^2$ and $\pi(3\sigma_k/\Delta_M)^2 (L/\Delta_M)^2$ becomes $(\Delta_M/\Delta_L)^4 = (\sigma_k/\sigma_{min})^4$. Supposing that $\sigma_k$ is 10 μm (GCD flare) and $\sigma_{min}$ (value of the minimum γ in all the processes) is 250 nm (micro loading effect), this ratio becomes $4 \times 10^{-7}$. This ratio is also extraordinarily small compared with $\pi(3\sigma_k/\Delta_L)^2 (L/\Delta_L)^2$ which is the computation amount for directly performing a convolution by calculating the equation (95). Although the computation time in the case of directly calculating the equation (90) is estimated to be three days, if a proportional calculation is performed according to this ratio, the computation time for calculating $D^+(x_l, c_e)$ becomes 16 seconds.

As mentioned above, the difference $\Delta d_k(x)$ between the dimension correction amounts of manufacturing steps can be calculated by changing the size of a mesh region for each manufacturing step. That is, it becomes possible to largely reduce the computation time spent for performing a convolution, by changing the size of a mesh region as mentioned above, thereby largely reducing the correction computation time. Then, using this difference $\Delta d_k(x)$ and the known function $\Delta l_{k+1}(x)$, a dimension correction amount $\Delta l_k(x)$ for each mesh region in the manufacturing step prior by one step can be calculated by the equation (89). When calculating the dimension correction amount $\Delta l_k(x)$ by using the equation (89), the original mesh size $\Delta_L$ may be used.

It has been explained in Embodiment 7 that, when performing a CD error correction (S108) caused by a micro loading effect at the time of mask forming, the difference $\Delta d_k(x)$ in correcting a global CD error (S106) by a flare is calculated. That is, it is premised in Embodiments 1 to 6 mentioned above that calculation in all the steps is performed based on the smallest mesh size $\Delta_L$ and the influence range $\sigma_L$ of each manufacturing step. Therefore, according to Embodiments 1 to 6, when correcting a CD error by a micro loading effect, the mesh size $\Delta_L$ and the influence range $\sigma_L$ should be values for correcting the micro loading effect. On the other hand, it has been explained in Embodiment 7 that when correcting a global CD error by a flare, the computation amount of the difference $\Delta d_k(x)$ can be reduced by using the mesh size $\Delta_M$ and the influence range $\sigma_M$ for a flare. This method is not restricted to the global CD correction caused by a flare. The computation amount of the difference $\Delta d_k(x)$ can also be similarly reduced in other manufacturing steps by changing the size of a mesh region. What is necessary is just to select the size of a mesh region according to the range of an error in each manufacturing step. Thus, it becomes possible to greatly enhance the speed of calculating the dimension correction amount $\Delta l_k(x)$ in each manufacturing step.

Processing contents or operation contents of what is represented by the word "circuit", "part", or "step" in the above description can be configured by a computer program. It may be executed by a software program, or alternatively by any combination of software, hardware and/or firmware. When configured by a program, the program is recordable on a recording medium, such as a magnetic disk drive, a magnetic tape drive, an FD, or a ROM (Read Only Memory). For example, the program is recorded in the storage device 123.

In FIG. 22, the CPU 120 being a computer, through a bus (not shown), may be connected to a recording device, such as RAM (Random Access Memory), ROM and a magnetic disk (HD) drive, an input means, such as a keyboard (K/B) and a mouse, an output means, such as a monitor and a printer, or an input/output means, such as an external interface (I/F), FD, DVD, and CD.

Referring to concrete examples, Embodiments have been explained. However, the present invention is not limited thereto. For example, although the global CD correction is performed with respect to all the steps for forming one layer in a semiconductor device, if there is a step where the error is small, it is acceptable to omit it. Alternatively, it does not need to be applied to all the layers, but applied to the layer which requires accuracy. Moreover, it can also be applied to an in print technology. In that case, an exposure mask can be used as the original of imprinting. Moreover, the method of GCD correction mentioned above can be applied not only to mask forming but also to a direct writing by an electron beam (EB) or laser. Moreover, although the example of using an ordinary light with respect to an exposure step has been explained, the method can also be applied to forming an X-ray mask or forming a mask for a transfer apparatus using an EUV (extreme ultra violet) light. Moreover, the shape of a pattern is not limited to a rectangle (all the angles are 90 degrees), but may be a general two-dimensional pattern, such as a slanting line with an arbitrary angle, triangle, circle, ellipse and ring.

Moreover, although description of the apparatus structure, control methods, etc. not directly required for explaining the present invention is omitted, it is acceptable to suitably select and use some or all of them when needed. For example, while the structure of a control unit for controlling the pattern writing apparatus 100 is not described, it should be understood that a necessary control unit structure can be appropriately selected and used.

In addition, any pattern creation method, charged particle beam writing apparatus, and charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:
    calculating a correction amount for correcting a dimension error of a pattern on a patterned semiconductor substrate having the pattern generated in at least one of a plurality of manufacturing steps performed on the semiconductor substrate in which a circuit of one layer of a semiconductor device is formed, by using an area and a total side length of a perimeter of the pattern included in each grid region of a plurality of mesh-like grid regions made by virtually dividing a pattern creation region of an exposure mask;
    forming a pattern on the exposure mask, with correcting figure dimensions of the pattern on the exposure mask using the correction amount calculated above associated with said dimension error on the patterned semiconductor substrate;
    exposing the pattern on the exposure mask onto the semiconductor substrate on which a resist film is coated;
    developing the resist film after the exposing; and
    processing the substrate by using a resist pattern after the developing.

2. The method according to claim 1, wherein the resist film is coated on a first film, when processing the substrate, an opening is formed by etching the first film after the developing, a second film is deposited on the opening and a surface of the substrate, and a surface of the second film is polished after the depositing on.

3. The method according to claim 1, wherein the grid region has a size in which only a figure or only a part of the figure can be included.

4. The method according to claim 1, wherein the grid region has sides each of which is shorter than 100 nm.

5. The method according to claim 1, wherein the grid region has a size in which a plurality of figures can be included.

6. The method according to claim 1, wherein the grid region has sides each of which is from 100 nm to 10 mm.

7. A method for forming a pattern onto an exposure mask comprising:

virtually arranging patterns of same type as a pattern to be formed on the exposure mask, on a periphery of the pattern to be formed on the exposure mask;

virtually dividing the pattern and the patterns into a plurality of mesh-like grid regions;

for each grid region virtually divided, calculating a correction amount for correcting a pattern dimension error generated in a manufacturing step of processing the pattern on a semiconductor substrate, including grid regions on the periphery into an influence range; and forming the pattern, whose dimension has been corrected by the correction amount, on the exposure mask.

8. The method according to claim 7, wherein when the calculating the correction amount is performed, an area and total length of sides of a perimeter of a pattern included in the each grid region are used.

9. A method for forming a pattern onto an exposure mask comprising:

calculating a correction amount for correcting a dimension error of a pattern on a patterned semiconductor substrate having the pattern generated in a plurality of manufacturing steps performed on the semiconductor substrate in which a circuit of one layer of a semiconductor device is formed, the plurality of manufacturing steps including an exposing step, to form the circuit of one layer of the semiconductor device on the semiconductor substrate, from a latter step to a former step in order, based on a dimension which has been corrected in order by the correction amount for correcting the dimension error generated in a posterior manufacturing step when the posterior manufacturing step exists, and based on a design dimension when the posterior manufacturing step does not exist; and forming the pattern, whose dimension has been corrected by the correction amount up to the exposing step, on the exposure mask.

10. The method according to claim 9, wherein when the calculating the correction amount is performed in each of the plurality of manufacturing steps, an area and total length of sides of a perimeter of a pattern included in each grid region of a predefined size in a plurality of mesh-like grid regions virtually divided are used.

11. The method according to claim 10 wherein when the calculating the correction amount is performed, a difference of the correction amount between the manufacturing steps is calculated by changing the predefined size of the each grid region for each of the manufacturing steps, and the correction amount is calculated for the each grid region of the predefined size by using the difference.

12. A method for manufacturing a semiconductor device comprising:

calculating a correction amount for correcting a dimension error of a pattern on a patterned semiconductor substrate having the pattern generated in a plurality of manufacturing steps performed on a semiconductor substrate in which a circuit of one layer of a semiconductor device is formed, the plurality of manufacturing steps including an exposing step, to form the circuit of one layer of the semiconductor device on the semiconductor substrate, from a latter step to a former step in order, based on a dimension which has been corrected in order by the correction amount for correcting the dimension error generated in a posterior manufacturing step when the posterior manufacturing step exists, and based on a design dimension when the posterior manufacturing step does not exist;

exposing a substrate where a resist film is coated, by using an exposure mask on which the pattern, whose dimension has been corrected by the correction amount up to the exposing step, is formed;

developing the resist film after the exposing; and processing the substrate by using a resist pattern after the developing.

* * * * *